(12) United States Patent
Liikanen et al.

(10) Patent No.: US 7,653,847 B1
(45) Date of Patent: Jan. 26, 2010

(54) METHODS AND STRUCTURE FOR FIELD FLAWSCAN IN A DYNAMICALLY MAPPED MASS STORAGE DEVICE

(75) Inventors: Bruce A. Liikanen, Berthoud, CO (US); Eric D. Mudama, Longmont, CO (US); John W. VanLaanen, Louisville, CO (US); Andrew W. Vogan, Portland, OR (US)

(73) Assignee: Seagate Technology LLC, Scotts Valley, CA (US)

( * ) Notice: Subject to any disclaimer, the term of this patent is extended or adjusted under 35 U.S.C. 154(b) by 500 days.

(21) Appl. No.: 11/583,767

(22) Filed: Oct. 19, 2006

Related U.S. Application Data

(63) Continuation-in-part of application No. 11/122,751, filed on May 5, 2005.

(60) Provisional application No. 60/728,899, filed on Oct. 21, 2005, provisional application No. 60/728,904, filed on Oct. 21, 2005, provisional application No. 60/728,900, filed on Oct. 21, 2005, provisional application No. 60/728,898, filed on Oct. 21, 2005, provisional application No. 60/728,903, filed on Oct. 21, 2005, provisional application No. 60/728,902, filed on Oct. 21, 2005, provisional application No. 60/729,377, filed on Oct. 21, 2005, provisional application No. 60/728,897, filed on Oct. 21, 2005.

(51) Int. Cl.
*G11C 29/00* (2006.01)

(52) U.S. Cl. .......... 714/723; 714/25; 714/718; 714/735; 714/736; 714/742; 714/745; 714/824; 714/704; 714/42; 360/31; 360/53; 369/53.1; 369/53.32; 369/53.35

(58) Field of Classification Search .............. None
See application file for complete search history.

(56) References Cited

U.S. PATENT DOCUMENTS 5,345,435 A  9/1994  Yamasaki (Continued)

FOREIGN PATENT DOCUMENTS

WO  WO 93/00635 A1  1/1993

*Primary Examiner*—John P Trimmings
(74) *Attorney, Agent, or Firm*—David K. Lucente

(57) ABSTRACT

Methods and structures for performing field flawscan to reduce manufacturing costs of a dynamic mapped storage device. In a dynamic mapped storage device in which all user supplied logical blocks are dynamically mapped by the storage device controller to physical disk blocks, features and aspects hereof permit flawscan testing of a storage device to be completed substantially concurrently with processing write requests for its intended application. A fraction of the storage device may be certified by an initial flawscan performed during manufacturing testing. Statistical sampling sufficient to assure a high probability of achieving specified capacity may be performed to reduce manufacturing time and costs in testing. Final flawscan of the remainder of the storage locations may be performed substantially concurrently with processing of write requests after the device is installed for its intended application. Mapping features and aspects hereof allow the storage device controller to perform flawscan and write operations concurrently.

16 Claims, 45 Drawing Sheets

U.S. PATENT DOCUMENTS

| | | | |
|---|---|---|---|
| 5,422,890 A * | 6/1995 | Klingsporn et al. | 714/723 |
| 5,436,878 A | 7/1995 | Yamaguchi et al. | |
| 5,440,734 A | 8/1995 | Wagar | |
| 5,459,850 A | 10/1995 | Clay et al. | |
| 5,568,650 A | 10/1996 | Mori | |
| 5,581,724 A | 12/1996 | Belsan et al. | |
| 5,602,987 A | 2/1997 | Harari et al. | |
| 5,937,435 A | 8/1999 | Dobbek et al. | |
| 5,943,692 A | 8/1999 | Marberg et al. | |
| 6,088,177 A | 7/2000 | Onoda et al. | |
| 6,182,250 B1 | 1/2001 | Ng et al. | |
| 6,198,709 B1 | 3/2001 | Shirane | |
| 6,263,462 B1 * | 7/2001 | Hatano et al. | 714/723 |
| 6,282,619 B1 | 8/2001 | Islam et al. | |
| 6,314,188 B1 | 11/2001 | Ishibashi | |
| 6,336,197 B1 | 1/2002 | Sasaki et al. | |
| 6,467,021 B1 | 10/2002 | Sinclair | |
| 6,493,302 B2 | 12/2002 | Takahashi | |
| 6,519,107 B1 | 2/2003 | Ehrlich et al. | |
| 6,571,362 B1 | 5/2003 | Crater et al. | |
| 6,587,915 B1 | 7/2003 | Kim | |
| 6,742,081 B2 | 5/2004 | Talagala et al. | |
| 6,772,288 B1 | 8/2004 | Flake et al. | |
| 6,829,203 B2 | 12/2004 | Yonezawa et al. | |
| 6,950,967 B1 * | 9/2005 | Brunnett et al. | 714/42 |
| 6,993,678 B2 | 1/2006 | Cheok et al. | |
| 7,072,576 B2 | 7/2006 | Tanaka | |
| 7,111,118 B2 | 9/2006 | Mereddy et al. | |
| 7,133,343 B2 | 11/2006 | Yonezawa et al. | |
| 7,233,455 B1 | 6/2007 | Rewerts et al. | |
| 7,281,160 B2 | 10/2007 | Stewart | |
| 7,330,995 B2 | 2/2008 | Shiraishi et al. | |
| 7,337,263 B2 | 2/2008 | Cho et al. | |
| 7,350,101 B1 | 3/2008 | Nguyen et al. | |
| 7,409,585 B2 | 8/2008 | Ali | |
| 7,428,622 B2 | 9/2008 | Tulyani | |
| 7,430,572 B2 | 9/2008 | Kezuka et al. | |
| 2002/0034379 A1 | 3/2002 | Tanaka | |
| 2003/0021202 A1 | 1/2003 | Usui et al. | |
| 2003/0067697 A1 * | 4/2003 | Weinstein et al. | 360/31 |
| 2006/0158968 A1 | 7/2006 | Vanman et al. | |
| 2007/0283085 A1 | 12/2007 | Lin | |

* cited by examiner

Figure 5
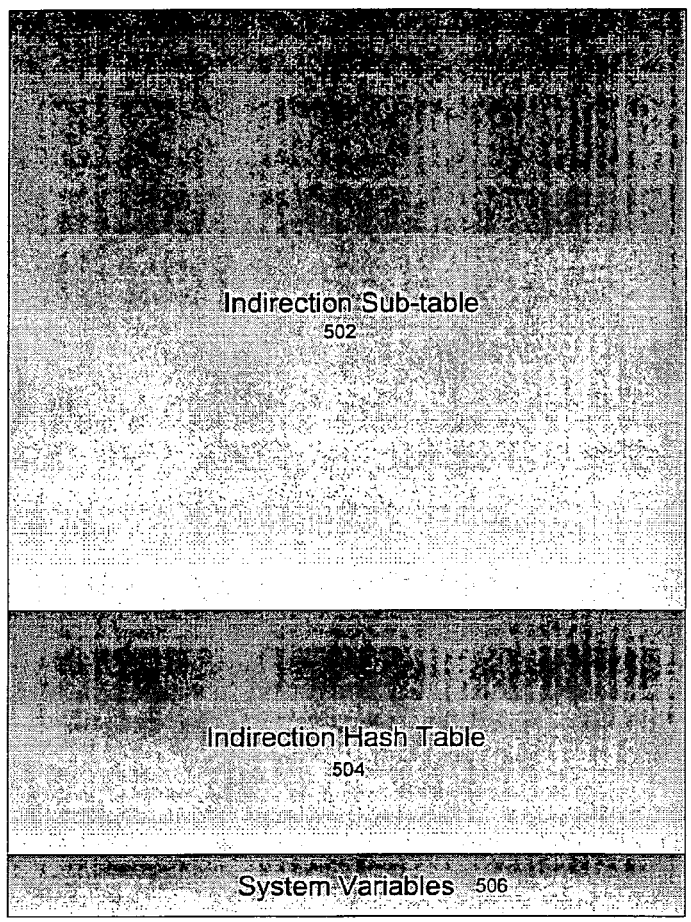
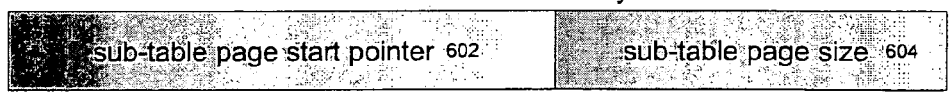
Figure 6

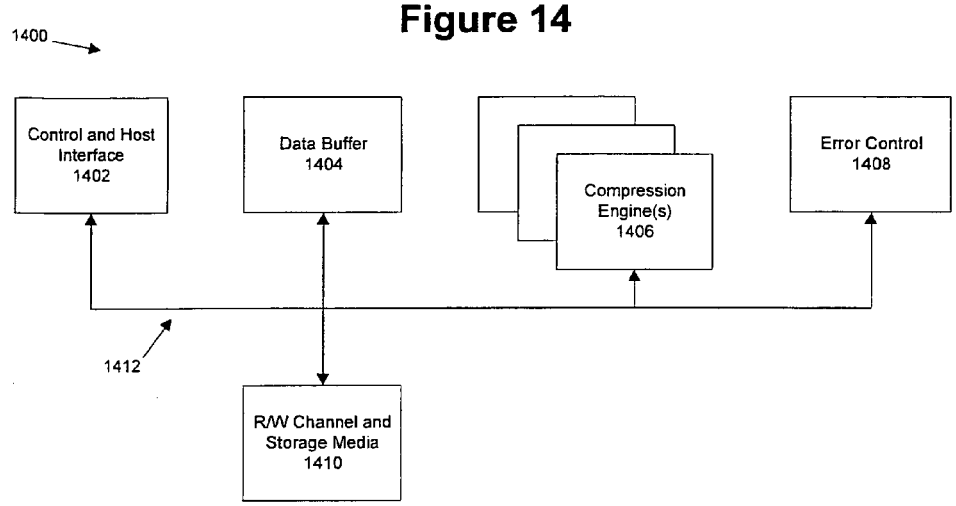

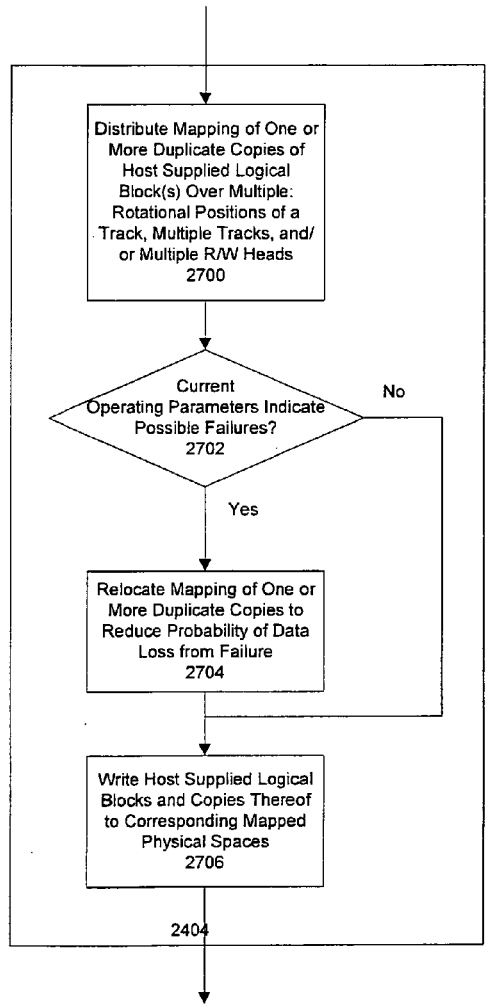
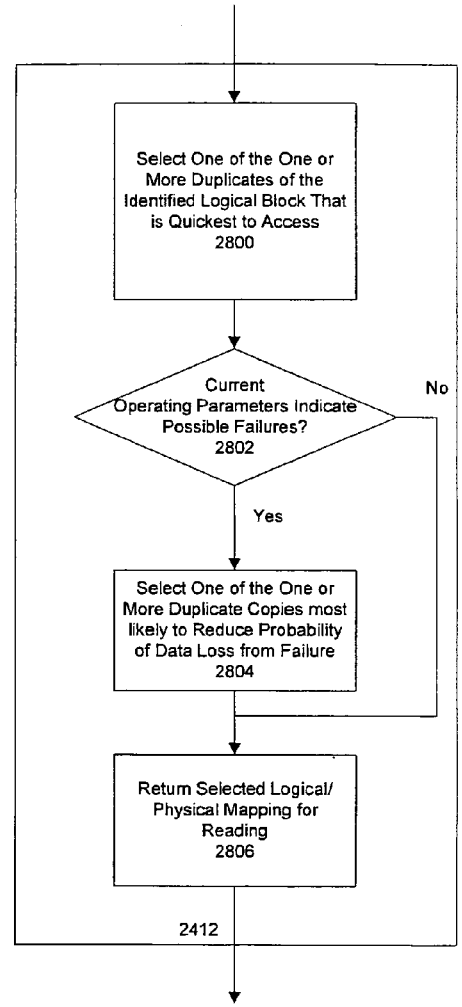
Figure 27
Figure 28

| Pre. 3200 | Syn 3202 | Host Supplied Data (Nominal Bit Density) 3204 | ECC 3206 |

| Pre. 3310 | Syn 3312 | Host Supplied Data (Lower Bit Density) 3314 | ECC 3316 |

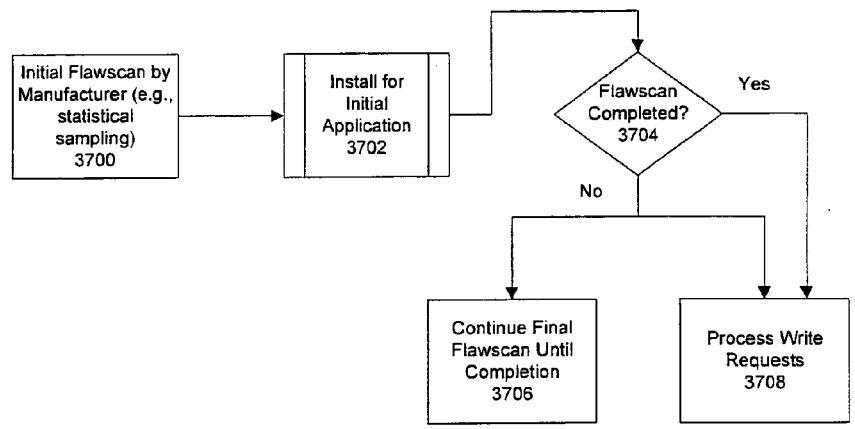
Figure 37
Figure 38
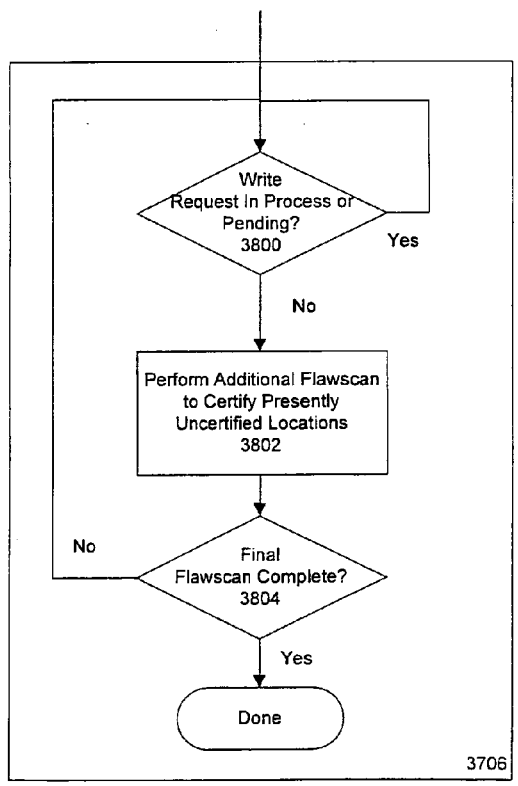

Figure 60
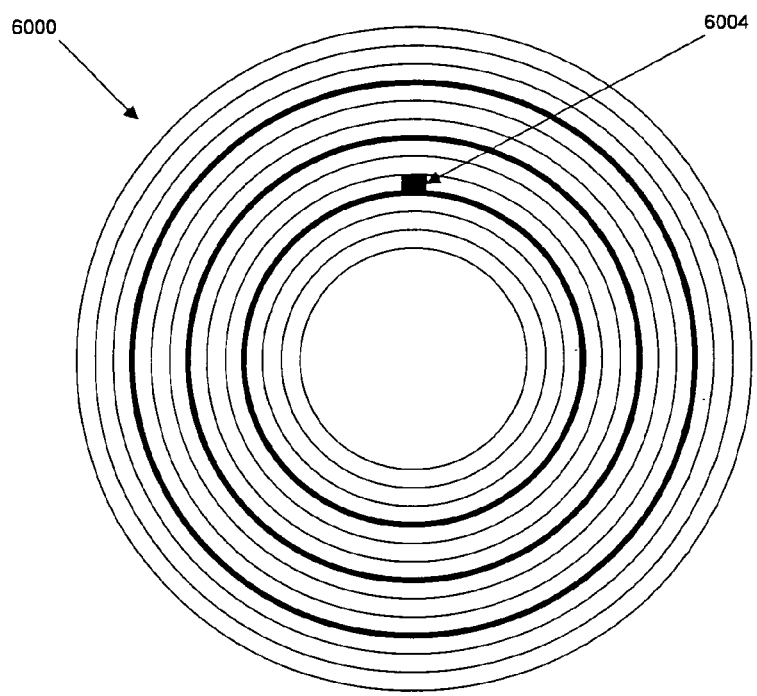
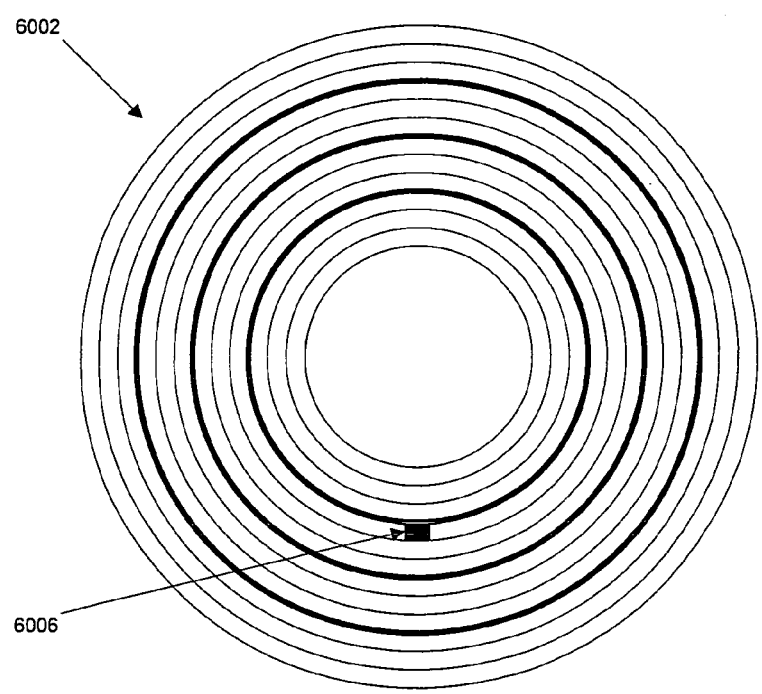

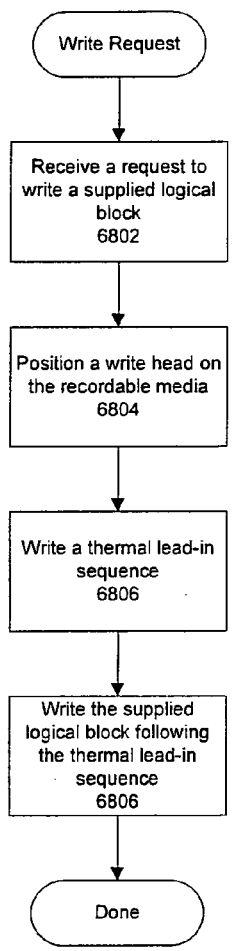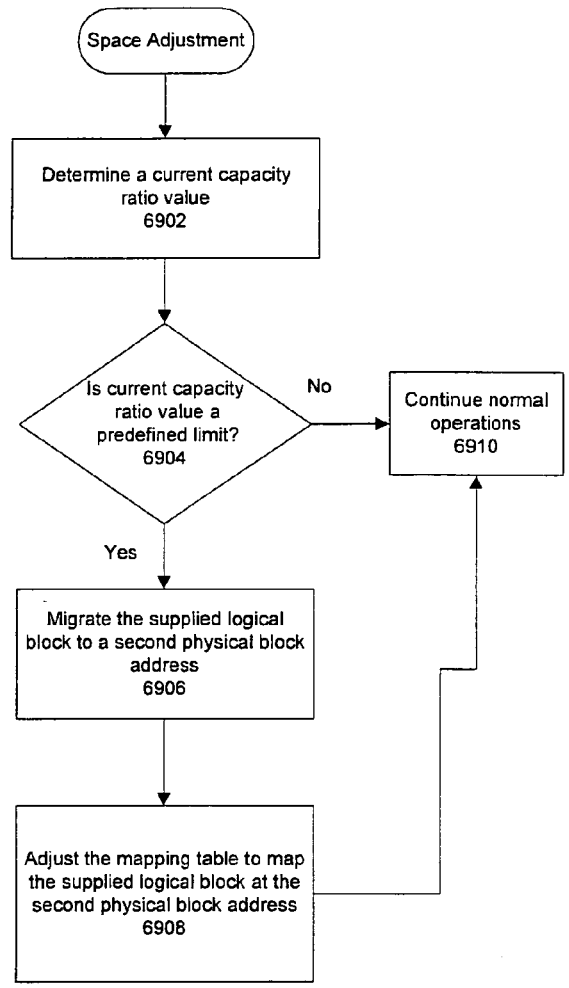
Figure 68
Figure 69

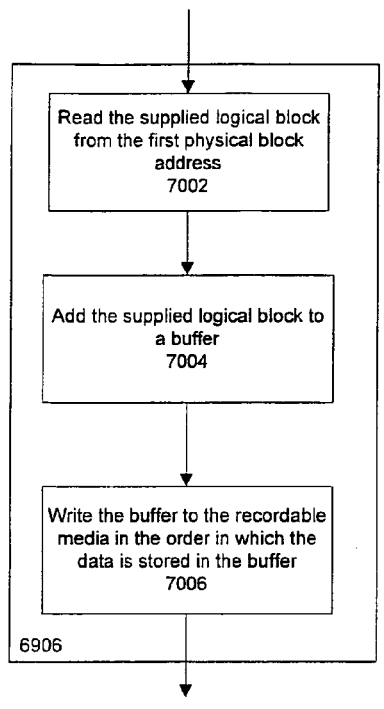
Figure 70
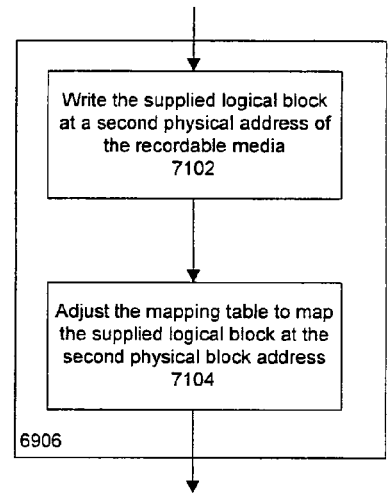
Figure 71
Figure 72
| Lead-In 7200 | Pre. 7202 | Syn 7204 | Supplied Logical Block 7206 | ECC 7208 |
|---|---|---|---|---|

METHODS AND STRUCTURE FOR FIELD FLAWSCAN IN A DYNAMICALLY MAPPED MASS STORAGE DEVICE

RELATED PATENTS

This patent application claims priority as a continuation-in-part of commonly owned, co-pending U.S. patent application Ser. No. 11/122,751 filed 5 May 2005 and entitled: Methods and Structure for Dynamically Mapped Mass Storage Device which is hereby incorporated by reference (also referred to herein as the "parent patent application" or simply the "Parent"). This patent application is also related to and claims priority to the following U.S. Provisional Patent Application Ser. No. 60/728,899 filed 21 Oct. 2005 and entitled: Dynamic Multiple Indirections of Logical to Physical Space within a Disk Drive, Ser. No. 60/728,904 filed 21 Oct. 2005 and entitled: LBA Indirect Dynamic Data Density, Ser. No. 60/728,900 filed 21 Oct. 2005 and entitled: LBA Indirect On-the-Fly Head Depopulation, Ser. No. 60/728,898 filed 21 Oct. 2005 and entitled: LBA Indirect Field Flawscan, Ser. No. 60/728,903 filed 21 Oct. 2005 and entitled: LBA Indirect Appended Metadata Storage When Space Available, Ser. No. 60/728,902 filed 21 Oct. 2005 and entitled: LBA Indirect Disk Drive Write Fault System, Ser. No. 60/729,377 filed 21 Oct. 2005 and entitled: Lead-in Writes in a Disk Drive for Thermal Stability, Ser. No. 60/728,897 filed 21 Oct. 2005 and entitled: Grown Defects without Performance Loss in an Indicated Disk Drive, all of which are commonly owned and hereby incorporated by reference. This patent application is also related to the following commonly owned and co-pending U.S. patent application Ser. No. 11/583,533 filed 19 Oct. 2006 and entitled: METHODS AND STRUCTURE FOR HANDLING GROWN DEFECTS IN A DYNAMICALLY MAPPED MASS STORAGE DEVICE, Ser. No. 11/583,331 filed 19 Oct. 2006 and entitled: METHODS AND STRUCTURE FOR DYNAMIC DATA DENSITY IN A DYNAMICALLY MAPPED MASS STORAGE DEVICE, Ser. No. 11/533,341 filed 19 Oct. 2006 and entitled: METHODS AND STRUCTURE FOR DYNAMIC APPENDED METADATA IN A DYNAMICALLY MAPPED MASS STORAGE DEVICE, Ser. No. 11/583,550 filed 19 Oct. 2006 and entitled: METHODS AND STRUCTURE FOR ON-THE-FLY HEAD DEPOPULATION IN A DYNAMICALLY MAPPED MASS STORAGE DEVICE, Ser. No. 11/583,623 filed 19 Oct. 2006 and entitled: METHODS AND STRUCTURE FOR DYNAMIC MULTIPLE INDIRECTIONS IN A DYNAMICALLY MAPPED MASS STORAGE DEVICE, Ser. No. 11/583,502 filed 19 Oct. 2006 and entitled: METHODS AND STRUCTURE FOR WRITING LEAD-IN SEQUENCES FOR HEAD STABILITY IN A DYNAMICALLY MAPPED MASS STORAGE DEVICE, and Ser. No. 11/583,598 filed 19 Oct. 2006 and entitled: METHODS AND STRUCTURE FOR RECOVERY OF WRITE FAULT ERRORS IN A DYNAMICALLY MAPPED MASS STORAGE DEVICE which are hereby incorporated by reference.

BACKGROUND OF THE INVENTION

1. Field of the Invention

The present invention relates generally to mass storage device control structures and methods in a dynamically mapped mass storage device and more specifically to structures and methods within the controller of a dynamically mapped mass storage device, such as a disk drive, operable to perform field flawscan of the storage device.

2. Discussion of Related Art

A common example of a mass storage device is a disk drive having one or more rotating recordable media surfaces each with a corresponding read/write head for writing information thereon and for reading back previously written information. As used herein, "disk drive" is intended to represent such devices with rotating storage media and corresponding read/write heads as well as other similar, exemplary mass storage devices. Further, "recordable media", "recordable media surface" and "persistent media" are all intended as synonymous and represent one or more media surfaces on which this information may be recorded and read back—typically using optical or magnetic encoding and modulation techniques and structures.

It is generally known in the disk drive arts that fixed sized units of data are physically stored about the circumference of concentric tracks laid out on a magnetic or optical persistent storage medium. These fixed size units of data are often referred to as "blocks" or "sectors". A particular block or sector physically located on the rotating storage medium may be identified by its cylinder or track number and its sector or block number within that track. In addition, where a disk drive includes multiple storage media services each with an independent R/W head, a particular head or surface number may identify the surface on which a particular physical block or sector is located. Such physical addresses are often referred to as "CHS" (an acronym for cylinder, head, and sector).

Most present-day disk drives permit a logical block address to be utilized by the host system or device rather than a specific CHS designation to identify a particular block or sector to be accessed. Such a logical address is typically a sequential range of logical block numbers from zero through N where N is the maximum number of physical sectors or blocks available on the disk drive storage media. The host may therefore address or identify a particular physical block by its logical block address ("LBA") rather than by the more complex and cumbersome CHS designation. The disk drive (specifically a disk drive controller component of the disk drive) then translates or maps a provided logical block address (LBA) into a corresponding physical location (typically, a CHS address designation). Further, such logical addressing permits the disk drive controller to transparently redirect access for a particular physical block to an alternate or spare physical block where the original physical block has been damaged or is otherwise inaccessible. The disk drive controller merely translates the supplied LBA to a different physical block of the disk storage media.

As presently practiced in the art, physical sectors or blocks on the disk drive are all the same size as measured in number of bytes. For example, present disk drives often utilize a block or sector size of either 512 or 1024 bytes. The particular physical block or sector size may be any suitable size selected for a particular disk drive application in accordance with performance and storage capacity design choice tradeoffs. However, as presently known in the art, physical sectors on a disk drive are all a common, designated size. The logical blocks utilized by a host device in addressing storage of the disk drive are also a fixed size. Though the fixed size of a logical block may be different than the fixed size of the physical disk blocks, as presently practiced a simple arithmetic computation may be used because the physical block size and logical block size are typically integral multiples/fractions of one another. In other words, as presently practiced, a logical block size is typically an integral multiple of the physical block or sector size. Such a strict arithmetic relationship between the logical block size and physical block size precludes a number of possible features and enhancements within a disk drive.

The Parent discloses methods and structures for a dynamically mapped storage device in which mapping structures and methods hide the user from any knowledge of the actual location of user supplied data by dynamically mapping user supplied logical blocks to physical disk blocks wherein the size of a user supplied logical block is independent of the size of the one or more corresponding physical disk blocks used to store the user supplied logical block. Typically the logical block size is fixed while the physical disk block size may vary since the mapping is completely localized within the storage device.

Thus the Parent provides improved logical to physical mapping for blocks of data within a disk drive of such that the logical block size defined by an attached host system may be independent of the physical block size used within the disk drive for storage of information.

In typical present day disk drives, the manufacturer performs a flawscan at time of manufacture to identify flaws on the recordable media surfaces of the drive. All recordable media tend to have some fraction of media that is marginal or out of specified tolerances with respect to its recording characteristics. In particular, magnetic recordable media tend to have areas in which the media is outside of specified ranges for recording magnetic flux changes representing recorded data. To assure that the manufactured disk drive has sufficient usable storage media space for its specified capacity the manufacturer tests the disk drive by writing and reading back every physical location on the recordable media surfaces. This process, typically referred to as a "flawscan", can be very time consuming often involving hours of test time for each disk drive. Such a time consuming process is inherently a costly bottleneck in the manufacturing process. To maintain desired productivity goals in the manufacturing process, manufacturers often invest significant capital to use a large number of flawscan systems to thereby maintain desired throughput goals for manufacturing and testing valid, certified disk drives.

It remains an ongoing problem in all storage devices to maintain desired quality standards for the manufactured disk drives while reducing the time and costs associated with flawscan processing of manufactured disk drives.

SUMMARY OF THE INVENTION

The present invention solves the above and other problems, thereby advancing the state of the useful arts, by providing methods and structures for field flawscan such that flawscan processing at time of manufacture may be significantly reduced and thus manufacturing costs reduced. In a dynamically mapped storage device in which all user supplied logical blocks are dynamically mapped by the storage device controller to physical disk blocks, features and aspects hereof permit flawscan testing of a storage device to be completed substantially concurrently with processing write requests for its intended application. A fraction of the storage device may be certified by an initial flawscan performed during manufacturing testing. Statistical sampling sufficient to assure a high probability of achieving specified capacity may be performed to reduce manufacturing time and costs in testing. Final flawscan of the remainder of the storage locations may be performed substantially concurrently with processing of write requests after the device is installed for its intended application. Mapping features and aspects hereof allow the storage device controller to perform flawscan and write operations concurrently.

One feature hereof is a method operable in association with a dynamically mapped storage device, the method including: performing an initial flawscan on the storage device wherein the initial flawscan tests less than all of the physical capacity of the storage device; and performing a final flawscan to complete testing of all physical storage capacity of the storage device, wherein the initial flawscan is performed in association with manufacture of the storage device, and wherein the final flawscan is performed by the storage device after the device is installed for initial application use and is performed concurrently with application use of the storage device.

Another feature hereof is a method operable in a dynamically mapped storage device, the method comprising: certifying locations of the storage device by performing a flawscan of all presently uncertified locations of the storage device; and substantially concurrently processing write requests to store supplied data on the storage device.

Another feature hereof is a dynamically mapped storage device comprising: a plurality of locations for storing host-supplied data wherein each of the plurality of locations may be certified for use by a flawscan procedure or may be uncertified for use if not yet tested by a flawscan procedure; and a controller adapted to process write requests to store supplied data in selected locations of the plurality of locations wherein the controller is further adapted to complete certification of the plurality of locations by performing a final flawscan substantially concurrently with processing of write requests.

BRIEF DESCRIPTION OF THE DRAWINGS

The same reference number represents the same element or same type of element on all drawings.

FIG. 5 is a block diagram of an exemplary master table providing logical to physical mapping structures associated with features and aspects hereof.

FIG. 6 is a block diagram providing additional details of exemplary entries in the mapping tables of FIG. 5.

FIG. 14 is a block diagram of a disk drive controller providing indirect logical to physical mapping in accordance with features and aspects hereof to thereby enable compression of data stored on, and retrieved from, the physical disk media.

FIGS. 15 through 18 are block diagrams suggesting the potential benefits derived from data compression within a disk drive as in FIG. 14.

FIGS. 26 through 28 are flowcharts providing exemplary additional details of aspects of the methods of FIG. 24.

FIGS. 37 through 39 are flowcharts describing exemplary methods for field flawscan in accordance with features and aspects hereof.

FIG. 60 is a schematic diagram of an exemplary disk drive including multiple recording surfaces.

FIG. 68 is a flowchart representing an exemplary method operable within a storage device controller (e.g., disk controller) in conjunction with the mapping features and aspects discussed herein above for writing thermal lead-in sequences for allowing the write head to stabilize.

FIGS. 69-71 are flowcharts representing exemplary methods operable within a storage device controller (e.g., disk controller) in conjunction with the mapping features and aspects discussed herein above to provide re-mapping of physical blocks to eliminate thermal lead-in sequences.

FIG. 72 represents an exemplary data block or sector recorded using a thermal lead-in sequence write.

DETAILED DESCRIPTION OF THE DRAWINGS

Field flawscan features and aspects hereof rely upon the foundation of a dynamically mapped storage device as claimed in the Parent and as discussed herein below. Following the discussion of exemplary embodiments of the dynamically mapped storage device is a discussion of the field flawscan features and aspects hereof that reduce manufacturing time, cost and complexity.

Logical to Physical Indirect Mapping

Figure 1:
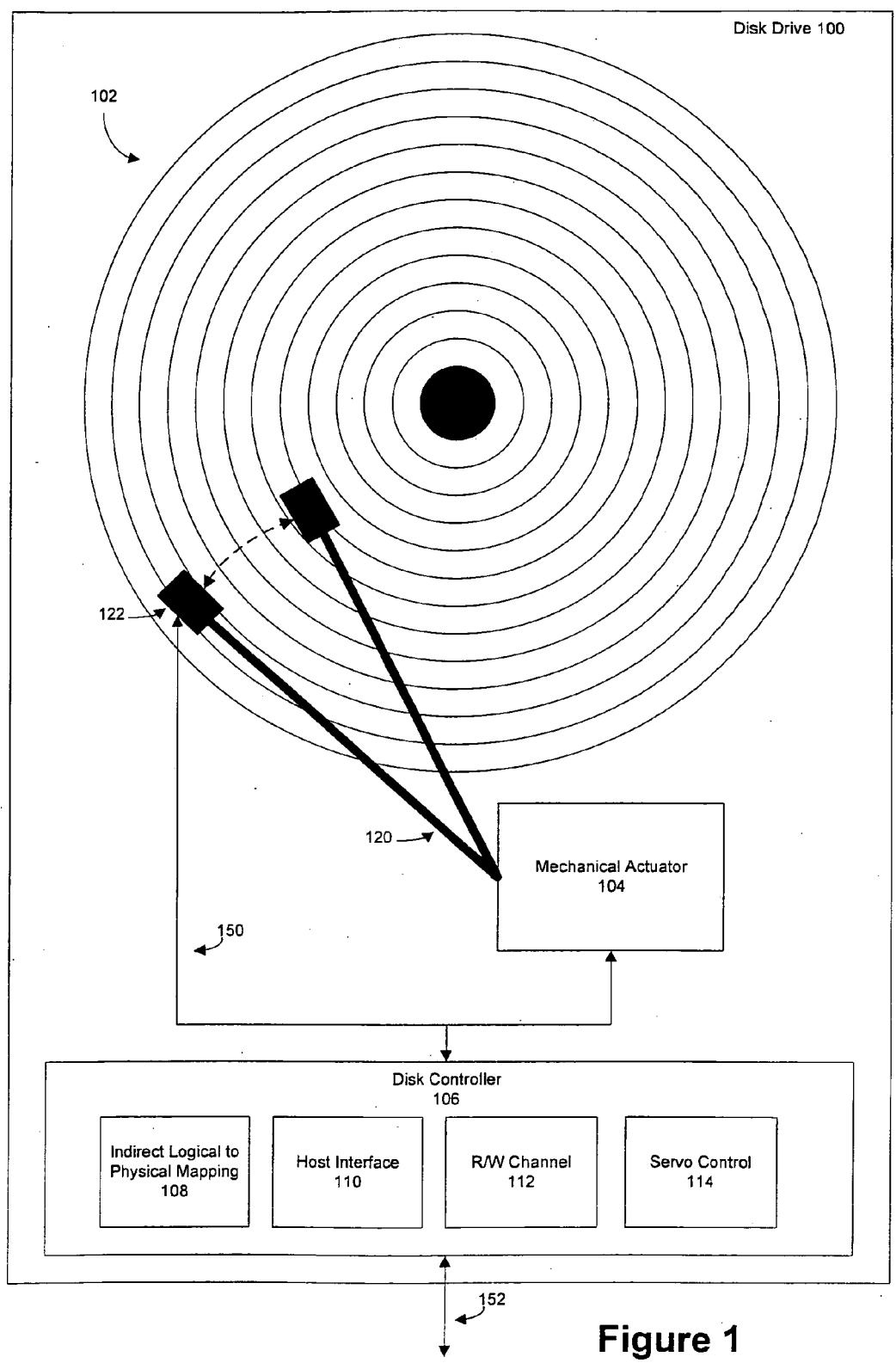
FIG. 1 is a block diagram of an exemplary disk drive enhanced in accordance with features and aspects hereof to provide indirect logical to physical mapping and to thereby enable numerous related enhancements for capacity, performance, and reliability.

FIG. 1 is a block diagram describing a disk drive 100 embodying features and aspects hereof for indirect mapping of logical block addresses to corresponding physical disk block addresses. Disk drive 100 includes rotating storage media 102 for recording information using optical or magnetic modulation techniques. Read/write head 122 is positioned over a surface of rotating disk storage media 102 to record (write) information on the surface of media 102 and to sense (read) previously recorded information therefrom. Read/write head 122 is moved radially between concentric tracks arranged on disk storage media 102 by pivoting arm 120 and mechanical actuator 104. Positioning of the read/write head 122 over a particular desired concentric track is controlled by disk controller 106. Read/write head 122 may also be referred to as a read head or a write head, as the reading and writing functions are generally integrated into a single device or assembly. Disk controller 106 communicates with mechanical actuator 104 and read/write head 122 via path 150. Disk controller 106 may include host interface element 110 for communicating with attached host devices, read/write channel element 112 for encoding and decoding information written or read by read/write head 122, and servo control 144 for accurately controlling rotational speed of disk storage media 102 and the radial track positioning of read/write head 122. Disk controller 106 may also be referred to as a disk drive controller, drive controller or storage drive controller. A plurality of disk platters (i.e., multiple storage media 102) and corresponding read/write heads 122 may be incorporated within a single disk drive such that vertically aligned concentric tracks may be accessed simultaneously by multiple read/write heads. Such a plurality of aligned tracks is typically referred to as a cylinder. Sectors or physical disk blocks are then recorded about the circumference of each track of a disk media surface.

As is generally known in the disk drive arts as presently practiced, a particular physical disk block or sector has a fixed size and is located by its radial track or cylinder position, a head number (where multiple heads and surfaces are incorporated), and a sector or block number on that track or cylinder. Further, as presently practiced in the art, host systems address the physical disk blocks of a disk drive using a logical block address ranging between 0 and N where N is the number of available physical disk blocks provided within the disk drive. As presently known in the art, logical blocks, like physical blocks, are fixed size. Typically, the logical block size is an integral multiple of the size of the physical disk block. Disk drive controllers as presently practiced in the art therefore perform a simple mathematical mapping or translation between a supplied logical block address and a corresponding physical disk block address. A logical block address is simply converted mathematically into a corresponding physical track or cylinder, a physical head and a physical sector or block on that head and cylinder.

As presently practiced in the art, a disk drive controller may perform additional mapping between logical and physical disk block addresses by supplying a table for bad blocks in which the data is unreadable due to physical damage or otherwise. The bad block table may translate a given original address (either logical block address or physical disk block address) into an alternate or spare address for redirecting host access from an original bad block to a replacement, alternate or spare usable block.

As noted above, such fixed mapping between logical block addresses and corresponding physical disk block addresses limits the flexibility to provide a number of useful features. A key to such problems generally derives from the requisite mathematical relationship between physical disk block size and logical disk block size.

In accordance with features and aspects hereof, indirect logical to physical mapping element 108 in disk controller 106 provides structure and methods for mapping logical block addresses utilized by host devices into corresponding physical disk block addresses for blocks stored on the disk storage media 102. The indirect mapping structures and methods provide independence of the logical block size and physical block size to thus enable implementation of numerous enhancements and benefits as discussed further herein below.

Those of ordinary skill in the art will recognize that FIG. 1 is merely intended as exemplary of typical components, structures, and functions within a disk drive 100 enhanced in accordance with features and aspects hereof. Numerous equivalent structures and functional elements may be provided as a matter of design choice to achieve the desired functionality of indirect logical to physical disk block address mapping. Further, those of ordinary skill in the art will recognize a wide variety of additional elements useful in design and operation of any disk drive 100. Still further, any number of disk storage media surfaces and corresponding read/write heads may be provided within a disk drive 100 enhanced in accordance with features and aspects hereof.

Figure 2:
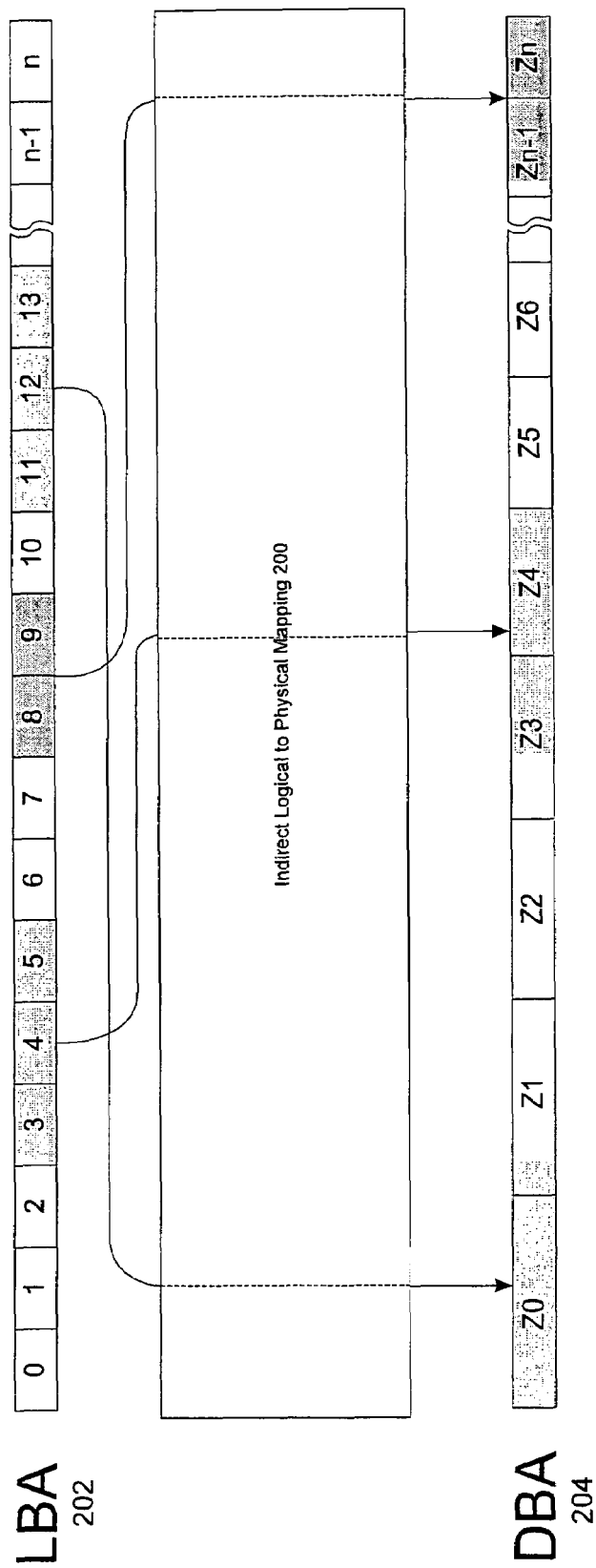
FIG. 2 is a block diagram depicting an exemplary logical to physical mapping element in accordance with features and aspects hereof to map sample logical block addresses into corresponding physical disk block addresses.

FIG. 2 is a block diagram suggesting operation of an indirect logical to physical mapping element 200 (similar to element 108 of FIG. 1). The logical block space 202 comprises a plurality of identically sized logical blocks enumerated by a logical block address ("LBA") ranging from 0 through N. The logical block size may be defined by a host operating system or file system and may represent any convenient size for the particular storage application. In other words, larger logical block sizes may be preferred for certain applications such as multimedia streaming or video data recording while smaller block sizes may be preferred for random access general file storage or database applications. LBA space 202 therefore represents an exemplary sequence of logical block addresses each representing a corresponding logical block of equal, predetermined size.

Disk block space 204 represents physical disk blocks stored and retrieved from the disk storage media of the disk drive. Within a disk drive controller, the physical disk block space 204 may also be addressed by a sequential index representation of a plurality of blocks indexed by a sequence identifier (e.g., Z0 through Zn where Zn is the total number of physical disk blocks available within the storage media of the disk drive). The sequential index Z0 through Zn may also be translated by mathematical and/or other mapping means into corresponding CHS forms of addressing for lower level read and write operations.

In accordance with the indirect logical to physical mapping features hereof, mapping element 200 is capable of mapping the fixed size logical blocks from the logical block space 202 into corresponding portions of the physical disk block space 204. The physical disk blocks in the physical space 204 may be of any size independent of the size of the logical blocks in the logical space 202. The physical disk blocks may be of equal, fixed sizes or may be variable in size but, in any case, the physical disk block size is independent of the size of the logical blocks.

In one aspect hereof as shown in FIG. 2, the physical disk blocks Z0 through Zn may be variable in size and thereby adapted to optimize available physical space between servo zones disposed on the disk storage media surface. As is generally known in the art, special sequences of information referred to as servo information may be recorded at various intervals in the circumferential direction of each track. Often the area between sequential servo zones may be referred to as a servo wedge in view of its wedge shape or pie shape geometry between radially disposed servo zones over the entire radial surface of the disk platter. Each physical disk block may therefore be configured as any appropriate size to optimize utilization of this variable sized space within each servo wedge. Hence, Z0 may be larger than Zn because it may be located within a wider servo wedge area of the disk media surface.

Figure 3:
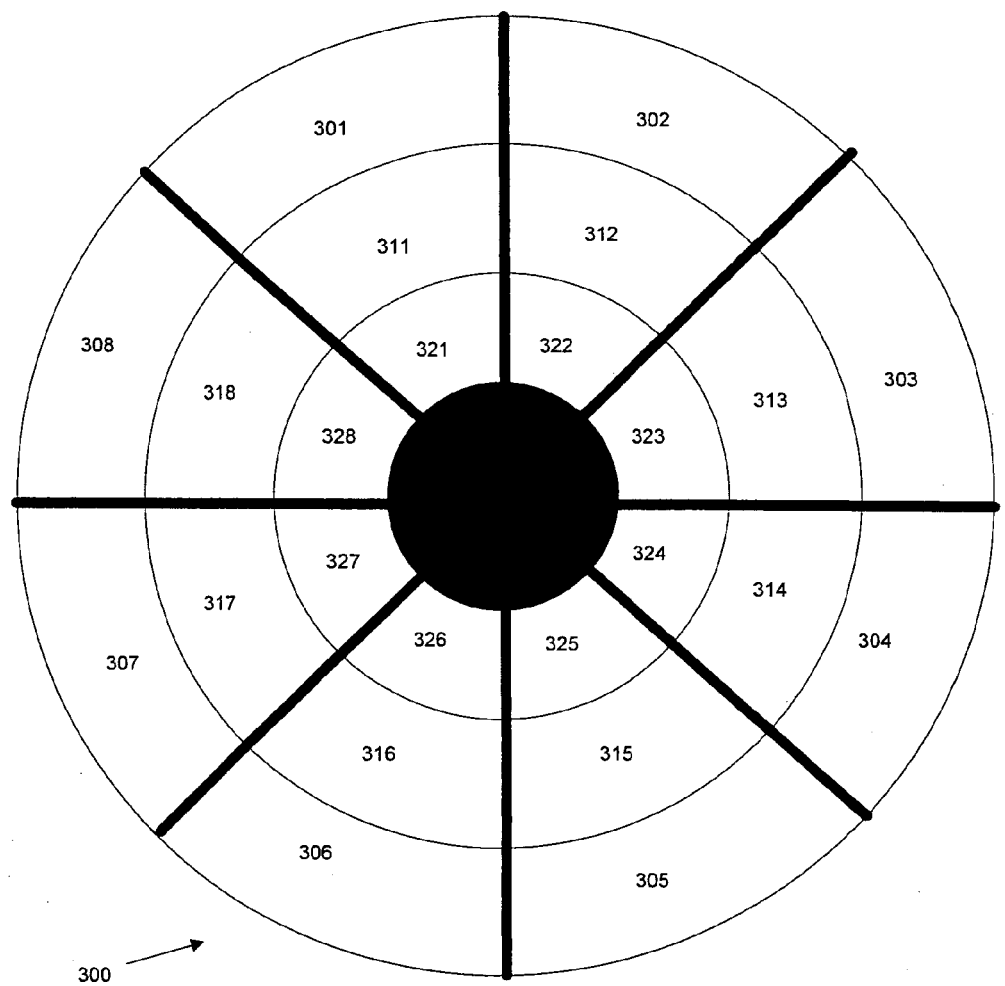
FIG. 3 is a schematic diagram suggestive of the variable physical disk block sizes that may be disposed at different radial track positions of a disk media surface in accordance with features and aspects hereof.

Since the physical disk block size is independent of the logical block size utilized by attached host devices, features and aspects hereof allow the physical data block size to vary in accordance with the location of the block on the physical disk storage media. For example, as shown in FIG. 3, physical disk blocks at an outer diameter circumference outer diameter track of the disk drive may be larger than those at an inner diameter track of the disk drive. For example, blocks 301 through 308 may be larger than blocks 311 through 318 positioned at a more inward radial position. In like manner, blocks 311 through 318 may be larger than physical blocks 321 through 328 at a still further inward radial position.

Returning again to FIG. 2, indirect logical to physical mapping element 200 may therefore map the predetermined, fixed sized, logical blocks referenced by a host device into any portion of any of the fixed or variable sized physical disk blocks. A logical block boundary (start or end) need not coincide with a physical disk block boundary. As discussed further herein below, metadata stored within (or otherwise associated with) the physical disk blocks may be used to determine the size of each physical block and hence the location of the next physical disk block.

For example, as shown in FIG. 2, logical blocks 3, 4 and 5 in LBA space 202 are translated by mapping element 202 to a starting portion of physical disk block Z3 and the entirety of disk block Z4 in DBA space 204. Logical blocks 8 and 9 are similarly mapped to a starting portion of DBA Zn−1 and the entirety of DBA Zn. Further, logical blocks 11, 12 and 13 are mapped to the entirety of physical disk block Z0 and a beginning portion of physical disk block Z1.

Those of ordinary skill in the art will readily recognize that any number of logical blocks may be provided in a particular application and any number of disk blocks may be defined within a particular disk drive as appropriate for a particular application. Further, as is evident from FIG. 2, the logical block size and the physical disk block size may be independent of one another so as to enable numerous additional features and aspects hereof discussed further herein below. Still further, the plurality of physical disk blocks may vary in size as desired for a particular application to further optimize utilization of the area between servo zones (i.e., to fully utilize the physical space available in each servo wedge).

Indirect logical to physical mapping element 200 of FIG. 2 therefore represents any processing means and/or structures and methods that permit such flexible mapping of logical block addresses to physical disk block addresses through indirection while permitting independence of the size of logical blocks and physical disk blocks. Details of exemplary methods and structures are presented herein below. Those of ordinary skill in the art will recognize numerous equivalent methods and structures for providing such flexible mapping in accordance with features and aspects hereof.

Figure 4:
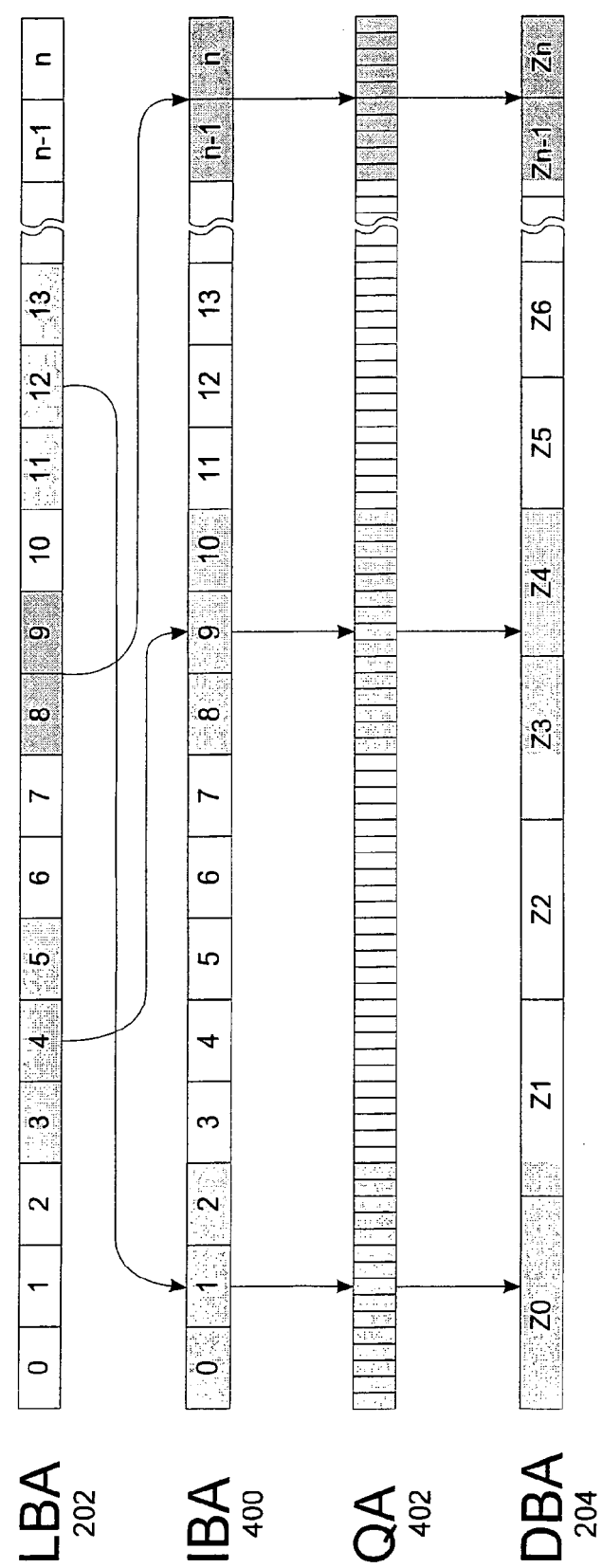
FIG. 4 is a diagram describing an exemplary mapping of logical block addresses to corresponding physical disk block addresses in accordance with exemplary data structures embodying features and aspects hereof.

FIG. 4 shows one exemplary structure and technique for achieving the desired indirect mapping between LBA space 202 and DBA space 204. A logical block address may be used to determine a corresponding intermediate block address in IBA space 400. The IBA space 400 and the LBA space 202 may utilize the same host defined block size—i.e., the logical block size. This first level of indirect mapping from LBA space 202 to IBA space 400 permits the LBA space 202 to be initially distributed and later redistributed on the disk drive media surface at virtually any time in a manner transparent to the host device. All blocks defined in LBA space 202 may be relocated at any time by operation of methods and structures in accordance with features and aspects hereof—i.e., any block, not merely a small number of "bad blocks" recorded in a small table as previously practiced in the art.

A next level of mapping maps between the IBA space 400 and a quantum data unit space 402 ("QA space"). All physical storage space available within a disk drive may be broken down into a sequence of smaller quantum units of data. The size of a quantum unit of data may be any convenient size in accordance with design choices well known to those of ordinary skill in the art but should be substantially smaller than the logical block size utilized by a host device. For example, the quantum unit data size may be equal to the size of a computer processor "word" used within the disk drive controller—i.e., four bytes in a typical 32 bit processing environment or eight bytes in a typical 64 bit processing environment. Preferably, the quantum unit data size will match a convenient word size related to processor and/or DMA movement of data among various components within the disk controller. Hence, 32 bits or 64 bits may be convenient sizes for typical disk controller applications.

Although the logical block size and disk block size are independent of one another, both the disk block size and the logical block size should be integral multiples of the quantum unit data size. In other words, where the quantum unit data size is, for example, a "quadlet" (32 bits), the logical block size and physical disk block size should both be integral multiples of the fundamental quadlet quantum unit data size (i.e., integral number of quadlet words).

The IBA space 400 corresponds to associated contiguous sequences of quantum data units. Pointers or other data structure indicia discussed further herein below may be used to translate between an indirect block address and a quantum unit of data address. For example, as depicted in FIG. 4, IBA blocks 0 through 2 correspond with the first fifteen quantum units of data graphically aligned in FIG. 4 immediately below IBA blocks 0, 1 and 2. In like manner IBA blocks 8 through 10 correspond to the quantum unit of data contiguous elements graphically aligned immediately below IBA blocks 8, 9 and 10 in FIG. 4. Similarly IBA blocks n−1 and n correspond to the quantum data units graphically aligned immediately below IBA blocks n−1 and n. The translation between an IBA space 400 block number and corresponding quantum data units may be a simple mathematical determination.

Lastly, the logical to physical mapping features and aspects hereof may translate the QA space 402 into corresponding positions within DBA space 204. Where, as shown in FIG. 4, the disk block sizes are variable, mapping between the QA space 402 and the DBA space 204 may be by mathematical means in combination with a table identifying the size of physical disk blocks in each cylinder, servo wedge or zone. Where the DBA space 204 comprises equal sized physical disk blocks, the translation between the QA space 402 and the DBA space 204 may be by simple mathematical means.

These multiple levels of mapping provide one exemplary embodiment of features and aspects hereof. Mapping from the LBA space 202 into the IBA space 400 allows physical blocks to be relocated at the sole discretion of the disk drive controller transparently with respect to any attached host system. Next, the mapping between fixed block sizes such as in the LBA space 202 (and the corresponding blocks in the IBA space 400) and DBA space 204 is accomplished by means of the quantum space 402 translation. Since both logical block sizes and physical disk block sizes should be integral multiples of the quantum unit data size, logical blocks may be translated into corresponding disk block addresses independent of the respective sizes.

Figure 10:
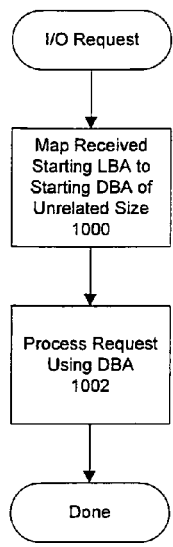
FIG. 10 is a flowchart describing exemplary high level processing of an I/O request received from an attached host device involving logical to physical mapping in accordance with features and aspects hereof.
Figure 11:
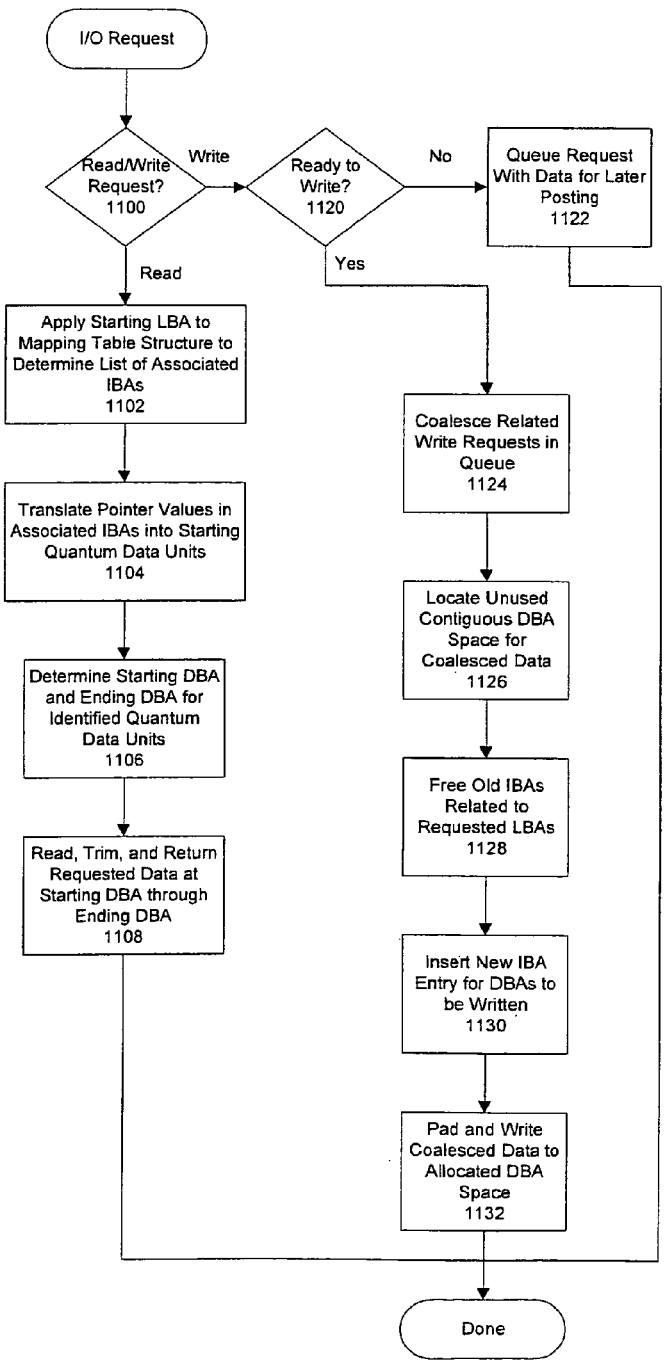
FIG. 11 is a flowchart providing additional exemplary details of I/O request processing involving logical to physical block address mapping in accordance with features and aspects hereof.

FIGS. 10-11 are flowcharts describing methods useful in conjunction with the exemplary structures discussed above to provide logical to physical mapping in processing of host I/O requests. FIG. 10 is a flowchart describing a high level view of the operation of a disk drive in accordance with features and aspects hereof to process an I/O request using a logical block address provided by an attached host device. Element 1000 is first operable to map the received starting LBA into a corresponding starting physical DBA where the size of the logical block and physical disk block are substantially independent. Element 1002 is then operable to complete processing of the received I/O request using the disk block address determined by the mapping process of element 1000.

FIG. 11 is a flowchart describing I/O processing of FIG. 10 in additional exemplary detail. Element 1100 is first operable to determine whether a received I/O request is a read or write request. If the received I/O request is a read request, element 1102 is operable to apply the starting LBA received in the request to a mapping table structure (e.g., such as shown in FIG. 4) to determine a corresponding list of associated indirect block addresses. Element 1104 is then operable to translate information in the identified associated list of IBAs into corresponding starting addresses of quantum units of data (e.g., a list of starting and ending addresses in QA space). Element 1106 is then operable to determine the starting and ending DBAs for the identified contiguous quantum units of data. Element 1108 is then operable to perform lower level disk operations to read the requested contiguous portions of physical disk blocks. Since the desired contiguous quantum units of data may not correspond to starting or ending boundaries of disk blocks, the retrieved data may include portions of disk blocks that precede the desired quantum units of data and/or that follow the desired quantum units of data. Extraneous data may be removed by operation of element 1108 and the trimmed data (requested data with extraneous start/end data removed) may then be returned to the requesting host device.

If element 1100 determines that the received request is a write request, element 1120 determines whether the disk drive is presently ready to write the requested data. As is generally known in the art, data for a write request may simply be queued for later posting with the requested write data stored in the cache memory or otherwise managed within the disk drive controller. If the write operation is to be deferred for a later posting, element 1122 is next operable to queue the request for later posting and thereby complete this disk write request. Such techniques are often referred to as write-back caching in that the request is completed as soon as the disk drive controller has the request stored in its local cache memory.

If element 1120 determines that the disk drive may presently proceed with the requested disk write operation, element 1124 is first operable to coalesce this request's write data with the data of other previously queued write requests. Since physical disk blocks may be variable in size, groups of contiguous related data stored in the disk drive controllers write cache memory may be coalesced into a single larger data frame structure as discussed further herein below. The data frame may coalesce contiguous related data and may span portions of one or more physical disk blocks. Element 1126 is then operable to locate an appropriate unused contiguous portion of the physical disk storage media identified by a starting disk block address. The unused contiguous disk space is preferably large enough to contain the coalesced data to be written.

The data to be written may include portions of contiguous data previously written to the disk drive and now coalesced with new data. This new data frame may be written to a new physical location of the disk drive storage media and therefore any existing mapping structures for indirect block addresses associated with the coalesced data to be written are freed by operation of element 1128. Element 1130 is then operable to insert a new LBA/IBA mapping entry in the master addressing table corresponding to the new disk block(s) about to be written. Element 1132 is then operable to add any required padding to the data frame to be written and so that the lower level disk operations may write one or more full disk blocks to the disk storage media. Element 1132 then completes the write operation by writing the coalesced, padded, physical blocks formatted as a data frame onto the persistent disk storage media.

Exemplary Mapping Structures and Methods

The logical to physical mapping described above with respect to FIGS. 10 and 11 may be performed in accordance with numerous mapping structures and techniques that permit indirection of the mapping to enable relocation of physical disk blocks independent of the host supplied logical block addresses and that permit independence of the logical block size and physical block size.

The logical to physical mapping implementation suggested by the exemplary structures of FIG. 4 may be implemented as table structures in a RAM memory of the disk drive controller such as exemplary master addressing table 500 of FIG. 5. Master addressing table 500 may comprise multiple sections including, for example, indirection sub-table 502, indirection hash table 504, and system variables 506. Each portion or section of the exemplary master addressing table 500 is discussed further herein below. In general, indirection sub-table 502 comprises an ordered list of pointers for translating a contiguous sequence of logical block addresses (LBAs) into a corresponding sequence of indirect block addresses (IBAs). Given the potentially large size of such a structure, indirection hash table for 504 provides a rapid index to sections of the larger interaction sub-table 502. Those of ordinary skill in the art will recognize a variety of similar structures to segment such a large table such as indirection sub-table 502 for more rapid searching. System variables 506 include numerous metadata values and other control variables useful in managing master addressing table 500. For example, system variables 506 may include a sequence number used to identify a chronological order for various copies of the master addressing table as well as the order of data frames added to the disk storage relative to a copy of the master addressing table 500. The sequence numbers in the master addressing table(s) and the data frames may be used to synchronize various pointer entries with a corresponding version of the master addressing table.

The master addressing table is preferably maintained within RAM memory of the disk controller. Since the disk controller's RAM memory is typically a volatile memory, the master addressing table 500 is periodically written to reserved areas of the disk storage media. Such reserved areas are preferably excluded from the DBA space discussed above used for storage of host device supplied data. Storing the master addressing table 500 in such reserved locations of the disk drive storage media assures that the logical and physical address spaces and mappings there between may be recovered in case of power failure during operation of the disk drive. Further, multiple copies of the master addressing table may be stored in different locations of the disk drive to further enhance reliability of the retention of the address mapping structures. Still further, each of such multiple copies may represent a different snapshot in time of the present mapping data stored on the disk drive storage media. Such periodic snapshots of the master addressing table maintained on the disk storage media permit rollback of the mapping structures to earlier points in time. Such a rollback feature permits managed reliability for the contents of the disk drive.

Figure 7:
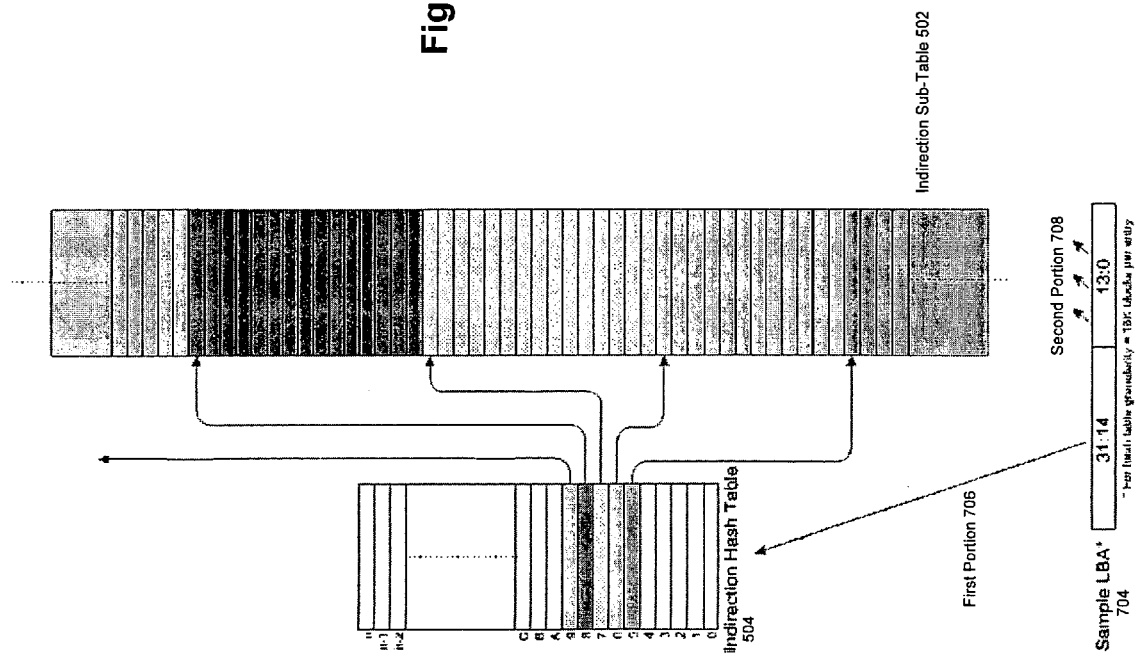
FIG. 7 is a block diagram suggesting utilization of the exemplary mapping table structures of FIG. 5 to translate or map exemplary logical block addresses into corresponding physical disk block addresses in accordance with features and aspects hereof.

The structure of entries in the various portions of the master addressing table 500 is exemplified in FIG. 6 and exemplary use of such structures is depicted in FIG. 7. Referring first to FIG. 7, the indirection hash table 504 comprises a plurality of hash table entries each pointing to the starting location of a segment of the indirection sub-table. Each segment or region of the sub-table 502 comprises a plurality of indirection sub-table entries each mapping a starting LBA to a corresponding IBA. The indirection hash table 504 therefore permits more rapid access to segments or portions of the potentially large indirection sub-table 502. As shown in FIG. 7, an upper portion 706 of an exemplary 32 bit LBA 704 may be used as an index into indirection hash table 504. The entry so located may then be used as a start pointer for the corresponding segment of the indirection sub-table 502. A lower portion 708 of bits in the exemplary LBA 704 may then be used to search the identified segment or region of the interaction sub-table 502.

FIG. 6 shows an exemplary format for each entry 600 of the hash table 504 and each entry 610 of the sub-table 502. The hash table entry 600 includes a start pointer 602 to the start of the sub-table 502 section corresponding to the hash entry's index value (i.e., the upper bit portion of an applied LBA). A sub-table page/segment size 604 indicates the number of entries in the segment to which the start pointer 602 points. Each sub-table entry 610 includes a start LBA 612 and an end LBA 614 defining the range of LBAs mapped by this entry to corresponding IBAs. The start IBA 616 indicates the first IBA of the contiguous IBAs to which the corresponding range of LBAs is mapped.

Those of ordinary skill in the art will recognize numerous equivalent structures for providing the desired indirect mapping features. The structures of FIGS. 5-7 are therefore merely intended as exemplary of one possible set of data structures for providing the desired indirect mapping and independence of logical and physical disk block sizes.

Figure 12:
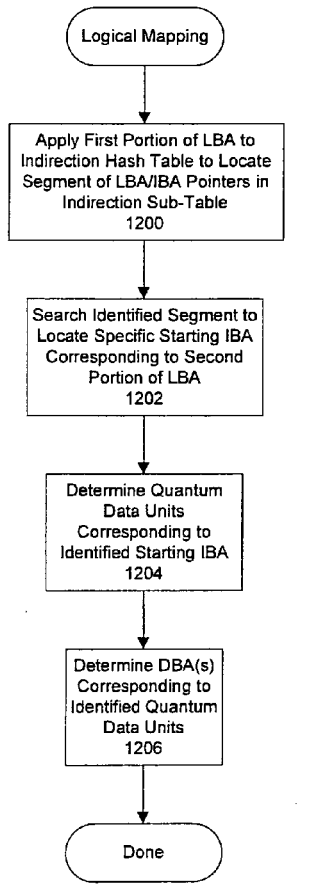
FIG. 12 is a flowchart providing further details of an exemplary method for mapping logical to physical addresses utilizing a particular exemplary mapping structure embodying features and aspects hereof.

FIG. 12 is a flowchart describing additional details of an exemplary logical to physical mapping step utilizing the exemplary data structures described herein with respect to FIGS. 5-7. Element 1200 is first operable to apply a first portion (e.g., 706 of FIG. 7) of the received LBA to a hash table (e.g., 504 of FIGS. 5 and 7) to locate a segment or portion of the indirection sub-table (e.g., 502 of FIGS. 5 and 7). As above, the indirection sub-table entries provide mapping of a starting LBA to a corresponding starting IBA for a sequence of contiguous blocks. The hash table entry therefore points to a segment or portion of the indirection sub-table representing a contiguous segment of logical blocks. As noted above in FIG. 6, the entry may also include a size of the segment to be searched. Element 1202 then searches the identified segment to find the specific starting IBA corresponding to the second portion of the supplied LBA. Those of ordinary skill in the art will recognize that the number of bits used for the first portion as an index into the hash table and used for the second portion as a search term for searching the sub-table is a matter of design choice in trading off hash table size versus sequential searching of an identified segment. Further, those of ordinary skill in the art will recognize well-known search techniques such as binary search techniques for searching the ordered list represented by the identified segment of the sub-table.

Elements 1204 and 1208 are then operable to determine the particular quantum units of data corresponding to be identified starting IBA. Specifically, element 1204 determines the quantum address (QA) corresponding to the starting IBA and element 1208 maps the QA into a corresponding starting and ending DBA using mathematical translation techniques optionally in conjunction with a table look up associated with variable length physical block sizes. Such mathematical translations and table lookup processing techniques are well known to those of ordinary skill in the art.

Mapping Table Copies, Regeneration and Data Frames

The indirection sub-table 502 (of FIGS. 5 and 7) may grow and shrink as portions of the disk drive storage media are utilized. The structure may be maintained as any of several well known data structures to simplify such expansion and contraction. A simple vector of entries may be used and entries shifted up or down as entries are deleted or added. Each segment of portion may be so managed as a separate vector or the various segments may be managed together such that the entire sub-table is a single vector of memory. Numerous well known dynamic memory management structures and techniques may be utilized to aid in managing the size of a working copy of the master addressing table stored in RAM memory of the disk drive controller. In particular, in one exemplary embodiment, the master addressing table and cache memory space may be comingled and managed such that the master addressing table may grow and shrink by allocating and freeing memory in cooperation with corresponding size management of cache memory. In other words, a single pool of physical memory may be used for both allocation in the master addressing table and for data caching features within the disk drive controller. Again, those of ordinary skill in the art will recognize numerous equivalent structures and techniques for dynamically managing memory used either for caching or for addressing tables associated with features and aspects hereof.

Since the RAM memory working copy of the master addressing table is typically stored in a volatile memory within the disk drive controller, it is preferable to periodically update a copy of the master table saved on the disk drive storage media for persistent storage. In view of the large size and the latencies associated with disk media access, the master addressing table should not be updated on disk each time a change is made. Rather, the table may be copied to a reserved area of the disk periodically in response to changes made thereto. When the disk drive is powered up, the master addressing table last stored on the disk media may be used to initialize the RAM copy of the master addressing table. However, the master addressing table most recently stored on disk will likely be inconsistent with the actual data stored on disk—i.e., will not accurately reflect data written to the disk blocks but for which the disk copy of the master tables did not get recorded prior to disk power down.

To address this condition, host supplied data is written to the disk with structured metadata that permits the RAM copy of the mapping tables to be updated to reflect data actually recorded on the disk storage media. As discussed further herein below, data is recorded in the form of a data frame where metadata in each data frame maintains a linked list of all data frames linked in the chronological order in which they were written to the disk. The data frame metadata may be used to reconstruct the master addressing table by sequentially traversing a linked list of data stored on the disk drive physical storage media. Since such traversal of data stored on the disk drive storage media can also be very time consuming at power up of the disk drive, a relatively recent version of the addressing tables is located on the disk drive media and used as a starting point for the traversal of data frames. To reduce the time for traversing the data frames at power up initialization of the disk drive, it is preferable that the addressing tables be frequently written to the disk media so that the addressing tables are a more accurate representation of the data frames presently stored on the disk. Conversely, in view of the potentially large size of the master addressing tables, recording the table on the persistent disk drive storage media can be time consuming. Numerous techniques and structures will be readily apparent to those of ordinary skill in the art to establish an appropriate performance tradeoff between runtime performance during normal operation of the disk drive and power up processing time required to prepare the disk drive for normal operation. For example, the master addressing tables may be updated on the disk drive storage media nearly constantly during idle periods in the disk drive if (i.e., when no host device request is presently pending) and may be less frequently updated during processing of host based requests.

When the disk drive is initially powered up, the working copy of the master addressing table must be retrieved into memory RAM memory of the disk drive controller and then may need to be updated to reflect any data frames written to physical disk blocks since the last posted update of the master addressing table to the persistent disk media storage. The metadata of the master addressing table (i.e., system variable thereof) and the metadata of the data frames may be used to reduce the time required to initialize the disk drive for normal operation.

First, where multiple copies of the master addressing table are recorded at various locations of the disk drive storage media, the copy with the most recent (e.g., highest) sequence number will be retrieved as representing the most recently saved version of the master addressing table. The metadata of the master addressing table preferably includes a pointer to the last data frame to be written to the disk prior to writing the corresponding copy of the master tables to the disk media. This last data frame may be used as a starting point to reduce the number of data frames that must be traversed to update the RAM copy of the initialized master addressing tables.

Figure 19:
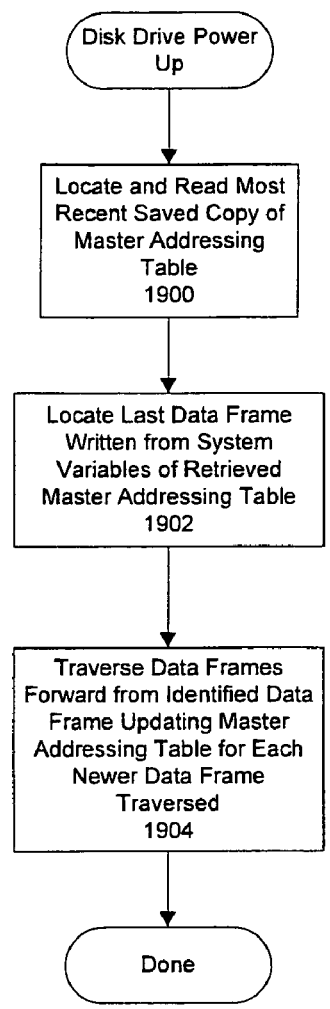
FIG. 19 is flowchart describing exemplary disk drive power up initialization in accordance with mapping features and aspects hereof.

FIG. 19 is a flowchart describing a method associated with features and aspects hereof for retrieving and updating master addressing tables from the disk drive storage media to perform power on of the initialization of a disk drive. Element 1900 is first operable to locate and retrieve the most recent saved copy of the master addressing table. As noted above, numerous chronological snapshots of the master addressing table may be stored on the disk drive persistent storage media. A sequence number entry in the system variables field of each saved copy may be used to identify the most recent of the multiple copies (e.g., that having the highest sequence number). Having so retrieved the most recent copy into RAM memory of the disk drive controller, element 1902 is then operable to locate the last data frame written to disk prior to writing of the most recent master addressing table. The last data frame may be determined according to the system variables in the retrieved master addressing table. As noted above and discussed further herein below, each data frame includes metadata including a sequence number indicating its chronological order of writing with respect to the sequence number of a corresponding master addressing table and with respect to other data frames. Data frames following the last identified data frame in the just read master addressing table are then traversed to update the just read master addressing table. Element 1904 represents processing to traverse the linked list of newer data frames starting at the identified last data frame in the retrieved master addressing table. For each data frame traversed, the master addressing table read into RAM is updated accordingly until no further data frames are encountered in the traversal. Hence, the master addressing table in RAM memory of the disk drive controller is updated during power up. Normal processing commences with periodic saving of updates the master addressing table as noted above.

As noted above, to aid in managing mapping features and aspects hereof, a data frame structure may be utilized that includes management metadata to permit coalescing of contiguous blocks provided by the host request and to enable the mapping features and aspects hereof. In coalescing, when a plurality of contiguous quantum units of data are to be written to the disk drive, all available contiguous quantum units with data are aggregated together to create a single data frame to be written to one or more physical disk blocks of the disk drive storage media. The structure of the data frame enables this coalescing feature.

Figure 8:
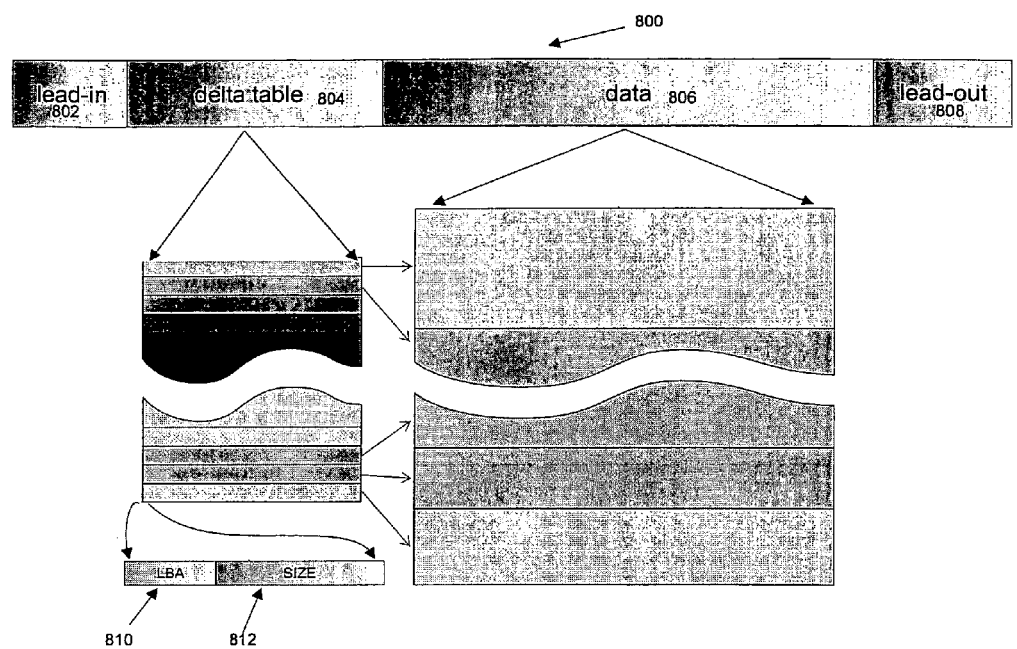
FIG. 8 is a block diagram of an exemplary data frame structure for storing physical disk blocks and exemplary, associated metadata in accordance with features and aspects hereof.

FIG. 8 is a block diagram describing one exemplary embodiment of a data frame useful for managing mapping and other features and aspects hereof. The data frame preferably may include a leading metadata 802 used to define the format and layout of portions of the data frame to follow. The leading metadata 802 is preferably a fixed size field that includes information such as the sequence number and size of the variable delta table and data portion that follows the leading metadata 802. The delta table 804 may follow the leading metadata field 802 and is a variable length table of entries providing a list of logical block addresses represented by the data frame. Each delta table 804 entry may include a logical block address 810 and the size 812 of the contiguous logical blocks that make up the data portion 806 that may follow. The delta table 804 entries are preferably maintained in sorted order according to starting logical block address. The delta table 804 therefore provides a map of the contiguous data portion 806 that immediately follows the delta table 804. The lead out field 808 is used as a delimiter for the frame and points to the physical location of the next data frame on the disk drive persistent storage media—next in accordance with the chronological order in which the data frames are written. The lead out field 808 may also be constant in size and, through its linked list field, permits traversal of all data frames in the chronological order in which they were written.

Physical Space Defragmentation

Figure 9:
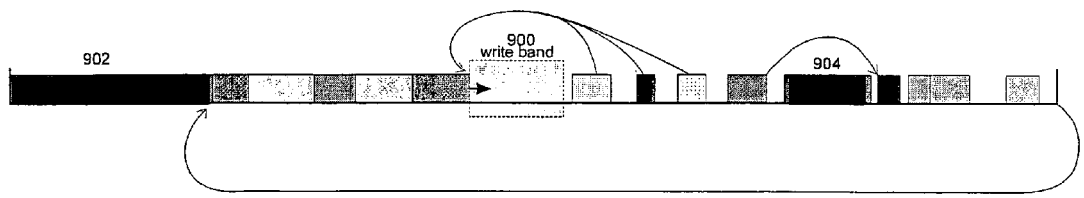
FIG. 9 is a block diagram suggesting an exemplary circular defragmentation technique associated with features and aspects hereof for defragmenting and coalescing physical disk blocks in accordance with features and aspects hereof.

Using the linked list structure of all data frames, the physical space of the disk drive storage media may be periodically compacted. FIG. 9 is a block diagram describing a method for compacting the physical space on the disk drive storage media. Each rectangular shaded portion of FIG. 9 represents a data frame as described above.

It is preferable to maintain a minimum write band 900 of available space on the disk drive storage media so as to avoid the possibility of an overrun condition during disk write operations. The size of the write band 900 is a matter of design choice and may be a function of, for example, the write cache size of the disk drive controller. In order to maintain an appropriate write band, it may be necessary to periodically relocate blocks ahead of the write band—e.g., it may be necessary to defragment the physical space on the disk drive by moving blocks ahead of the write band to available space preceding or behind the write band. Such circular decompression is suggested by the movement of blocks shown in FIG. 9.

Numerous techniques and structures for such circular compression (compaction) of the physical disk space will be readily apparent to those of ordinary skilled in the art. The indirect mapping and variable size data block features and aspects hereof enable such defragmentation and compaction while the indirect mapping allows relocation of physical storage space to be performed transparently with respect to host systems and devices.

Figure 13:
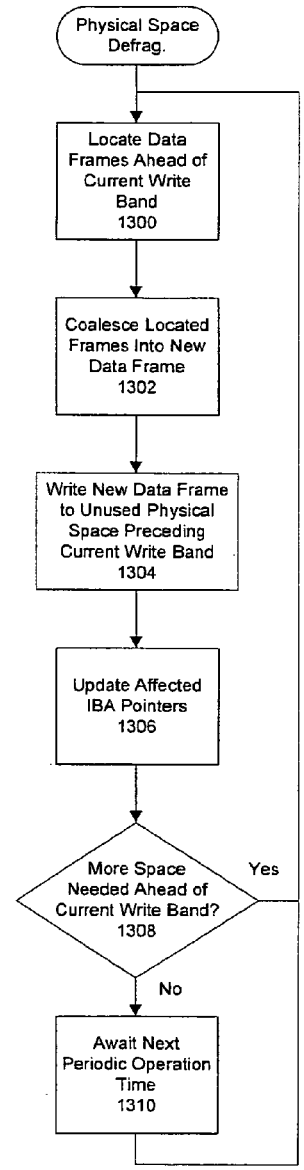
FIG. 13 is a flowchart describing an exemplary background process for periodic defragmentation of the physical storage space in accordance with features and aspects hereof.

FIG. 13 is a flowchart describing high level processing techniques associated with defragmentation of the physical storage space. Element 1300 is first operable to locate data frames ahead of the current write band position. Data frames may be deemed "ahead" of the current write band position if they are located in physical DBAs sequentially higher than the DBAs corresponding to the current write band position. Element 1302 then attempts to coalesce multiple located data frames into a new data frame to be written in contiguous, available physical disk blocks. Element 1304 then represents processing to write the new, coalesced data frame at physical disk block addresses representing unused physical space preceding the current write band position. If the writing of the coalesced new data frame is successful, element 1306 is operable to update the IBA pointers associated with the newly relocated data frame to reflect the new physical position of the associated indirect blocks. Element 1306 is also operable to mark the previous data frames, now coalesced into a new data frame, as free and available for re-use. In particular, the old data frames may be unlinked from the linked list queue of data frames written to the disk. Element 1308 then determines whether additional free space ahead of the current write band position is still required. If so, processing continues looping back to element 1300 to look for additional data frames ahead of the current write band position that may be relocated. If no additional space is needed at this time, element 1310 is operable to await the next periodic time for operation of the method. The method of FIG. 13 may run continuously as a background process in the disk drive controller and therefore may be scheduled at optimal times or may simply run continuously as a low priority background task. Eventually, when appropriate to continue operation, processing of the method continues looping back to element 1300 to attempt to locate additional data frames to be relocated relative to the current write band position.

Mapping Structure Defragmentation

As data is written and re-written and as data frames are relocated, the mapping table structures may also become fragmented. In particular, the exemplary indirection sub-table discussed above with respect to FIGS. 5-7 may require defragmentation and compaction. Simple block memory moves may achieve the desired compaction where simple vectors of pointers are used as described above in the exemplary embodiment of FIGS. 5-7. Where more complex linked list queues or other more complex data structures are employed, other defragmentation and compaction techniques and structures may be employed as a matter of design choice readily recognized by those of ordinary skill in the art.

Where, for example, a logically contiguous file of information is written spanning a significant period of time, the logically contiguous blocks may be physically dispersed over the physical disk block space. Further, the indirect mapping tables will have a corresponding plurality of indirection mapping entries in the table structures described above. Periodically, these mapping tables may be scanned to locate such fragmented physical blocks that correspond to contiguous logical blocks. This defragmentation procedure may then gather the dispersed blocks, read them and re-write them in a new, contiguous physical data frame so as to generate a single indirect mapping table entry. The previous plurality of mapping table entries and corresponding fragments of physical disk blocks may then be recouped for re-use and the mapping table structures may be correspondingly compressed.

Methods and structures useful for such defragmentation will be readily apparent to those skilled in the art in view of the above mapping tables formats and data frame formats discussed above.

Disk Drive Data Compression

Features and aspects hereof associated with indirect mapping and independence of the logical and physical block sizes also permit compression features to be employed within the disk drive of controller. Whereas prior techniques generally performed compression at the host driver level or operating system level, indirect mapping and independent block size features hereof permit data compression to be performed within the disk drive transparently to host systems, drivers, and applications.

FIG. 14 is a block diagram of a disk controller 1400 in which mapping features and aspects discussed above may be embodied. Disk controller 1400 may include control logic and host interface 1402 for host interaction and for overall control of the disk drive. Data buffer 1404 is a memory used typically as a cache or staging buffer for exchanges of information between the disk storage media through read/write channel 1410. Compression engines 1406 represent one or more compression assistance circuits for performing on-the-fly data compression as data is moved into or out of data buffer 1404. Error control element 1408 is a circuit utilized by disk controller 1400 to perform error code generation and checking in association with data transfers through read/write channel 1410 to or from the storage media. All the components of disk controller 1400 may communicate via communication path 1412. In practice, those of ordinary skill in the art will recognize a variety of optimal communication paths and buses for dedicating particular information exchanges to particular segmented, dedicated buses and communication paths.

As noted above, logical to physical mapping features and aspects hereof along with independent logical and physical disk block size features and aspects hereof enable on-the-fly compression to be utilized within the disk controller 1400. As a matter of design choice, compression engines 1406 may compress data as it is exchanged between the data buffer 1404 and the host interface 1402 moving data between the host system and the disk controller 1400. In such a configuration, compression engines 1406 compress received data from the host system prior to storing the data in the data buffer 1404 and decompress data from data buffer 1404 prior to returning the data to a host system. In an alternate embodiment, compression engines 1406 may compress data as it is exchanged between data buffer 1404 and read/write channel 1410. Data to be written to the disk storage media through read/write channel 1410 may be compressed as it is retrieved from data buffer 1404 for transmission to read/write channel 1410. Conversely, data read from the storage media through read/write channel 1410 may be decompressed by decompression engines 1406 prior to storing the read data into data buffer 1404.

Depending on the particular data compression techniques utilized and the configuration for compressing data within disk controller 1400, one or more compression engines 1406 may be operable in parallel to improve performance of compression techniques within the disk controller 1400.

Those of ordinary skill in the art will recognize that the block diagram of FIG. 14 is intended merely as representative of one possible configuration of features within an improved disk controller providing on-the-fly compression and decompression. Numerous equivalent structures and additional features will be readily apparent to those of ordinary skill and the art to permit on-the-fly compression and decompression of data within the disk controller in accordance with interactive mapping features and aspects hereof and in accordance with independent logical and physical disk block size features and aspects hereof.

A variety of benefits may be derived from compression of data within a disk drive controller. One clear benefit derives from simply increasing the capacity of the disk drive storage media. Although some overhead metadata is required to manage the compressed data, a common compression ratio of 2:1 of the host supplied data (i.e., for typical text files) may achieve a significant benefit in improved capacity of the storage device disk drive. A second benefit associated with on-the-fly compression within a disk drive controller derives from the improved error correction capabilities to thereby enhance data reliability in a disk drive. First, by merely compressing the data before recording the data on the disk drive storage media, existing error control codes ("ECC") provide error correction for the compressed data. Since the compressed data represents more user data in decompressed form, the same error correction capabilities normally existing in the disk drive provide improved bit error rates when measured against the volume of decompressed user data represented by the compressed data on disk. Secondly, by compressing the data portion stored on the disk drive storage media, the recouped space may be used for generation and storage of additional error correction bits to still further improve the bit error rate for data stored on the disk storage media.

FIGS. 15 and 16 graphically demonstrate the improved error correction features attainable by compressing data within the disk drive controller. FIG. 15 represents a typical data block or sector as presently recorded in typical disk drive storage media. A preamble sequence 1500 provides a header portion for information regarding the particular disk block such as block number and other metadata information. The sync field 1502 provides a standard bit pattern to allow the read/write channel phase lock loop controls to synchronize on the upcoming uncompressed data field 1504. As above, the data field may be one or more data frames with associated metadata linking the frame with other frames in chronological order. Following the uncompressed data field 1504 is an error correction code field 1506 to provide error correcting bits for detecting and correcting various bit errors encountered in reading the uncompressed data 1504 from the disk storage media. FIG. 16 represents a similar disk block or sector with compressed data in compressed data field 1602. An additional header field representing compression attributes 1600 may be added to the disk block to represent parameters of the compression algorithm applied to compress the data. In addition, as noted above, some of the recovered space due to the compression of data may optionally be used for additional error correction bits in the ECC+ field 1604.

FIGS. 17 and 18 graphically represent the benefit of improved storage capacity derived from compression of host supplied data by the disk controller. FIG. 17 depicts consecutive, contiguous physical disk blocks stored on a typical disk drive in accordance with presently known recording techniques. As above in FIG. 15, each disk block may include a preamble 1700, a sync field 1702, uncompressed data field 1704, and a corresponding error correction code field 1706. In like manner, a next contiguous disk block may include its own preamble 1710, sync field 1712, uncompressed data 1714, and error correcting code 1716.

In accordance with features and aspects hereof, a disk block may vary in size such that formerly contiguous independent disk blocks may be compressed into a smaller compressed data field 1802 as shown in FIG. 18. A preamble field 1700 and a sync field 1702 may function as described above in FIG. 17. A compression attribute field 1800 may describe parameters and attributes of the compression used for compressing the user data into compressed data field 1802. ECC field 1804 then provides error correction bits for the compressed, combined data from the formerly uncompressed data are represented by uncompressed data field 1704 and uncompressed data field 1714 described above with respect to FIG. 17. Thus, a compressed frame as shown in FIG. 18 may dramatically improve the physical capacity of a disk drive despite the addition of a compression header field 1800 to the standard disk frame format.

Unwind

Other features and aspects hereof represent other benefits derived from the flexible mapping features and aspects hereof and the independence of the logical and physical block sizes.

As noted above, the master addressing table structures (or similar mapping structures) may be saved in multiple reserved locations of the disk drive. Where the multiple copies are maintained as chronological snapshots of the mapping structures, the contents of the disk drive may be restored or "unwound" to an earlier state reflected by the saved, earlier master addressing tables. Traversing forward through the linked list of data frames since the data frame last written as saved in a restored master addressing table, the "unwinding" may be processed through to any specific write operation.

Duplicating the master addressing table as stored on the disk drive storage media provides the unwinding feature as above as well as generally enhancing the reliability of the disk drive. Failure to read one copy of the master addressing table does not necessarily prevent use of the disk drive. Other (perhaps earlier) copies of the master addressing tables may be usable to initialize the disk drive.

Increased Track Density

Another benefit enabled by mapping features and aspects hereof provides increased radial track density in storing data on the disk drive storage media surface. When writing data on a magnetic disk drive storage media, the magnitude, shape, and direction of the magnetic field applied to the disk surface are critical factors in the quality of the recorded signal to be read. It is a well known problem in the disk drive arts that a larger magnetic field may improve the recorded signal quality but also reduces storage capacity in that larger gaps may be required between each track. The gap between tracks is needed to prevent writing of one track from unintentionally erasing (overwriting) data on an adjacent track. Though there are slight differences in the nature of the problem, this issue arises in both longitudinal recording and vertical (perpendicular) recording techniques well known in the arts.

Mapping features and aspects hereof permit logical blocks to be written in any desired physical order on the disk drive surface. In particular, features and aspects hereof suggest that data may be recorded on physical disk blocks generally in a sequential order (i.e., from inner diameter tracks/cylinders to outer diameter or vice versa). By generally advancing the read/write head in one direction (i.e., from inner diameter to outer diameter or vice versa), data that sequentially preceded this write may be saved while data on tracks/cylinders that will sequentially follow the current writing operation may be overwritten with impunity.

Figure 20:
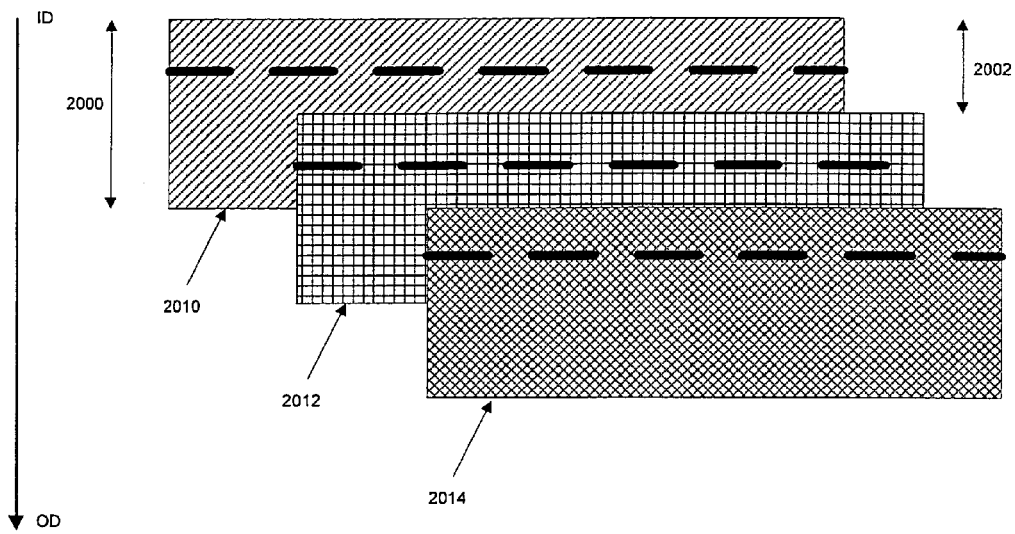
FIG. 20 is a schematic diagram of recorded, densely packed, adjacent tracks written in accordance with mapping features and aspects hereof.

FIG. 20 is a block diagram that schematically represents consecutive written tracks using such a read/write head configuration that, in conjunction with mapping features and aspects hereof, permits improved track density. Tracks 2010, 2012, and 2014 have a nominal track pitch 2002 that is less than the write head width 2000. Each track 2010, 2012, and 2014 has a track centerline indicated by a corresponding thicker dashed line. In accordance with mapping features and aspects hereof, tracks 2010, 2012, and 2014 are written in sequential order from the inner diameter of the disk surface (ID) to the out diameter (OD). Prior techniques devoid of the mapping features and aspects hereof could not assure such sequential writing of tracks except in particular, application specific circumstances (such as data logging or video data capture where an entire disk drive capacity may be filled by the capture of sequential data). By contrast, mapping features and aspects hereof assure the ability to sequentially order track writes as indicated in FIG. 20.

Assuring such a sequential order of adjacent track writes allows the tracks to be more closely spaced because unwritten tracks ahead of the current track position will not contain data that must be retained. Thus, mapping features and aspects hereof obviate the need for gaps between adjacent tracks and thereby allow a higher tack density to be recorded on the disk drive. For example, track 2010 may be written first. Later, as more logical block writes are requested by host devices, track 2012 may be written—the next/adjacent track in the direction from ID to OD. Track 2012 is written such that its inner-most edge overlaps the outermost portion of the earlier written track 2010. However, the overlap is designed such that the data of earlier track 2010 is still accurately readable. Similarly, next sequential track 2014 overlaps the outer portions of earlier track 2012, and so on.

Though features and aspects hereof permit such generally sequential writing of tracks, it may be necessary at times to re-write earlier recorded tracks. For example, mechanical shock or vibration may cause a temporary "off track" condition where the read/write head is temporarily moved off the intended track position. In such an off-track condition, continued writing may overwrite previously written data from sequentially earlier track writes. Well known servo and other control logic in disk drives reduces the amount of such overwritten data but none-the-less, some overwritten data may need to be recovered. Prior techniques generally provided wide enough inter-track gaps to avoid the need for such data recovery. However, with the narrower gaps (i.e., no gaps) between tracks, some mechanism must be provided to permit possible re-writing of earlier sequential written tracks.

Mapping features and aspects hereof also provide that the most recently written blocks written in preceding, sequentially earlier tracks will remain in the disk controller's cache memory. Earlier tracks that may require re-writing may therefore be re-written from the data remaining in cache memory. However, the size of cache memory is not limitless. Further, wherever a first track is to be re-written, care must be taken to not overwrite still earlier data in still earlier adjacent tracks (track data that may no longer reside in cache memory).

Figure 21:
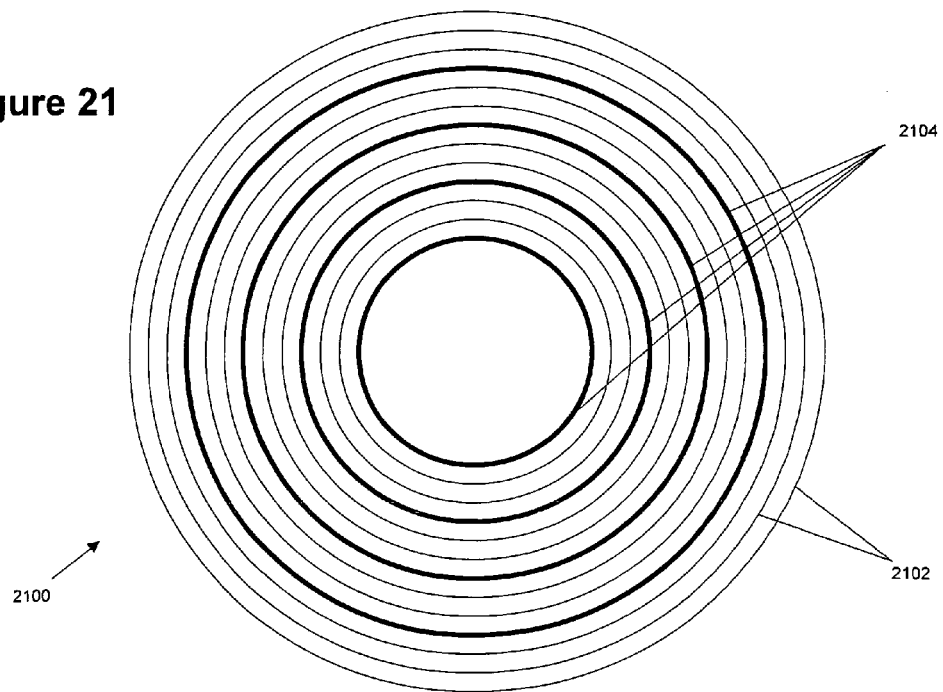
FIG. 21 is a schematic diagram of a disk recording surface having a plurality of densely packed tracks grouped between guard bands to permit recovery of earlier recorded tracks in accordance with mapping features and aspects hereof.

In accordance with features and aspects hereof, the tightly packed tracks of each disk surface may have period guard bands intermingled—i.e., periodic inter-track gaps between groupings of tracks. FIG. 21 is a schematic diagram showing a disk surface 2100 with a plurality of tracks 2102 for recording of data. Periodically interspersed between groupings of tracks are inter-track gaps 2104 (guard bands) to provide spacing between adjacent groups of tracks. The number of tracks in each such group may be determined as a matter of design choice based, in part, on the size of the write cache memory in the disk controller.

Dynamic Multiple Indirections

It remains an ongoing problem in all storage devices to improve reliability and performance of the storage device. A particular problem with reliability of storage devices occurs when problems appear in a subsection of the storage device affecting the reliability of the data stored in the subsection. Since data is typically stored in only a single subsection of the storage device, if the subsection incurs problems, then the data may be permanently lost.

Since all user data written to the dynamically mapped storage device is dynamically mapped from the user supplied logical address space (logical block addresses or LBAs) to the physical disk block address space (disk block addresses or DBAs—blocks of variable size relative to the LBA size), features and aspects hereof permit generation of multiple indirection table entries for any user data written to the storage device recordable media. In general the indirection table entries may include multiple entries for a given LBA—each corresponding to a different copy of the data mapped from the same LBA space address to a different physical address. Providing multiple copies (multiple indirections) for user supplied data in the storage device improves reliability of the storage device by reducing the probability of loss of user data for various failure modes of the storage device. For example, if a particular physical area of the recordable media begins to exhibit errors (hard errors or soft recoverable errors), another copy of the same user data (another of the multiple indirections stored on the storage device) may be accessed to permit recovery thereof and to permit continued operation of the storage device.

For example, each logical block could be duplicated in two (or more) corresponding physical disk blocks of the disk drive. Each copy has a mapping table entry mapping the same LBA for the logical block to different physical address space locations. A first copy of the data for a logical block could be on a first disk media surface (using a corresponding first read/write channel/head) and a second copy may be stored on a separate surface (using its corresponding read/write channel/head). Or, for example, a first copy of a logical block may be stored on an inner radial half of the selected surface of the disk drive and a second copy of the same logical block may be stored on an outer radial half of the same surface of the disk drive.

In addition to enhancing reliability, duplicate copies of the host supplied stored data may enhance performance of the dynamically mapped storage device. Where multiple copies of host supplied data are stored, the copy which is most quickly accessible given the current operating state of the storage device may be accessed to reduce latency delays and hence improve throughput of the storage device. For example, if a first copy of the data is stored at a rotational position of a particular track (on rotating recordable media in the storage device), and a second duplicated copy happens to be stored at a different rotational position of the same track, which ever copy will next be encountered by the read/write head as the media continues to rotate may be accessed. Thus rotational latencies may be reduced. Or, for example, where multiple copies of data are stored at different radial track positions, whichever of the multiple tracks may be most rapidly accessed may be used to return requested data to a host system.

Still further, in addition to simple duplication of data blocks, other forms of redundancy information may be generated by the disk drive and stored on the disk drive in a manner transparent to the attached host system(s). Such redundancy may entail any form of enhanced error detection and correction including, for example, RAID-like XOR parity or other redundancy information. All such redundancy information may be generated, stored and checked by local processing features of the disk drive controller. By virtue of the mapping features and aspects hereof, this additional redundancy information may be hidden from the attached host systems.

When user data is received, the currently used physical capacity of the storage device may be inspected to determine if there is sufficient space to replicate the user supplied data when written. If so, performance information regarding operation of the storage device may be reviewed by the storage device controller to determine the number of redundant copies that may be beneficial and to determine preferred physical areas in which the replicated data may be recorded (e.g., different surface/head, different radial position, different rotational position, or combinations of the three).

So long as the ratio of stored logical content to total physical capacity remains lower than about 0.5, all logical blocks of user data may be mapped to at least two different physical locations. As the ratio moves toward 0.5 and higher, features and aspects hereof may selectively determine which user data blocks need be duplicated. For example, features and aspects hereof may select blocks deemed to be critical such as file directory and FAT table structures stored as user data on the storage device. Or, for example, data that is observed to be frequently accessed may be selected for duplication as critical data based on its frequency of access. Other less critical data may be mapped to only a single physical location (i.e., not replicated). Numerous other heuristic rules will be readily apparent to those of ordinary skill in the art to identify critical data that may be selected by the storage device for replication in accordance with features and aspects hereof. In like manner, as the ratio of logical content to physical capacity moves higher, duplicate copies of less critical user data previously replicated on the storage device may be eliminated.

To add duplicate copies requires merely updating the mapping tables used to map user supplied logical block addresses to physical disk block addresses (plus the access time to actually write the additional, duplicated data). To remove a duplicate copy, the mapping tables may be simply updated to remove the mapping table entry between the LBA space and the corresponding additional physical space of the duplicate copy to be removed. The physical space so recovered from the duplicated copies may then be used for replicating other host supplied data, or, if need be, to recover space to permit further writing of host data without duplication.

Various performance metrics of the operation of the storage device may be used to determine the need for such duplication of user data. For example, read/write head operating temperature, bit error rates from reading of data, shock and vibration event statistics, etc. may all be used to aid in determining the current level of reliability of the operating storage device and hence the need for more or less user data duplication. For example, if a particular read/write head of the storage device begins exhibiting higher error rates suggesting a possible failure of that head assembly, user data that may be currently mapped to the physical space of the affected area may also be replicated to another physical area by addition of an appropriate mapping table entry and duplication of the data to the other physical area.

Logical data blocks replicated in multiple physical locations may be replicated at different radial positions on the storage device and/or at different rotational offsets at the same radial position of the disk drive. For example, by locating a duplicate mapped version of a host supplied logical block at the same radial position but rotationally displaced from the first copy of the block, rotational latencies may be reduced when accessing that mapped logical block. When access to data is requested and multiple copies are logically mapped to the disk, the disk drive may elect to use whichever copy of the replicated user data is rotationally closer to the current rotational position of the read/write head relative to the rotating media to thus reduce rotational latency in completing the request. In like manner, duplicated copies of mapped user data may be placed at a different radial position. Where data access patterns (as analyzed by the disk drive controller) tend to be highly randomized, the nearest radial position of such multiple copies of the requested data may be accessed. Thus, seek latencies may be reduced in a randomized data access application. Still further, multiple copies of user data may be distributed over multiple heads or surfaces of the disk drive with or without rotational displacements. Thus a copy of the requested data may reside on a presently utilized head to reduce the need for head switch delays. Still further, those of ordinary skill in the art will readily recognize that the above strategies for distributing copies of duplicated host supplied data may be combined. For example, copies of host supplied data may be distributed at different rotational positions on the same track (i.e., same radial position of the same head) and other copies may be distributed at different radial positions and/or on different read/write heads.

Figure 22:
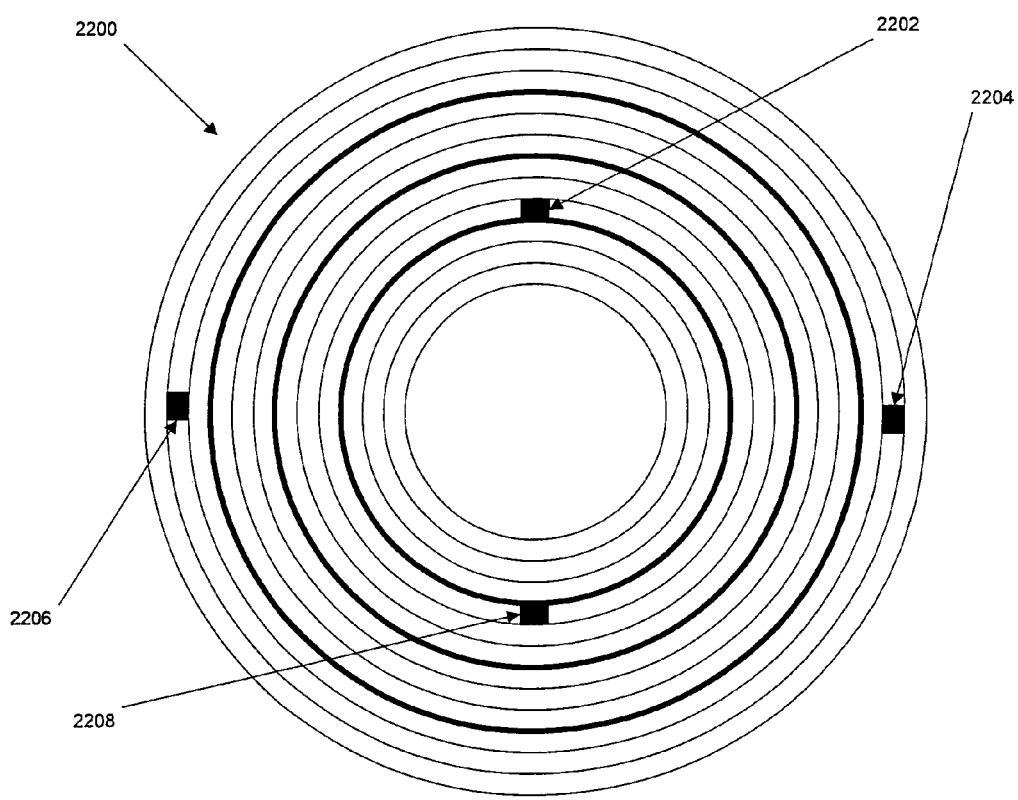
FIG. 22 is a schematic diagram of a disk recording surface having a plurality of tracks with multiple indirections (multiple copies) of a host supplied logical block mapped to multiple physical locations in accordance with mapping features and aspects hereof.

FIG. 22 is a schematic representation of a single surface of a rotating disk recordable media. The recordable media surface 2200 comprises a plurality of concentric tracks logically laid out from an inner diameter through an outer diameter. In accordance with the multiple indirection features and aspects hereof, multiple copies of host supplied data may be recorded in various physical locations of surface 2200. As noted above, such multiple copies may be distributed in differing physical locations so as to improve performance and/or reliability of the dynamically mapped storage device. For example, a first copy 2202 and second copy 2208 of host supplied data may be mapped to different rotational positions within the same radial track position. Further copies of the host supplied data 2204 and 2206 may be located at another radial track position. Such diverse locations may improve performance of the dynamically mapped storage device in that whichever of the multiple copies (2202 through 2208) is nearest the present location of the read/write head (not shown) may be utilized to access requested data. For example, if the read/write head is presently positioned on the track containing copies 2202 and 2208, whichever copy will be next encountered by the read/write head as recordable media surface 2200 continues to rotate may be utilized to access the requested data. Alternatively, where the dynamically mapped storage device is utilized for highly randomized access, whichever radial track position containing a copy of the requested data is closer to the current read/write head position may be utilized to access requested data. Thus, the radial track position containing copies 2202 and 2208 may be utilized or the radial track position containing copies 2204 and 2206 may be utilized—whichever track position is closer to the current position of the read/write head. Thus seek time and associated head settling time may be reduced if the radial track position is closer to the current track position of the read/write head.

In addition, such multiple copies may be located on the rotating recordable media 2200 so as to improve reliability by reducing the probability of encountering an error in accessing requested data. For example, where current operating parameters of the dynamically mapped storage device indicate a possible failure arising near the radial track position containing copies 2202 and 2208, the alternate copies on the radial track position containing copies 2204 and 2206 may be accessed to reduce the probability of an error when reading the requested data. Over time, as a possible error condition in fact arises on the inner radial track position, copies 2202 and 2208 may be relocated to other physical locations to continue operation of the dynamically mapped storage device with enhanced reliability and/or performance.

As shown in FIG. 22, where copies are positioned at different rotational positions of the same radial track position, it may be advantageous to position each of two copies at 180° offsets in the direction of rotation—e.g., equidistant around the circumference of the radial track position. Similarly, where more than two copies of host supplied data are recorded on the same radial track position they may be similarly positioned equidistant from one another around the circumference of the selected radial track position. Thus, performance of the dynamically mapped storage device is enhanced by assuring some copy of the host supplied data will be close to the current rotational position of the read/write head over the rotating recordable media surface 2200. Also as shown in FIG. 22, where multiple copies of host supplied data are physically located at different radial track positions, a first copy may be located on inner radial track positions while a second copy may be located at outer radial track positions. Thus, multiple copies are physically separated to avoid potential errors arising from damage to the recordable media rotating surface 2200 at a particular radial position.

Not shown in FIG. 22 but readily apparent to those of ordinary skilled in the art is a structure wherein multiple copies may be physically positioned on different surfaces of a multi-surface dynamically mapped storage device. Thus, the multiple copies may be used to enhance reliability of the storage device in that damage to one recordable media surface or its corresponding read/write head need not preclude ongoing operation of the dynamically mapped storage device since another copy may be available on a different rotating recordable media surface with its corresponding different read/write head assembly. Further, those of ordinary skill in the art will readily recognize that any combination of these various physical locations may be combined to provide both enhanced performance and reliability. In other words, additional copies of host supplied data may be positioned at different rotational positions of a single track, at different radial track positions of the same recordable surface, and/or on different recordable surfaces of the storage device. Any combination of these various positioning options may be employed to enhance both performance and reliability of the dynamically mapped storage system.

Figure 23:
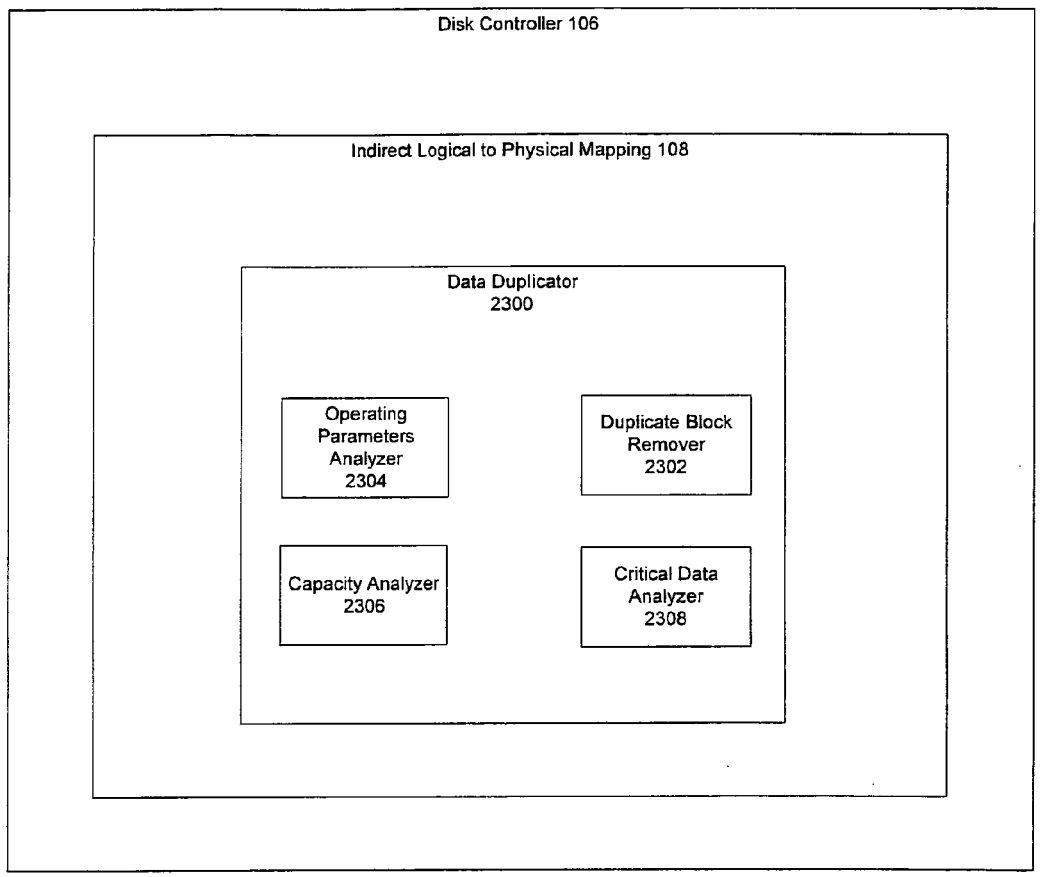
FIG. 23 is a block diagram providing additional exemplary details of a disk controller as in FIG. 1 enhanced to provide management of multiple copies of a host supplied logical block mapped to and stored in multiple physical locations of the dynamically mapped storage device in accordance with features and aspects hereof.

FIG. 23 is a block diagram depicting exemplary functional elements within disk controller 106 useful in providing multiple indirections (multiple copies) in accordance with features and aspects hereof. As noted above, disk controller 106 may include indirect logical to physical mapping element 108 generally responsible for the dynamically mapped features of the storage device. An aspect of the logical to physical mapping element 108 as noted above may include a data duplicator element 2300 operable to provide a mapping of multiple copies of host supplied data (e.g., multiple indirections in the logical to physical mapping structures for any particular host supplied logical block of data). Data duplicator element 2300 may include various elements to analyze operation of the dynamically mapped storage device to determine how many copies to generate for host supplied data and where to position such multiple copies in the physical address space of the dynamically mapped storage device.

Operating parameters analyzer 2304 may be operable to analyze various operating parameters of the dynamically mapped storage device to detect potential reliability issues in the operation of the dynamically mapped storage device. Exemplary of such operating parameters are the operating temperature of the storage device (e.g., temperature of the read/write head assembly), the current bit error rate for read operations performed on the storage device, shock and vibration event rates for the storage device, etc. These and other operating parameters are easily detected by operation of disk controller 106 as well known to those of ordinary skill in the art. The monitored operating parameters may be analyzed by operating parameters analyzer 2304 to detect the possible onset of reliability problems in the dynamically mapped storage device. Data duplicator element 2300 cooperates with operating parameters analyzer 2304 to determine when the number of duplicate copies of host supplied data should be increased due to detection or onset of possible reliability problems or may be decreased if the storage device is operating well within normal operating parameter ranges. Normal ranges are unique to each particular application of features and aspects hereof and would be readily understood by those of ordinary skill in the art.

In addition, data duplicator element 2300 may include capacity analyzer element 2306 for analyzing the current capacity ratio. The "current capacity ratio", as used herein, is defined generally as the total size of all host supplied logical data blocks presently stored on the storage device divided by the total size of the physical space of the storage device. As the current capacity ratio increases, less space may be available for storing duplicate copies of host supplied the logical blocks of data. For example, if current operating conditions of the dynamically mapped storage device suggest that two copies of each logical block may be stored on the mapped logical drive, as the current capacity ratio approaches 0.5, there may be insufficient space to continue storing such a duplicate copy of each logical block. In other words, a host system has stored logical blocks totaling about half the specified capacity of the storage device. But, since each block is duplicated, the total capacity of the storage device may be filled. However, while the current capacity ratio is well below 0.5, processing on the logical mapped storage device may continue to duplicate each logical block in the physical storage space of the storage device. Thus, capacity analyzer 2306 continually monitors the current capacity ratio to determine when fewer (or no) duplicate copies may be stored on the storage device.

Critical data analyzer 2308 within data duplicator 2300 is operable to analyze host supplied logical blocks of data to identify those that may likely contain data to be considered "critical" in this particular application. For example, inode or FAT file system structures may be deemed critical in the information stored on a storage device in that they define the entire file structure of a file system stored on the storage device. Thus, such data structures may be considered "critical". Critical data analyzer 2308 may apply heuristic rules to make such determinations of criticality by observing the logical block usage of the host system and/or by observing the host supplied data for certain signature characteristics. Or, for example, certain data in particular applications may be designated by the host systems as sensitive and hence critical. Critical data, however it is detected or designated, may receive preferential treatment in disk controller 106 such that critical data will be duplicated more frequently than non-critical data. Thus, critical data analyzer 2308 is generally operable to help identify such critical data to assure that any duplication of data emphasizes duplication of critical data over non-critical data. Where the host system defines the critical nature of particular data, critical data analyzer 2308 may interact with a host system driver to receive special directives indicating logical block ranges that may be deemed critical. Or, for example, a write request received from a host system may simply include parameters indicating that the data to be written is deemed critical by the host application.

Duplicate block remover element 2302 within data duplicator 2300 is generally operable to identify duplicate copies of logical blocks that may be removed responsive to a need identified in the storage device to reduce the number of duplicate blocks. For example, as current capacity analyzer 2306 detects the current capacity ratio approaching or exceeding 0.5, it may direct duplicate block remover 2302 to identify duplicate blocks that may be removed to make room for more host supplied data. Duplicate block remover element 2302 may, for example, identify duplicate blocks for non-critical data that may be removed to increase the amount of physical space available on the storage device and hence reduce the current capacity ratio. Or, for example, duplicate block remover element 2302 may identify additional duplicate blocks above and beyond a single duplication (e.g., more than 2 copies of a host supplied block). Additional copies may be removed to increase physical capacity of the storage device relative to the logically stored content (e.g., to increase the current capacity ratio).

Those of ordinary skill in the art will readily recognize that the various functional elements 2300 through 2308 shown as operable within the indirect logical to physical mapping element 108 of controller 106 may be combined into fewer discrete elements or may be broken up into a larger number of discrete functional elements as a matter of design choice. Thus, the particular functional decomposition suggested by FIG. 23 is intended merely as exemplary of one possible functional decomposition of elements within controller 106.

Figure 24:
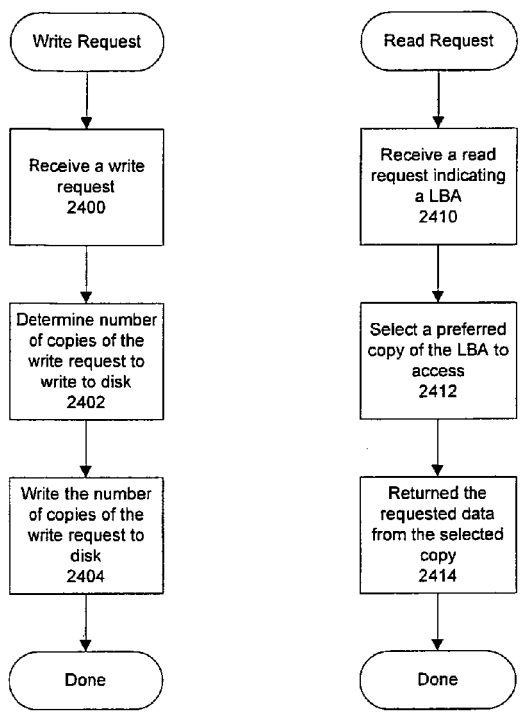
FIG. 24 shows flowcharts of two exemplary cooperating methods operable to manage multiple physical copies of host supplied logical data for writing and reading of same on a mapped storage device in accordance with features and aspects hereof.

FIG. 24 describes related methods in accordance with features and aspects hereof to create and write multiple copies (multiple indirections) of host supplied logical blocks of data and to select one of the multiple copies for return of requested data to a host system. In general, elements 2400 through 2404 represent processing of the dynamically mapped storage device responsive to receipt of a write request from an attached host system. As noted above, the host system supplies one or more logical blocks of data with a write request. Logical to physical mapping features and aspects hereof then map the supplied logical blocks to physical storage space of the mapped storage system. In addition, the mapping features generate multiple copies in accordance with current operating parameters and other aspects of the storage device. Each of the multiple copies is mapped to physical locations using the same host supplied logical block address.

Those of ordinary skill in the art will recognize the integration of features of FIG. 24 with the general read and write processing of FIG. 11 above. In general, elements 2400 through 2404 are operable to write one or more copies of a supplied logical block to corresponding one or more physical locations. Processing of FIG. 11 shows the details involved in writing each of the multiple copies.

In particular, element 2400 is first operable to receive a write request from the attached host system providing one or more logical blocks of data to be stored on the dynamically mapped storage device. Transparent to the host system, element 2402 within the dynamically mapped storage device may then determine a number of copies of the supplied logical data blocks to be written in the physical storage space of the dynamically mapped storage device. At least one copy will be mapped to corresponding physical blocks and stored in the storage device. Zero or more additional copies of the supplied data may then be written to corresponding physical locations and mapped to the same supplied logical block address. As noted above and as discussed further herein below, numerous factors may be involved in the decision as to how many copies of the supplied logical blocks should be recorded in the physical storage space of storage device. Element 2404 is then operable to write a first copy of the supplied data and zero or more additional copies of the received logical blocks in corresponding physical locations of the dynamically mapped storage device. Each copy written is also mapped by an entry in the mapping tables pointing the supplied logical block address to the various physical copies stored in the storage device media. As noted above and as discussed further herein below, other processing may determine optimal physical locations for each of the multiple copies to improve reliability of the dynamically mapped storage device and/or performance of the dynamically mapped storage device. Also as noted above, details of the processing involved in writing each of the one or more copies of the host supplied logical data blocks is provided above in the description of FIG. 11. In particular, multiple adjacent physical blocks written to a cache memory are coalesced into a larger frame structure eventually posted to the recordable media of the storage device.

Elements 2410 through 2414 generally represent processing within the controller of the dynamically mapped storage device responsive to receipt of a read request from an attached host system. In general, an attached host system requests return of identified blocks of data identified by the logical block addresses previously supplied in a host system write request. As noted above, logical to physical mapping features and aspects hereof then determine where each of potentially multiple copies of the supplied data has been recorded on the physical storage space of the dynamically mapped storage device. Similar mapping processes are then used to determine the physical location of one or more of the various mapped copies of the identified logical blocks. More specifically, element 2410 is first operable to receive a read request from an attached host system indicating one or more logical block addresses to be retrieved and returned to the requesting host. Element 2412 is then operable to select one of the one or more mapped copies of the identified logical blocks. As noted above, in performing the corresponding write request, one or more duplicate copies of the supplied logical blocks of data have been recorded in the dynamically mapped storage device at different physical locations but all mapped to the same logical block address. Element 2412 is therefore operable to select a preferred one of the one or more duplicate copies of the identified data. As noted above and as discussed further herein below, certain copies may be preferred based upon enhanced reliability of the storage device and/or based upon enhanced improvement enhanced performance of the storage device. Having so selected one of the one or more mapped copies, element 2414 is then operable to return the requested data from the selected copy stored in the physical storage space of the dynamically mapped storage device.

As above with respect to elements 2400 through 2404, details of the processing involved in reading particular identified logical blocks from their corresponding physical locations are provided above with respect to FIG. 11. Thus a selected copy of the identified information is read as one or more physical frames and any extraneous leading or trailing data is trimmed and discarded.

Further details of the processing to write and read multiple copies of host supplied data are presented further herein below with reference to additional figures. The processing of the methods of FIG. 24 are therefore intended as suggestive of the broad enhancements in accordance with features and aspects hereof to provide multiple copies of host supplied data using the logical to physical mapping features and aspects hereof.

Figure 25:
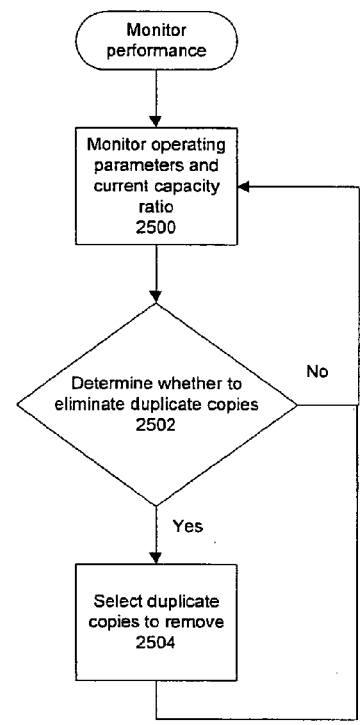
FIG. 25 is a flowchart of an exemplary method to monitor aspects of the dynamically mapped storage device to determine if previously written duplicate copies of host supplied logical blocks need be removed from the storage device in accordance with features and aspects hereof.

FIG. 25 is a flowchart describing a method in accordance with features and aspects hereof to monitor operational parameters and the current capacity ratio of the storage device to determine when previously recorded copies of logical host supplied logical data may be removed. As noted above, various operational parameters of the storage device may indicate that various failure modes may be more or less likely to occur soon. For example, as the operating temperature of the storage device (e.g., the temperature of the read/write head assembly per se) increases beyond certain identified thresholds, various failures in the recording and/or reading of data may start to occur. Or, for example, as the bit error rate in read operations increases failures may be more prevalent. Or, for example, as the shock and vibration detected events increase failure may be imminent. Element 2500 is therefore operable to monitor these and other operating parameters as well as the current capacity ratio to help determine when duplicate copies of stored host supplied data may be removed. For example, when the operational parameters indicate that the storage device is operating within normal operating parameter ranges such that failures are less likely, additional duplicate copies of data may be removed. Conversely, where operational parameters indicate the possibility of imminent failure, additional copies of host supplied data may be recorded to help preclude loss of data should such a failure occur. As the operating parameters come back within the normal range, the additional duplicate copies could be removed thereby improving the current capacity ratio. In addition, regardless of the current operating parameters, as the current capacity ratio reaches or exceeds 0.5, it may be beneficial to remove additional duplicates of information to allow the full physical capacity of the storage device to be utilized.

Responsive to the monitored information from element 2500, element 2502 is next operable to determine whether the monitored information indicates that additional duplicate copies of previously stored data should be removed. If not, processing continues looping back to element 2500 to continue monitoring operating parameters and current capacity ratio. If previously stored copies may or must be removed, element 2504 is next operable to select particular duplicate copies of previously recorded data for removal and to remove such data by simply eliminating the duplicated mapping information in the mapping tables of the storage system storage device. As noted above, when each duplicate copy is written to corresponding physical space of the storage device, a mapping table entry reflects the duplicate mapping of the supplied logical block address to the additional duplicate physical storage space. Thus, removal of a previously stored duplicate of host supplied data may entail simply removing the duplicate mapping table entries thus freeing the corresponding physical storage space for other use in the storage device. Processing then continues looking back to element 2500 to continuously monitor the operating parameters and current capacity ratio. Thus, the method of FIG. 25 may be operable as a background processing task within the controller of the storage device.

Figure 26:
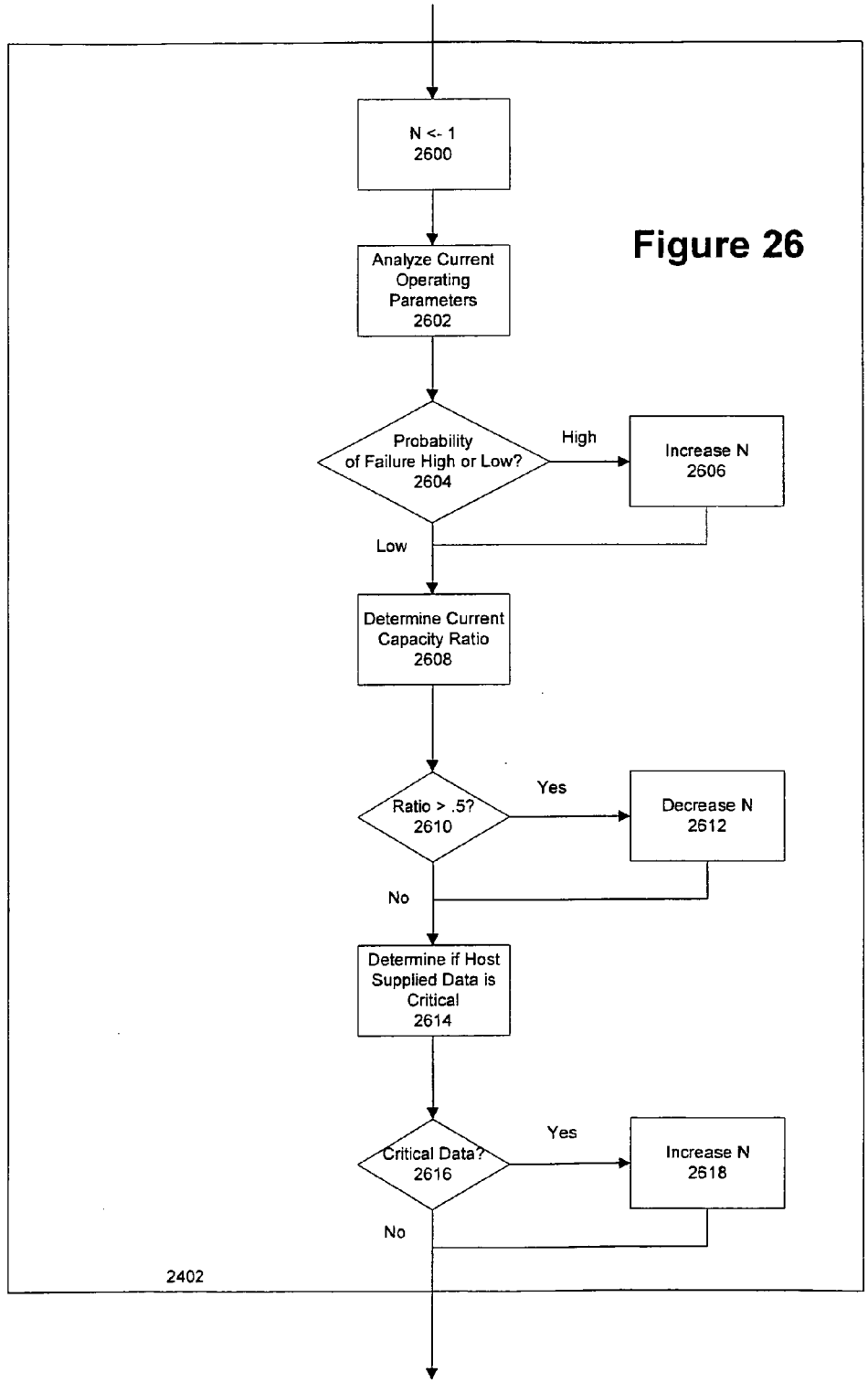

FIG. 26 is a flowchart providing additional exemplary details of element 2402 discussed above with respect to FIG. 24. As noted above, element 2402 of FIG. 24 is operable to determine a number of additional copies of host supplied data to be written to the physical storage space of the dynamically mapped storage device. Element 2600 is first operable to initialize a copy count "N" to a value of 1 (i.e., presuming no additional copies of data are to be written). Element 2602 is then operable to analyze current operating parameters including, as noted above, operating temperature, bit error rate, shock and vibration event frequency, etc. Element 2604 is then operable to determine from the analysis of element 2602 whether the probability of failure of the storage device is higher or lower. If element 2604 determines that the probability of failure is relatively high, element 2606 is next operable to increase the value of N to indicate that more copies of the supplied data would be desirable. N may be increased incrementally or by any values but typically not beyond some predetermined maximum value. Element 2608 is then operable to determine the current capacity ratio. As noted above, the current capacity ratio may be determined as the total size of all host supplied logical blocks divided by the total physical space of the mass storage device. Element 2610 then determines whether the current capacity ratio is nearing or exceeds about 0.5. If so, element 2612 is operable to decrease N so that fewer duplicate copies will be recorded and hence slow the increase of the current capacity ratio. N may be decreased incrementally or by any amount but typically not below a minimum of 1 (e.g., at least one copy must be written responsive to a host system write request). Element 2614 is then operable to determine if the host supplied data to be written is considered "critical". As noted above, data may be designated as "critical" by interaction with the host system through parameters of the write request or other control sequences unique to the particular host system. Or, for example, logical blocks may be determined to be "critical" by application of heuristic rules within the dynamically mapped storage device. For example, the dynamically mapped storage device may heuristically identify a particular range of logical block addresses typically used for the FAT or inode file system data structures. Or, for example, the storage device may recognize particular sequences of data as typical of such structures or otherwise detect data to be deemed critical in this application. However the criticality of the host supplied data is determined, element 2616 is operable to determine whether the current data has been so identified as critical. If so, element 2618 is operable to increase N so that additional duplicates of the data to be written should be recorded on the physical storage space of the dynamically mapped storage device.

FIG. 27 is a flowchart providing exemplary additional details of the operation of element 2404 as described above in FIG. 24. Element 2404 as noted above is generally operable to write one or more copies (N copies as determined above) of the host supplied data at corresponding physical locations of the dynamically mapped storage device. As noted above, each copy of the host supplied data is associated with a corresponding mapping table entry mapping the same logical block address to each of the one or more copies in the physical address space of the storage device. Specifically, element 2700 of FIG. 27 is first operable to determine how to best distribute the one or more copies of the host supplied data over corresponding multiple rotational positions of a particular track, and/or over multiple radial track positions, and/or over multiple read/write heads (e.g., multiple recording surfaces of the storage device). As noted above, the distribution of such multiple copies may be determined in a manner to enhance reliability of the dynamically mapped storage device and/or performance of the dynamically mapped storage device. For example, distributing duplicate copies at multiple radial tracks locations dispersed between inner diameter radial positions and outer diameter radial positions may aid in either performance enhancement or reliability enhancement. Similarly, recording multiple copies at different rotational positions of the same track may also enhance either reliability or performance. Still further, recording multiple copies on different read/write heads (e.g., on different recording surfaces of the storage device) may enhance either reliability or performance. Reliability may be enhanced by selecting multiple locations that may help avoid physical damage to a particular area of the recordable media of storage device and/or may avoid failure of a particular read/write head. Selecting the multiple locations for recording multiple copies may enhance performance by distributing the multiple copies such that when the logical blocks are to be read back to a requesting host system, the most rapidly accessible copy may be returned to the requesting host system. For example, if the read/write head is already positioned at the proper radial track, the next copy to be encountered in the rotation of the storage media may be returned to the host system. Or, for example, where the read/write head is not presently positioned at an appropriate radial track position, the most rapidly accessible radial track position having a copy of the requested data may be used for return of the requested logical blocks.

Having so identified one or more possible distributed locations in the physical address space of the dynamically mapped storage device, element 2702 is next operable to determine whether the current operating parameters indicate a possible failure associated with one or more of the identified, distributed physical locations. If current operating parameters of the dynamically mapped storage device indicate that one or more of the identified, distributed physical locations may be associated with a likely imminent failure of the storage device, element 2704 is operable to relocate the selected mapping of one or more of the various duplicate copies to reduce the probability of data loss from an imminent failure. Lastly, element 2706 is next operable to write the host supplied logical blocks and any desired multiple copies thereof to the corresponding mapped physical space of the dynamically mapped storage device. As noted above, writing the data to the physical storage space also includes generating appropriate mapping table entries to associate the host supplied logical block addresses with each of the multiple copies stored in the physical space of the storage device.

FIG. 28 is a flowchart providing additional exemplary additional details of the operation of element 2412 of FIG. 24. As noted above, element 2412 of FIG. 24 is generally operable to select one of the one or more copies of an identified logical block address previously stored in the storage device for return to the requesting host system (e.g., in response to a read request from the host system). Element 2800 of FIG. 28 is first operable to select one of the one or more duplicates of the identified logical block addresses. Preferably, the selected copy is that which is determined to be most quickly accessed by the storage device. For example, if the read/write head is presently positioned at the proper radial track position, the copy of the requested data that will be next encountered as the storage media continues to rotate under the read/write head will be selected for return to the requesting host system. Or, for example, if the read/write head is not presently positioned at a radial track position that contains one of the one or more duplicate copies, the closest or most rapidly accessible radial track position that does contain one of the one or more duplicate copies may be next accessed. Next element 2802 determines whether the identified selected copy is one which the current operating parameters indicate may be subject to an imminent failure. If so, element 2804 is operable to select a different copy of the one or more duplicates of the identified logical block addresses, preferably a copy less likely to encounter data loss from a potential imminent failure. Lastly, element 2806 is operable to return the requested data from the selected copy of the one or more duplicate copies of the identified logical blocks.

Those of ordinary skill in the art will readily recognize that the methods of FIGS. 24 through 28 are intended merely as exemplary of possible embodiments of methods in accordance with features and aspects hereof to permitting generation of multiple indirection table entries for any user data written to the recordable media of the dynamically mapped storage device. Numerous equivalent methods and techniques will be readily apparent to those of ordinary skill in the art to implement such features as a matter of design choice.

Dynamic Recording Density Control

It remains an ongoing problem in all storage devices to improve reliability and performance of the storage device. To improve reliability of data stored on the disk drive, it may be desirable to record data at lower densities on the recordable media. However, lower density recordings reduce the capacity of the disk drive. Present day disk drives typically do not permit dynamic recording of data on the recordable media. Thus, all data must be recorded at the same density.

Since all user data written to the dynamically mapped storage device is dynamically mapped from the user supplied logical address space (logical block addresses or LBAs) to the physical disk block address space (disk block addresses or DBAs—blocks of variable, independent size relative to the LBA size), features and aspects hereof permit varying of the recording density for host supplied data written to the storage device recordable media. In general, most disk drive applications rarely use the entire capacity of a storage device. Since the mapping features and aspects hereof permit independence and separation of logical block sizes from the variable physical block sizes, recording densities may be altered while the utilization of the recordable media is lower (e.g., lower than a threshold value). In general, so long as the current capacity utilization as represented by a current capacity ratio (as discussed above) is below a threshold value, new data recorded to the recordable media of the storage device may be recorded at a lower density.

In one aspect, the track density may be decreased (e.g., track pitch may be increased). In addition or in the alternative, the longitudinal or bit density may be varied such that new data recorded to the dynamically mapped storage device may be recorded at a lower bit density. By reducing the storage density (e.g., radial track density and/or longitudinal or bit density), the dynamically mapped storage device may operate at a lower error rate compared to storage devices devoid of the dynamic density control features and aspects hereof. Reduced track density, though decreasing available physical capacity, enhances reliability by reducing potential interference from signals on adjacent tracks. Those of ordinary skill in the art will readily recognize practical limits on the reduction of track density. Typical present day storage devices rely on some degree of overlap of the recorded track signals to permit rapid detection of "off track" conditions. Thus, although features and aspects hereof permit some reduction in track density to enhance reliability of the stored data, beyond some readily determined threshold further reduction may be counterproductive in that off track conditions may be missed. The particular threshold for any specific storage device application will be readily determined by those of ordinary skill and the art in accordance with parameters of the particular storage media, the particular read/write head assembly, the head flying height, and numerous other factors.

In addition, features and aspects hereof provide for dynamic adjustment to the longitudinal or bit density for purposes of improving reliability where unused storage capacity is available in the dynamically mapped storage device. As discussed above in detail, the dynamically mapped storage device may preferably write physical disk blocks aggregated or coalesced into a meta-structure referred to herein as a frame containing one or more physical disk blocks. When written to the recordable media, frames may be recorded using a lower bit density to improve readability of the data (e.g., the read/write head flying height may be increased).

The mapping table entries used to map logical block addresses into one or more physical disk block addresses may include metadata indicating the present recording density for the frame in which the physical data blocks are stored. Thus, features and aspects hereof may inquire of the mapping table entries to determine the present recording density for any identified portion of data recorded on the storage device.

The recordable media of the storage device may be subdivided into zones of varying recording density. In a simple implementation, two types of zones may be defined. One or more normal density zones may be defined wherein track density and bit density are set in accordance with normal specification of the storage device. Zero or more low density zones may be defined wherein track density and/or bit density are reduced to improve reliability in the reading of that data.

The number and types of the zones may be dynamically determined by the controller of the storage device. The number, types, and physical location of defined zones may be determined dynamically as a function of the current capacity ratio and/or any of various operating parameters of the storage device. Numerous conditions may be monitored to determine when reliability of the storage device may be enhanced in accordance with dynamic density control features and aspects hereof. For example, the current physical capacity utilization represented by the current capacity ratio as discussed above may be a first factor in determining whether it is presently feasible to reduce the recording density for newly written data.

When write requests are processed, data may be recorded in a normal density zone or in a low density zone. In particular, data identified as "critical" may be recorded in a low density zone to improve reliability of reading the data. Host interaction or other heuristic rules may be applied to identify host supplied data likely to be critical to operation of the host system. For example, FAT or inode file system data structures may be deemed critical and may often be detected either by recognizing particular ranges of logical block addresses utilized by the host system and/or recognized by detecting certain signature data patterns likely to represent such file system data structures. As above, those of ordinary skill in the art will readily recognize numerous other techniques for recognizing "critical data" including, for example, receiving directives from the host system indicating that identified data is to be deemed critical (e.g., directives in the form of specialized control sequences or in the form of parameters associated with write requests). Data so identified as critical may be written (physical capacity permitting) with lower density so as to aid in reducing the possibility of failure when reading such critical data recorded at a lower recording density.

Still further, as discussed herein below, operational parameters of the storage device and in particular operational parameters of particular read/write head assemblies may be monitored to define reduced density zones associated with a particular read/write head. This may include monitoring a Bit Error Rate (BER) and an Off track read capability (OTRC) to determine if a particular head should be used in a less stressful manner.

Figure 29:
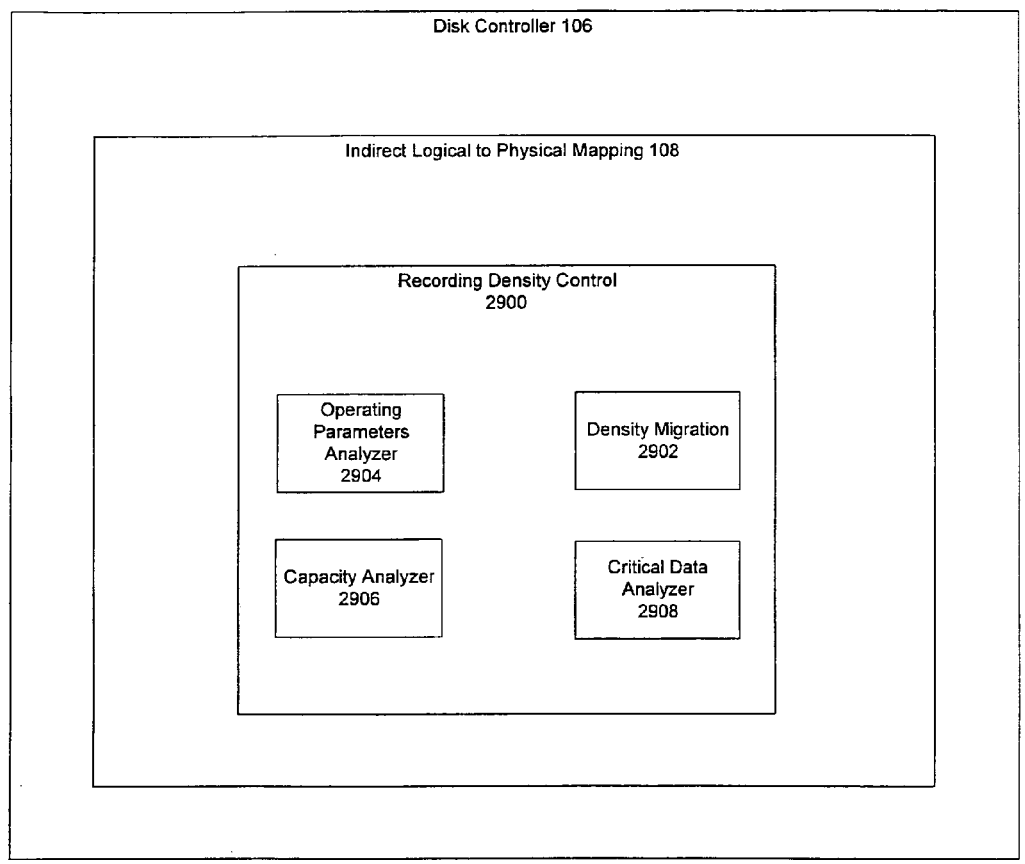
FIG. 29 is a block diagram providing additional exemplary details of a disk controller as in FIG. 1 enhanced to provide management of dynamic recording density in writing of data to a mapped storage device in accordance with features and aspects hereof.

FIG. 29 is a block diagram depicting exemplary functional elements within disk controller 106 useful in providing dynamic recording density control in accordance with features and aspects hereof. As noted above, disk controller 106 may include indirect logical to physical mapping element 108 generally responsible for dynamic mapping features of the storage device. An aspect of the logical to physical mapping element 108 as noted above may include a density control element 2900 operable to provide dynamic control over the density of information written to the recordable media and later read therefrom. Density control element 2900 may include various elements to analyze operation of the dynamically mapped storage device to determine when and how to modify the recording density of information written to and read from the physical address space of the dynamically mapped storage device.

Operating parameters analyzer 2904 may be operable to analyze various operating parameters of the dynamically mapped storage device to detect potential reliability issues in the operation of the dynamically mapped storage device. Exemplary of such operating parameters are the operating temperature of the storage device (e.g., temperature of the read/write head assembly), the current bit error rate for read operations performed on the storage device, shock and vibration event rates for the storage device, as well as operating parameters specific to each read/write head assembly such as read bias and flying height. These and other operating parameters are easily detected by operation of disk controller 106 as well known to those of ordinary skill in the art. The monitored operating parameters may be analyzed by operating parameters analyzer 2904 to detect the possible onset of reliability problems in the dynamically mapped storage device. Density control element 2900 cooperates with operating parameters analyzer 2904 to help define more or fewer reduced density zones on the recording surface as may be suggested by the current operating parameters. The number of reduced density zones may be increased when the operating parameters indicate operation outside a normal range such that failures may be more common. Conversely, the number of reduced density zones may be decreased when the operating parameters are within a normal range. "Normal ranges" are unique to each particular application of features and aspects hereof and would be readily understood and determined for any particular application by those of ordinary skill in the art.

In addition, density control element 2900 may include capacity analyzer element 2906 for analyzing the current capacity ratio (as defined above). As the current capacity ratio increases, less space may be available for recording at lower than nominal or normal recording density. Since the storage device will be specified to store a particular maximum physical capacity, the ability to record data at lower than normal or nominal density may not be available as the physical storage space is temporarily reduced defining more zones as used for reduced density recording. For example, as the current capacity ratio approaches, for example, 0.5, there may be insufficient space to continue storing such lower density recordings of host supplied data.

In other words, a host system has stored logical blocks totaling about half the specified capacity of the storage device. But, since many blocks may be recorded at a lower than normal density, the total capacity of the storage device may be nearly filled. However, while the current capacity ratio is well below 0.5, processing on the logical mapped storage device may continue to record information at reduced density. Thus, capacity analyzer 2906 continually monitors the current capacity ratio to determine when to discontinue storing data at reduced density (as well as when to start migrating information back to normal or nominal density to thereby restore available physical storage space on the storage device).

Critical data analyzer 2908 within data duplicator 2900 is operable to analyze host supplied logical blocks of data to identify those that may likely contain data to be considered "critical" in this particular application. For example, inode or FAT file system structures may be deemed critical in the information stored on a storage device in that they define the entire file structure of a file system stored on the storage device. Critical data analyzer 2908 may apply heuristic rules to make such determinations of criticality by observing the logical block usage of the host system and/or by observing the host supplied data for certain signature characteristics. Or, for example, certain data in particular applications may be designated by the host systems as sensitive and hence critical. Critical data, however it is detected or designated, may receive preferential treatment in disk controller 106 such that critical data will be recorded at a lower density than is used for non-critical data. Thus, critical data analyzer 2908 is generally operable to help identify such critical data to assure that any enhanced reliability from reduced recording density emphasizes reliability of critical data over non-critical data. Where the host system defines the critical nature of particular data, critical data analyzer 2908 may interact with a host system driver to receive a special directive indicating logical block ranges that may be deemed critical. Or, for example, a write request received from a host system may simply include parameters indicating that the data to be written is deemed critical by the host application.

Density migration element 2902 within density control element 2900 is generally operable to identify information recorded in a lower density zone that may be migrated or re-recorded in a normal recording density zone—or vice versa. Migrating previously recorded data to a normal density zone frees more physical space for re-use. For example, as current capacity analyzer 2906 detects the current capacity ratio approaching or exceeding 0.5, it may direct density migration element 2902 to identify low density zones containing data that may be migrated to a normal density zone. Such a migration of previously recorded information from low density zones to normal density zones restores physical space that may be used to store additional data up to the specified capacity of the storage device. Conversely, migrating previously recorded information from normal density zones to low density zones reduces the physical capacity of the storage device below its specified capacity and hence increases the current capacity ratio.

Those of ordinary skill in the art will readily recognize that the various functional elements 2900 through 2908 shown as operable within the indirect logical to physical mapping element 108 of controller 106 may be combined into fewer discrete elements or may be broken up into a larger number of discrete functional elements as a matter of design choice. Thus, the particular functional decomposition suggested by FIG. 29 is intended merely as exemplary of one possible functional decomposition of elements within controller 106.

Figure 30:
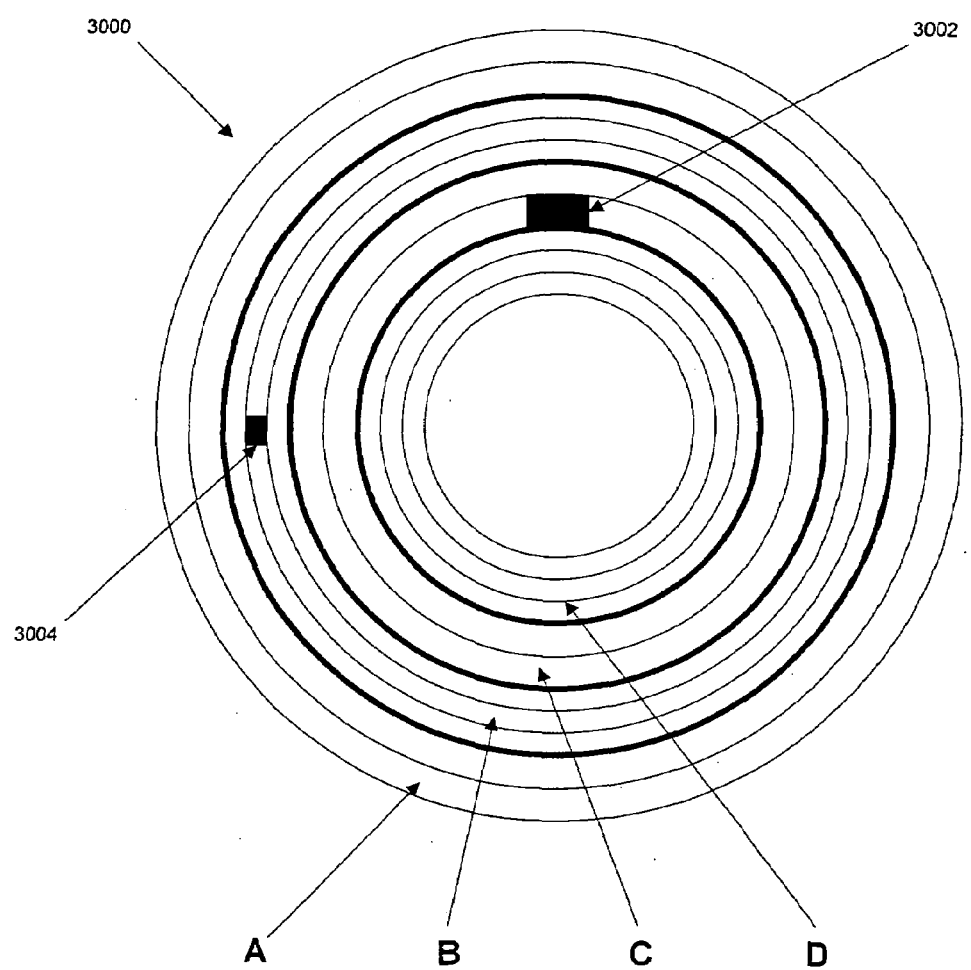
FIG. 30 is a schematic diagram of a disk recording surface having a plurality of tracks grouped in zones of varying density in accordance with mapping features and aspects hereof.

FIG. 30 is a schematic representation of a single surface of a rotating disk recordable media. The recordable media surface 3000 comprises a plurality of concentric tracks logically laid out from an inner diameter through an outer diameter. In accordance with the dynamic density control features and aspects hereof, the concentric tracks are grouped in zones of varying density. Zones "A" and "C" are lower recording density zones while zones "B" and "D" are nominal or standard recording density zones. As noted above, the density may be varied in the radial track pitch and/or in the longitudinal bit recording density. Zones A and C are shown as containing less information—e.g., lower recording density (track density, bit density, or both) as compared to normal recording density of zones B and D. Physical blocks (e.g., within a frame) 3002 in zone C (a lower density zone) is shown as recorded using physically more space than frame 3004 recorded in zone B (a normal density zone). Those of ordinary skill in the art will readily recognize that the scale of elements of FIG. 30 are not intended to precisely reflect radial or longitudinal density or spacing nor even the typical layout of tracks or surfaces in any particular storage device. Rather, the Figure is intended merely to suggest the dynamic density features and aspects hereof wherein data may be dynamically recorded in a reduced recording density zone or in a normal recording density zone in response to current operational status of the storage device and/or in response to current capacity ratio determinations.

As will be discussed further herein below, a lower density recording zone may be converted or migrated back to a normal recording density zone where utilization of the physical capacity of the storage device starts to rise. Typically the physical capacity of the storage device is specified presuming the recording density to be static rather than dynamically reduced in accordance with features and aspects hereof. Thus as the physical capacity of the storage device starts to fill, data recorded in a reduced density zone may be migrated into a normal recording density zone and the reduced density zone may be reconfigured as a normal recording density zone.

Not shown in FIG. 30 but readily apparent to those of ordinary skilled in the art is a structure wherein each of multiple surfaces of a storage device may be so controlled for dynamic density recording. Thus each surface may be configured with some number of normal recording density zones and some number of reduced density recording zones. Still further, in another aspect, particular surfaces may be configured with reduced recording density zones either in part or in their entirety while other surfaces may be configured exclusively for normal density recording. An entire recording surface may be selected for reduced density recording based upon operating parameters of the read/write head assembly associated with the head. Those of ordinary skill in the art will readily recognize that normal and lower density zone may be distributed over the recordable media surfaces of the storage device in any of several configurations in accordance with the needs of a particular application.

Figures 31, 32, 33:
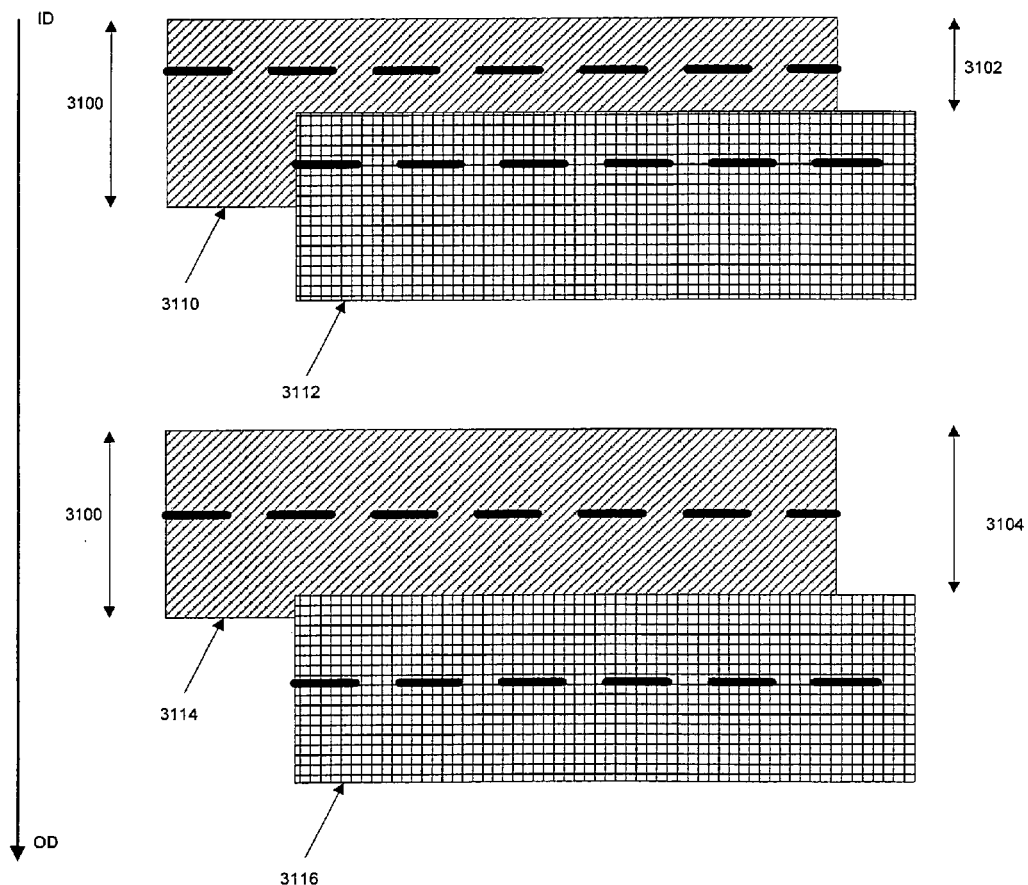
FIG. 31 is a schematic diagram of recorded adjacent tracks written with variable track density on a mapped storage device in accordance with features and aspects hereof.
FIGS. 32 and 33 are block diagrams suggesting the structure of frames written to a mapped storage device with varying bit density in accordance with features and aspects hereof.

FIG. 31 is a block diagram similar to FIG. 20 described above. FIG. 31 schematically represents adjacent written tracks using such a read/write head configuration that, in conjunction with mapping features and aspects hereof, permits variable track density. Tracks 3110 and 3112 are written in a normal recording density zone with a nominal track pitch 3102 (a track pitch less than the write head width 3000). By contrast, tracks 3114 and 3116 represent tracks written in low density zone with a lower or reduced track density (e.g., a wider track pitch 3104). Each track 3110, 3112, 3114, and 3116 has a track centerline indicated by a corresponding thicker dashed line. In accordance with variable density features and aspects hereof, tracks 3110 and 3112 are written at nominal track pitch 3102. However, tracks 3114 and 3116 are further offset by reducing track density and thus have an increased track pitch 3004 (i.e., a reduced track density).

As noted above, reducing track density (by increasing track pitch) can offer diminishing returns if the track pitch is too large. Proximity of information from an adjacent track is an aspect of sensing "off track" conditions in most present day disk drives and is used for controlling and correcting the flight of the read/write head over the track centerline. The track pitch shown in FIG. 31 is not intended to express any precise dimensions of actual track pitch values or even a relative scale of normal versus low track density. Rather, the increased track pitch 3104 is intended only as suggestive of the ability to increase track pitch (reduce track density) relying upon the mapping features and aspects hereof in which logical to physical mapping allows separation and independence of the logical block addresses and sizes and the physical block addresses and sizes.

FIGS. 32 and 33 are schematic representations of a frame (containing one or more physical disk blocks) as described above in accordance with the mapping features and aspects hereof. FIG. 32 represents a frame written in nominal longitudinal or bit density while FIG. 33 represents the same frame written with reduced bit density in accordance with features and aspects hereof. The frame of FIG. 32 includes a preamble field 3200, a sync field 3202, a data field 3204, and an ECC (error correction) field 3206. Identical fields are present in the frame of FIG. 33 but represented graphically as longer suggesting the lower recording density of the frame. In particular, preamble field 3300, sync field 3302, data field 3304, and ECC (error correction) field 3306 are each shown as stretched in the longitudinal direction of recording relative to the corresponding fields of FIG. 32. As above, FIGS. 32 and 33 are not intended to represent any particular or even accurate scale of the size of a recorded frame. Rather, FIGS. 32 and 33 are merely intended to suggest the reduction of longitudinal or bit density of a recorded block or frame in accordance with the dynamic density control features and aspects hereof.

A normal density frame of FIG. 32 is written in a normal density zone of the storage device while a lower density frame of FIG. 33 is written in a low density zone of the storage device. A block or frame may be migrated or re-recorded from a normal (higher) density zone to a lower density zone to improve reliability in reading of the data. Conversely, a block or frame may be migrated or re-recorded from a lower or reduced density zone back to a normal or nominal density zone as the physical capacity of the storage device starts to fill.

Features and aspects hereof include selecting an appropriate density zone for writing of host supplied logical blocks. FIG. 11 discussed above represents the processing of such a write request in accordance with the logical to physical mapping features and aspects hereof. In general as expressed in FIG. 11 and support descriptions above, processing of a write request includes locating consecutive physical disk blocks to which the host supplied logical block addresses may be mapped. Appropriate mapping table entries are generated and the host supplied data is transferred to the selected physical block addresses. The transfer to physical block addresses may involve buffering or caching so that multiple physical disk block writes may be coalesced or aggregated to a larger frame construct that better utilizes processing and data transfer bandwidth of the storage device controller.

Figure 34:
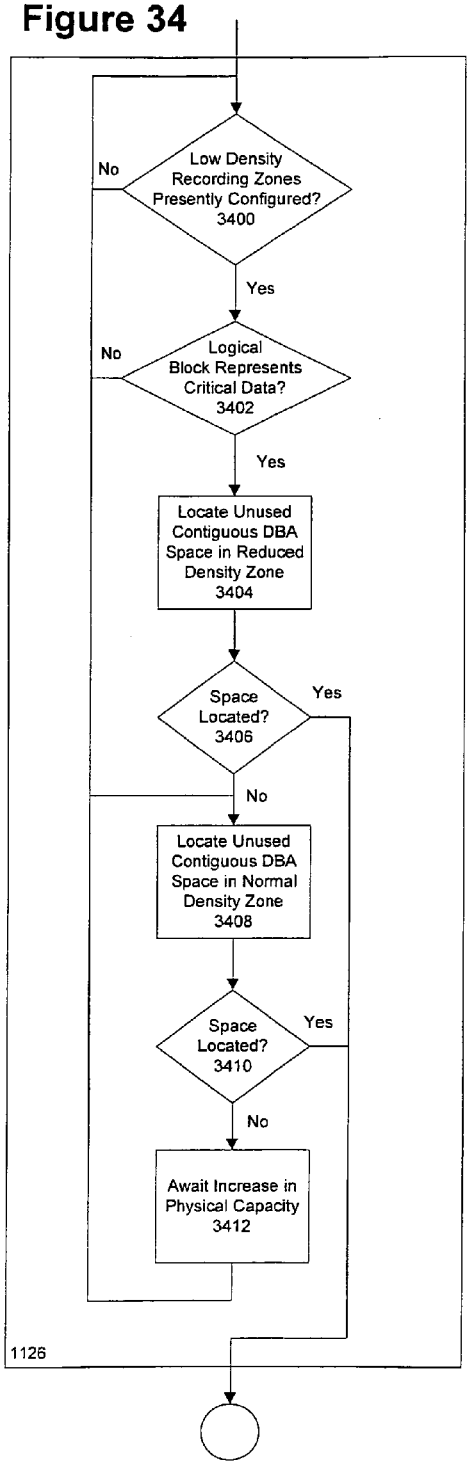
FIGS. 34 and 35 are flowcharts describing methods for management of dynamic density for recording of data on a mapped storage device in accordance with features and aspects hereof.

In particular, element 1126 of FIG. 11 above represents processing to locate appropriate contiguous physical blocks to which the host supplied logical blocks are transferred and mapped. FIG. 34 is a flowchart providing additional exemplary details of the processing of element 1126 to select physical blocks in an appropriate density zone as defined in accordance with features and aspects hereof. Element of 3400 is first operable to determine whether any low density recording zones are presently configured on the recordable media of the dynamically mapped storage device. If not, processing continues and element 3408 as discussed further here and below. If so, element 3402 is next operable to determine whether the host supplied logical blocks of data may represent critical data. As noted above, critical data may include data deemed to be critical to the host system either by heuristic analysis of the storage device performed by the storage device or as directly identified by modified host applications using specialized control sequences or parameters in the write requests. If element 3402 determines that the host supplied logical block data does not include critical data, processing continues with element 3408 as discussed herein below. If the method determines that the logical blocks may represent critical data, element 3404 is next operable to attempt to locate unused contiguous physical disk space in a reduced density zone of the storage device recordable media. Although tests have already confirmed that some low density recording zones are presently configured, there may or may not be enough space in such low density recordings zones to record the presently supplied host data. Element 3406 then determines whether sufficient space has been located in an appropriate low re-recording density zone. If so, processing of the method completes and remaining processing described above with respect to FIG. 11 completes processing of the write request. Otherwise, processing continues with element 3408.

If there is insufficient space in any low re-recording density zone or if the host supplied data is deemed non-critical, element 3408 is next operable to attempt to locate sufficient unused contiguous physical disk space within one or more of the normal recording density zones of the dynamically mapped storage device. Element 3410 is then operable to determine whether sufficient physical space was so located. If sufficient space is located by operation of element 3408, processing of element 1126 is completed and further processing of FIG. 11 described above completes the host write request. If insufficient space is presently available in the normal recording density zones of the storage device, element 3412 is operable to await an increase in the physical capacity as may be generated by background processing described further herein below. As noted above, various monitor processing (e.g., background processes) within the storage device controller may periodically migrate information from low density to normal density or vice versa as may be required to better utilize the specified physical capacity of the storage device. For example, where the current capacity ratio starts to rise significantly, background processing may be invoked to migrate data from low density zones to normal recording density zones to thereby free the physical space comprising a low density zone for re-use. The freed low density zone may then be re-configured for re-use as a normal recording density zone thereby increasing the available physical capacity of the storage device. Eventually, sufficient physical capacity will be restored to permit storage of the data in the present host write request. If the physical capacity of the storage device is completely filled with all recording zones configured for normal recording density, standard error processing (well known to those of ordinary skill in the art) is invoked to so indicate the erroneous request to a user. When element 3412 detects some increase in the physical capacity, processing continues looping back to element 3400 to repeat the search to locate sufficient physical disk space either in any remaining low density zones or the presently defined normal density zones of the storage device.

Those of ordinary skill in the art will readily recognize that a variety of other factors may be utilized to determine whether a particular host write request should be stored in a low density zone or a normal density zone. Further, a variety of density zones may be defined rather than simply two levels of recording density—a normal recording density and a single lower recording density. Those of ordinary skill in the art will recognize that a variety of useful intermediate density recording zones may be defined. Thus, processing of FIG. 34 is intended merely as exemplary of one possible embodiment of features and aspects hereof wherein a variety of different recording density zones may be defined and selected based on any of several criteria associated with a particular host write request.

Further, those of ordinary skill in the art will readily recognize that the read and write request processing of FIG. 11 may be trivially modified to include appropriate reprogramming of read/write head density control parameters to successfully complete a particular read or write request. In particular, referring again to FIG. 11, read request processing element 1108 may include suitable programming of servo controls and other control mechanisms to properly adapt the read/write head for reading information in accordance with the density requirements of the particular zone storing the requested host data. In like manner, element 1132 includes suitable programming of read/write head parameters and other operational parameters to properly record the data in accordance with density specifications of the associated zone.

Figure 35:
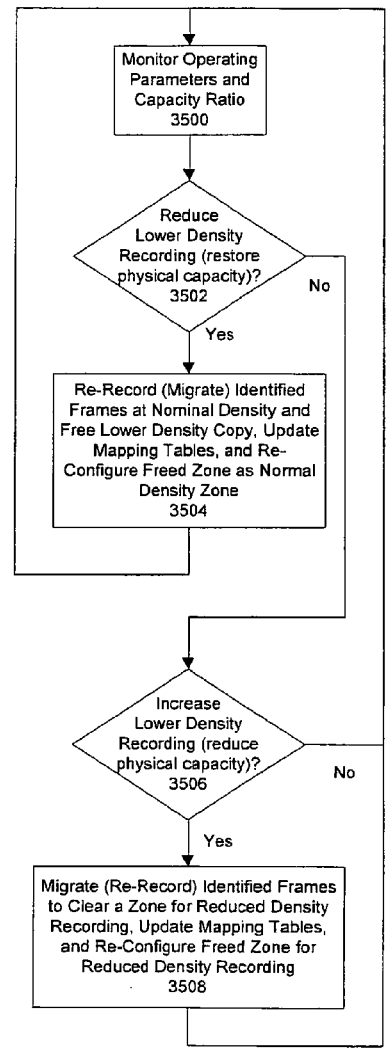

FIG. 35 is a flowchart representing exemplary background processing to monitor various aspects of the operating storage device. Responsive to the monitored information, the method is also operable to migrate information between low and normal recording density zones and to reconfigure the number of such zones as appropriate for the current operating parameters of the storage device. Element 3500 is first operable to measure or monitor various current operating parameters of the storage device including, for example, the current capacity ratio. As noted above, numerous other operating parameters may be monitored and useful to reflect the reliability of the storage device and hence the need for more or less low recording density zones. Element 3502 then detects from the currently measured parameters and capacity whether it is appropriate to reduce the number of lower density recording zones to thereby restore physical capacity for storage of additional data. As noted above, defining a zone for low density recording decreases the available physical space on the storage device below that of the normal specifications of the storage device. Thus, as the storage device fills, the number of low recording density zones may need to be reduced to achieve the specified physical capacity of the storage device. In like manner, if the other operating parameters indicate that the storage device is generally operating well within normal operating parameters, recording of information at low density to improve reliability may not be required. Rather, the storage device operating with normal recording density may provide adequate reliability for the specified purposes.

Thus, if the current capacity ratio and operating parameters indicate that the number of low recording density zones should be reduced, element 3504 is next operable to re-record or migrate frames or blocks presently stored in a low recording density zone into a normal recording density zone. As the data is migrated or re-recorded, mapping table entries are updated appropriately to indicate that the physical data blocks corresponding to some logical addresses have been moved and to indicate a new recording density for the associated data. When all data in a particular low recording density zone has been migrated—leaving the zone emptied—the zone may be reconfigured as a normal recording density zone for further storage of data. Reconfiguring the emptied zone for normal density recording recovers physical storage capacity as compared to the loss of capacity due to lower density recording.

Processing of the method then continues looping back to element 3500 to continue background processing to monitor and reconfigure zones of the storage device.

If element 3502 determines that there is not a need to reduce the number of low recording density zones, element 3506 is next operable to determine whether the monitored operating parameter values indicate that the number of low recording density zones should be increased. Where the operating parameters and the current capacity ratio indicate that reliability may be enhanced by providing for more low density recording and indicate that the current capacity ratio allows for such a reduction in usable physical capacity, element 3508 is operable to so increase the number of low recording density zone. Similar to the processing of element 3504, element 3508 migrates data currently recorded in a normal recording density zone into one or more low recording density zones. As data is migrated, mapping table entries are updated to reflect the move of some logical block addresses to different physical blocks at a different recording density. When all data in a particular normal recording density zone has been migrated—leaving the zone emptied—the zone may be reconfigured as a low recording density zone for further storage of data. Reconfiguring the emptied zone for low density recording reduces physical storage capacity. Hence the current capacity ratio may be increased. Processing of the method then continues looping back to element 3500 to continue background processing to monitor and reconfigure zones of the storage device.

Those of ordinary skill in the art will readily recognize that the methods of FIGS. 34 through 35 are intended merely as exemplary of possible embodiments of methods in accordance with features and aspects hereof to provide dynamic recording densities in dynamically mapped storage device. Numerous equivalent methods and techniques will be readily apparent to those of ordinary skill in the art to implement such features as a matter of design choice.

Field Flawscan

In typical present day disk drives, the manufacturer performs a flawscan at time of manufacture to identify flaws on the recordable media surfaces of the drive. To assure that the manufactured disk drive has sufficient usable storage media space for its specified capacity the manufacturer tests the disk drive by writing and reading back every physical location on the recordable media surfaces. This process, typically referred to as a "flawscan", can be very time consuming often involving hours of test time for each disk drive.

Since all user data written to the dynamically mapped storage device is dynamically mapped from the user supplied logical address space (logical block addresses or LBAs) to the physical disk block address space (disk block addresses or DBAs—blocks of variable, independent size relative to the LBA size), features and aspects hereof permit reducing the portion of the storage device that need be scanned for flaws at time of manufacture. Complete flawscan processing is deferred to the field application of the storage device such that it may be completed after the storage device is used in an end user application—e.g., completed during idle time of the storage device after it is first placed in service.

In general, a minimal portion of the recordable surface area of the storage device is fully scanned at time of manufacture. The minimal initial flawscan at time of manufacture may include random scans of portions of the recordable surfaces to assess the statistical likelihood that the drive will meet at least the specified total capacity. In addition, the manufacture time initial flawscan may include a small portion of the total capacity sufficient to store data that a system integrator customer may use immediately upon installation of the storage device.

For example, manufacturers of personal computers and workstations often purchase large quantities of storage devices for integration in their manufactured computing systems. The integrator immediately installs an operating system and a standard compliment of application programs on the storage devices as an aspect of the integration process. Sufficient space to store such information may be certified by manufacture time flawscan operations. Thus sufficient initial space may be certified by an initial flawscan to assure desired responsiveness to a system integrator's mass installation procedures. In general, the combination of the random sampling flawscan and the initial space requirements flawscan (if any) at time of manufacture will still represent a small fraction of the total storage capacity of the storage device—e.g., a few percent of the specified total physical capacity of the storage device.

Figure 36:
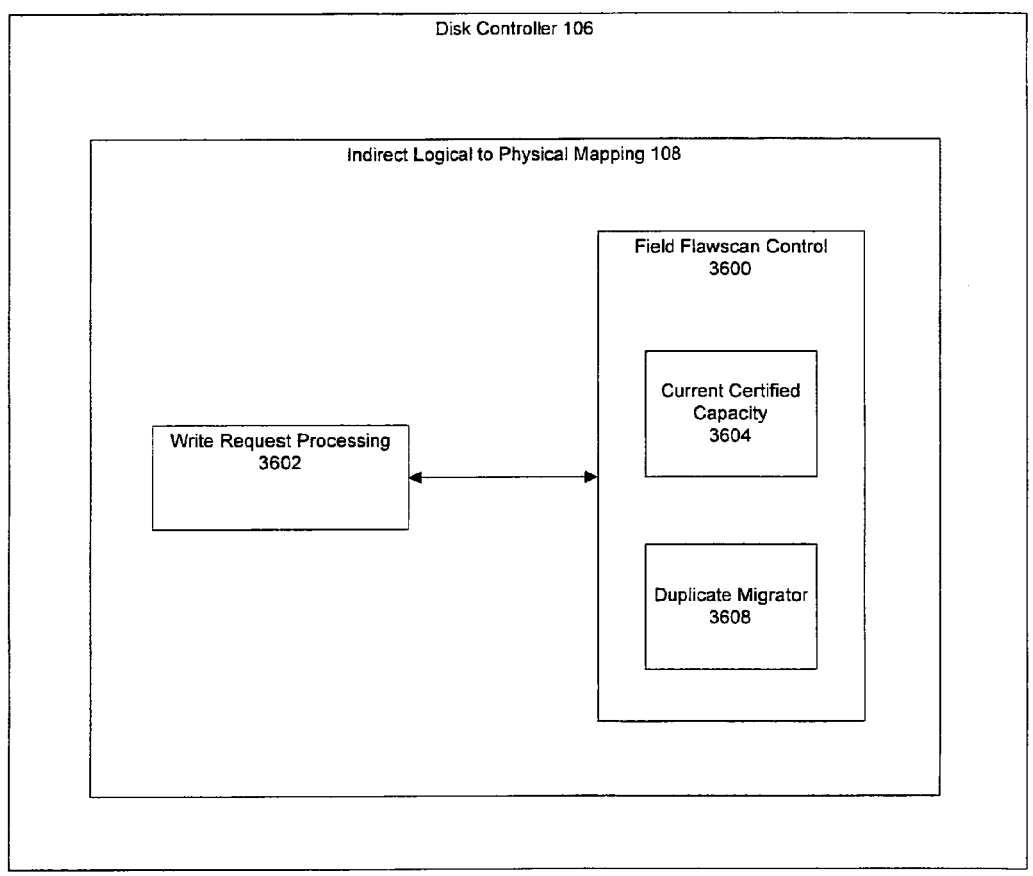
FIG. 36 is a block diagram providing additional exemplary details of a disk controller as in FIG. 1 enhanced to provide management of field flawscan in accordance with features and aspects hereof.

FIG. 36 is a block diagram providing additional exemplary details of a disk controller as in FIG. 1 enhanced to provide management of field flawscan in accordance with features and aspects hereof. As noted above, disk controller 106 may include indirect logical to physical mapping element 108 generally responsible for dynamic mapping features of the storage device. An aspect of the logical to physical mapping element 108 as noted above may include a field flawscan control element 3600 operable to provide field flawscan to perform final flawscan (e.g., completion of any initial flawscan performed prior to installation of the storage device in its intended application). Field flawscan control element 3600 may include various elements to aid in the flawscan processing in conjunction with substantially concurrent processing of write requests by write request processing element 3602. Current certified capacity element 3604 represents any storage element used to indicate the amount of certified capacity presently available for write operations. Storage locations are "certified" by flawscan testing that verifies proper storage and retrieval of information in each location of the storage device. As that certified capacity is used (e.g., by processing of write requests in element 3602), the current capacity indicator in element 3604 may be decreased. As final flawscan continues by operation of element 3600, additional certified capacity may be added to the indicator of element 3604. Further, as discussed in additional detail below, when supplied data of a write request is written to uncertified storage capacity, it may be written with one or more duplicate copies to help assure integrity of the recorded information until the storage device is further certified. Duplicate migratory element 3608 may therefore be operable to move supplied data written to uncertified locations of the storage device to certified locations as the flawscan continues.

Those of ordinary skill in the art will readily recognize that the various functional elements 3600 through 3608 shown as operable within the indirect logical to physical mapping element 108 of disk controller 106 may be combined into fewer discrete elements or may be broken up into a larger number of discrete functional elements as a matter of design choice. Thus, the particular functional decomposition suggested by FIG. 36 is intended merely as exemplary of one possible functional decomposition of elements within controller 106.

Figure 39:
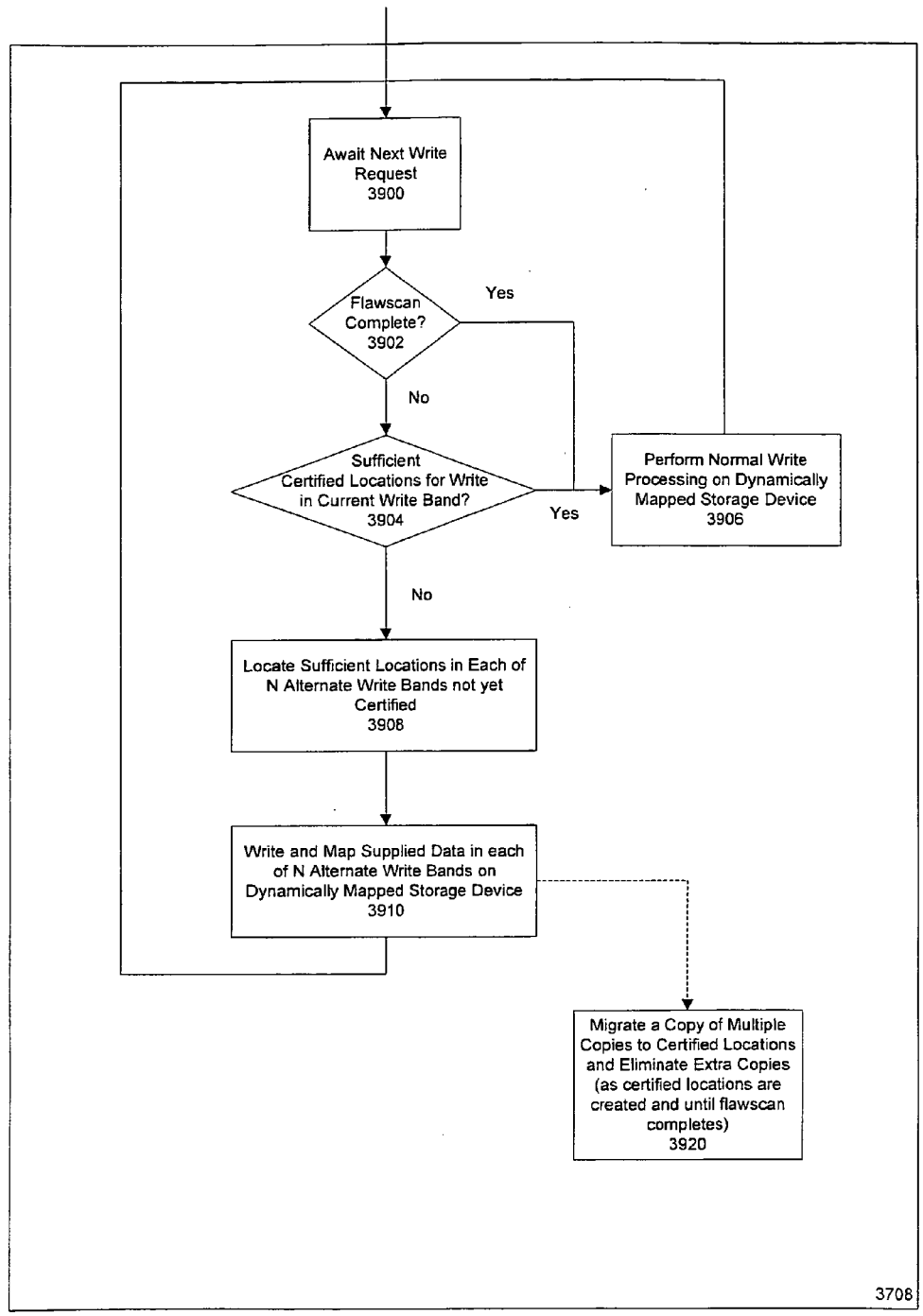

FIGS. 37 through 39 are flowcharts representing exemplary methods operable within a storage device controller (e.g., disk controller) in conjunction with the mapping features and aspects discussed herein above. In particular, FIG. 37 broadly represents a method operable within the storage device controller in accordance with features and aspects hereof to provide final or completed flawscan in field operations (e.g., following installation of the storage device in its intended initial application as distinct from time of manufacture or related manufacturing testing). Element 3700 of FIG. 37 represents the initial flawscan that may be performed by a manufacturer of the storage device (e.g., at time of manufacture or related manufacture testing). As noted above, this initial flawscan may include a minimal portion of the total physical capacity of the storage device. An initial flawscan may involve a sufficient capacity to permit initial installation of a standard operating system and applications as may be performed by a system integrator or other end user of a newly purchased storage device. In addition, or in the alternative, the initial flawscan of element 3700 may perform a statistical sampling of portions of the total physical capacity to validate or certify a small fraction of the total physical capacity while still providing a high probability of assurance that the specified physical capacity of the storage device will be fully available to the end user. Such statistical sampling techniques are well known in the industry and may entail statistical selection of random locations on the storage device (e.g., multiple radial locations on each of multiple surfaces of the recording media of the storage device such as a disk drive).

Following such initial flawscan performed by the manufacturer of the storage device, the storage device may be packaged, sold, and shipped for utilization by an end user in its intended initial application. Element 3702 represents processing by such an end user to install the storage device in a related system and, optionally, to install the initial host supplied data for use in the intended application (e.g., operating system and/or initial applications with associated data as may be performed by typical system integrators). Processing of element 3702 may represent both manual processing to physically install a storage device as well as manual and/or automated procedures to initially install host supplied data for use in the intended initial application.

Elements 3704 through 3708 then represent processing within the storage device in accordance with features and aspects hereof to continue or complete the flawscan substantially in parallel with processing of write requests to store host supplied data on the storage device. Element 3704 is then operable to determine whether the final flawscan has already been completed. For example, each time the storage device is reset or powered on, element 3704 will determine if the final flawscan to be performed by the storage device has already been completed. If so, processing continues with element 3708 to simply continue normal processing of I/O requests including in particular write requests to store data. If element 3704 determines that the final flawscan of the storage device has not yet completed, elements 3706 and 3708 are operable substantially concurrently within the storage device. As above, element 3708 processes write requests while element 3706 is operable to continue the final flawscan procedure until flawscan has been completed—thus certifying usability of each storage location of the storage device. The two elements 3706 and 3708 are operable substantially in parallel. Thus, time consuming flawscan of the full capacity of the storage device is deferred until field installation of the storage device and may then be completed substantially in parallel with ongoing utilization of the disk drive storage device for processing of write requests and other standard operations.

As discussed further herein below, element 3706 operable to perform the final flawscan of the storage device may be operable during idle periods of the storage device. As used herein, "idle" periods are those periods of time during which the storage device is not presently busy processing write requests or other host supplied requests. Therefore, the method of FIG. 37 is essentially operable to complete flawscan with minimal or no performance impact on the end user's utilization of the storage device while dramatically reducing the time and associated cost and complexity associated with manufacture testing to complete flawscan of the storage device.

Those of ordinary skill in the art will readily recognize that a flag or other indicia indicative of completion of the final flawscan may be stored within an appropriate nonvolatile memory associated with the storage device including, for example, a reserved area of the recordable storage media per se of the storage device.

Further, those of ordinary skill in the art will recognize that the initial flawscan described by element 3700 may perform as much or as little flawscan processing as may be desired for the particular storage device application and architecture. In particular, the initial flawscan performed at time of manufacture or in associated manufacture testing procedures may be reduced to zero—in other words no initial certification of flawless storage capacity. A manufacturer may choose to market such storage devices with a lower guaranteed storage capacity or have a lower price point in view of the slightly higher probability of reduced physical capacity due to manufacture flaws in the storage device recordable media.

FIG. 38 is a flowchart providing exemplary additional details of the processing of element 3706 of FIG. 37. As noted above, element 3706 is generally operable to continue the final flawscan procedures, substantially concurrently with ongoing write request processing, until the flawscan procedures have completed to thereby certify all locations of the storage device. Element 3800 of FIG. 38 is first operable to determine whether a write request is presently in process within the storage device controller or is pending and awaiting processing by elements within the storage device controller storage device controller. If so, processing continues looping on element 3800 until such time as no write request processing is either in process or pending. As noted above, "idle" periods of the storage device controller may be defined as periods in which no write request is being processed or is pending or, more broadly, periods during which no host requested operations are currently in process or pending. When element 3800 determines that such an idle period has been encountered, element 3802 is next operable to perform some additional quantum of flawscan processing to continue certifying storage locations on the storage device that are at present uncertified. As noted above, a storage element within the storage device controller may store such progress information of the flawscan processing in a nonvolatile memory component so as to track progress in the certification process of the final flawscan procedure within storage device. The particular quantum of processing to be performed by element 3802 may be determined as a matter of design choice in accordance with the needs of a particular application of features and aspects hereof. Element 3804 is next operable after completion of a quantum of processing for the final flawscan to determine whether the final flawscan processing has fully completed. If not, processing continues looping back to element 3800 to await the next idle period such that further quanta of flawscan processing may proceed by operation of element 3802. As each quantum of flawscan processing complete, stored indicia of the progress may be updated. If element 3804 determines that final flawscan processing has completed, the processing of element 3706 is complete and the appropriate nonvolatile storage information may be updated to indicate the completion of the final flawscan processing.

FIG. 39 is a flowchart describing exemplary additional details of the processing of element 3708 of FIG. 37. As generally noted above, element 3708 of FIG. 37 is operable to process host generated write requests to store supplied data on the recordable media of the storage device. The processing of element 3708 is substantially concurrent with processing of the final flawscan procedure until the flawscan processing has completed. Element 3900 of FIG. 39 is first operable to await receipt of a next write request generated by an attached host system. Upon receipt of such a request, element 3902 is next operable to determine whether the final flawscan procedure has already completed. If so, element 3906 is next operable to sense a pending write request from an attached host system in accordance with normal write request processing procedures associated with the dynamically mapped storage device and as discussed herein above. Processing continues looping back to element 3900 to await receipt of the next write request from an attached host system.

If element 3902 determines that the final flawscan processing has not yet completed, element 3904 is next operable to determine whether sufficient certified locations are available for writing the supplied data in the current write band of the storage device. As noted above, in accordance with the dynamic mapping features and aspects hereof, data is preferably aggregated into frame meta structures and then written to the recordable media of the storage device in a particular current write band. As noted above, a write band is a grouping of consecutive, adjacent radial track positions bounded on either side by a so called guard band. The current write band represents available physical locations for writing of host supplied data in response to received write requests. In general, the flawscan processing discussed above with respect to FIGS. 37 through 38 attempts to stay physically just ahead of the write band as the storage device controller writes host supplied information into the presently certified locations of the current write band. In other words, flawscan certification attempts to keep up with the sequential extension of the write band through physical locations of the current write band. If sufficient certified locations are available in the current write band, processing continues with element 3906 as discussed above to complete the write request in accordance with standard dynamically mapped storage procedures of the dynamically mapped storage device. Processing continues looping back to element 3900 to await receipt of a next host write request.

If element 3904 determines that the current write band does not have sufficient certified locations, processing continues with element 3908 to locate sufficient physical locations in each of one or more alternate write bands certified by the final flawscan proceeding substantially concurrently. This may require that the disk controller defragment the recordable media to make available sufficient space. Otherwise, the disk controller may wait for additional locations to be certified by the final flawscan process before continuing the writing process.

Those of ordinary skill in the art will readily recognize that the methods of FIGS. 37 through 39 are intended merely as exemplary of possible embodiments of methods in accordance with features and aspects hereof to provide field flawscan substantially concurrently with ongoing write request processing within a dynamically mapped storage device. Numerous equivalent methods and techniques will be readily apparent to those of ordinary skill in the art to implement such features as a matter of design choice.

Appended Metadata

It is desirable to analyze or diagnose operation of a storage device to anticipate failures or to analyze performance problems or potential performance improvements. Appended metadata may be stored in the dynamically mapped disk drive indicating historical and current operation of the dynamically mapped storage device in its end use application. The appended metadata may be used in the dynamically mapped storage device for purposes of analyzing or diagnosing the operation of the dynamically mapped storage device.

Since all user data written to the dynamically mapped storage device is dynamically mapped from the user supplied logical address space (logical block addresses or LBAs) to the physical disk block address space (disk block addresses or DBAs—blocks of variable, independent size relative to the LBA size), features and aspects hereof permit utilizing a portion of physical storage capacity for storing metadata relating to historical and current operation of the storage device in its end use application environment. While the logical to physical storage capacity ratio (current capacity ratio as discussed above) remains relatively low, physical storage capacity may be used to store metadata associated with current and past operation of the storage device to thereby enable diagnostic and analytical processing to alter or tune future operation of the storage devices and/or to diagnose or resolve errors in the storage device operation.

In general, while the current capacity ratio is relatively low (i.e., under a predetermined threshold), metadata may be added (appended) to physical disk blocks written (and/or each frame written). The metadata may be useful to diagnose or analyze operation of the storage device. As the current capacity ratio increases (e.g., above a predetermined threshold), subsequent written data may eliminate the appended metadata. As the current capacity ratio continues to rise, data previously recorded with appended metadata may be re-recorded (e.g., migrated) to a new, logically mapped physical storage location without the appended metadata to thereby free physical space for user data storage as needed. When so migrating data to be re-recorded, data may be selected based on any number of factors including, for example, its relative criticality to the application's use of the storage device (as also discussed above).

Exemplary metadata may include: track position information relating to the recorded data, operating temperature at the time of recordation of the data, head assembly flying height at the time of the data recording, time of day of the data recording, etc. Track position information may be determined (from servo information) just prior to the data recordation or as the data is being recorded and then appended to the end of the data as it is written. Such information may be used to determine the quality of servo track following features of the storage device and hence the quality of the data so recorded on the storage device. Temperature information may include current temperature of the read/write head assembly (e.g., the assembly pre-amplifier) just prior to or during writing of the data and then appended to the end of the written data. Further, the temperature information may include other temperatures sensed from within the storage device such as from sensors on the controller printed circuit board or elsewhere associated with the storage device. Similarly, read/write head assembly flying height may be determined just prior to or during writing of the data and may be appended to the written data. Current time of day may also be captured just prior to or as the data is written and appended to the written data.

The time of day may be useful in analyzing the change in operating characteristics of the storage device over time. In addition, the time of day, in conjunction with the "unwind" features discussed above, may be used to restore the data stored on the storage device to an earlier recorded version. As noted above, the various mapping table structures discussed in detail above may be recorded in multiple physical locations of the storage device recordable media. Further, the multiple copies of the mapping tables may represent different points in time as data is recorded on the storage device. Still further, data written to the storage device that overwrites the same logical block address of previously recorded data need not erase the earlier copy. Rather, the mapping features hereof allow the earlier copy to remain stored on the storage device and the new data may be recorded at a new physical location. The mapping table structures may then map both physical copies of the data to the same logical block address and may also record the time of day associated with each copy. Time of day information associated with recorded data may therefore be used when "unwinding" the storage device to an earlier state and in particular to unwind to a precise earlier date and time.

Figure 40:
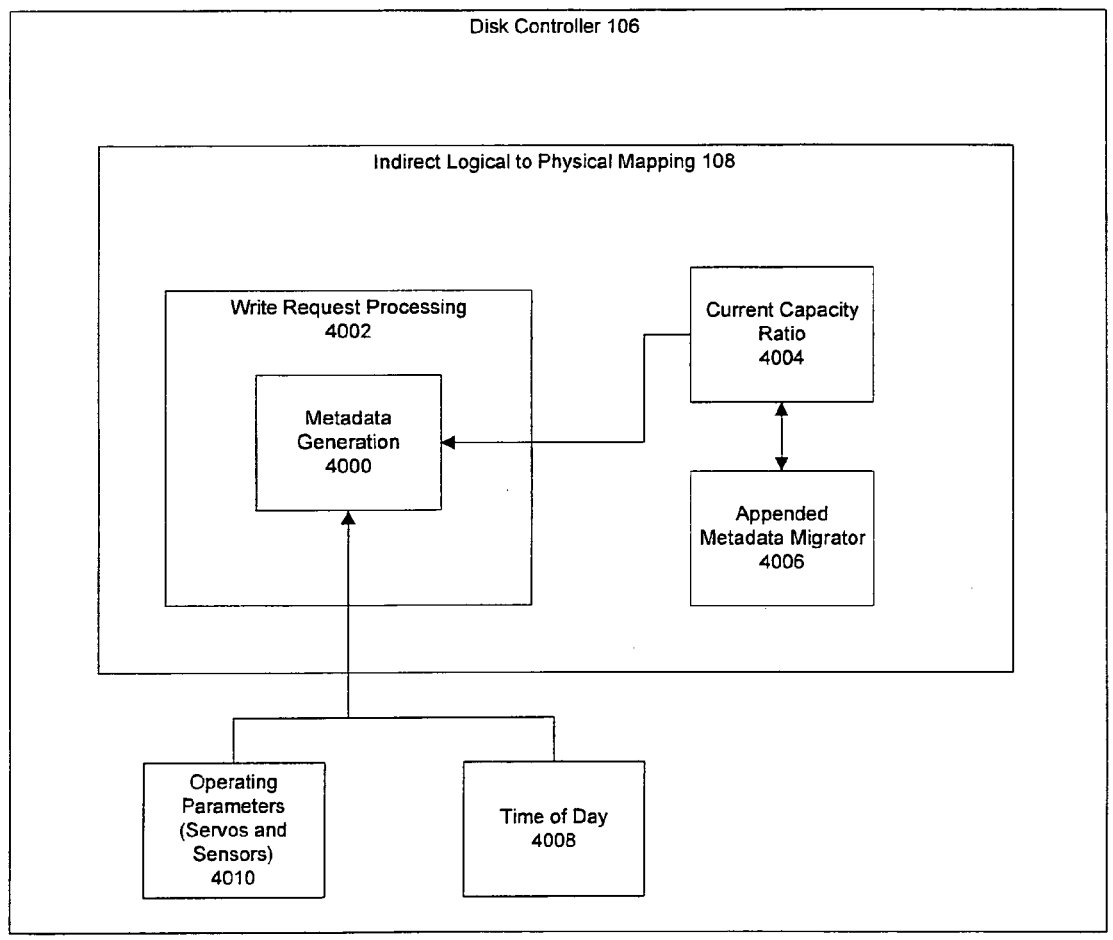
FIG. 40 is a block diagram providing additional exemplary details of a disk controller as in FIG. 1 enhanced to generate and utilize appended metadata in accordance with features and aspects hereof.

FIG. 40 is a block diagram providing additional exemplary details of a disk controller as in FIG. 1 enhanced to generate and utilize appended metadata in accordance with features and aspects hereof. As noted above, disk controller 106 may include indirect logical to physical mapping element 108 generally responsible for dynamic mapping features of the storage device. An aspect of the logical to physical mapping element 108 as noted above may include a write request processor 402 that includes metadata generation element 4000 for generating metadata associated with the writing of host supplied data and for storing the generated metadata in conjunction with the stored host supplied data. As discussed above, mapping element 108 may also include features to determine a current capacity ratio 4004 indicating the volume of logical data stored on the storage device relative to the actual physical locations utilized on the storage device. As discussed further herein below, metadata generation element 4000 is operable responsive to the current capacity ratio 4004 such that the additional metadata may be gathered and appended to data written to the storage device in accordance with the current capacity ratio as compared to one or more predetermined threshold levels. For example, when the current capacity ratio 4004 indicates that there is sufficient room to do so, metadata generation element 4000 may be operable responsive thereto to generate metadata and append the metadata to associated host supplied data stored in the storage device. Conversely, where the current capacity ratio 4004 indicates that insufficient physical space remains in the storage device relative to the volume of logical data stored therein, metadata generation element 4000 will refrain from appending metadata to host supplied data from subsequent write requests until such time (if ever) when the current capacity ratio again falls below a predetermined threshold value.

Metadata generation element 4000 may retrieve time of day information from time of day element 4008 and may receive values of current operating parameters of the storage device from element 4010. Those of ordinary skill in the art will readily recognize common devices within a storage device that may provide such information useful for the metadata generator 4000. In particular, the time of day circuit 4008 may be any of several well-known commercially available clock circuits that provide time of day information to devices coupled thereto. Still further, those of ordinary skill and the art will readily recognize numerous other operating parameters that may be provided to metadata generation element 4000 by element 4010. For example, servo controls for track following may provide the ability to read the current track position to determine how far off center track the read/write head assembly is as it flies over a radial track position. Or, for example, various temperature monitoring elements may be provided within a storage device indicating the current temperature of the operating storage device. A temperature of the read/write write head, per se, as well as other temperature sensors within or otherwise associated with the storage device may be provided. Or, for example, servo control mechanisms controlling head flying height may provide the ability for the metadata generator to read the current flying height of the read/write head as it passes over the rotating storage media.

Those of ordinary skill in the art will readily recognize that the various functional elements 4000 through 4010 shown as operable within the indirect logical to physical mapping element 108 of controller 106 may be combined into fewer discrete elements or may be broken up into a larger number of discrete functional elements as a matter of design choice. Thus, the particular functional decomposition suggested by FIG. 40 is intended merely as exemplary of one possible functional decomposition of elements within controller 106.

Figure 41:
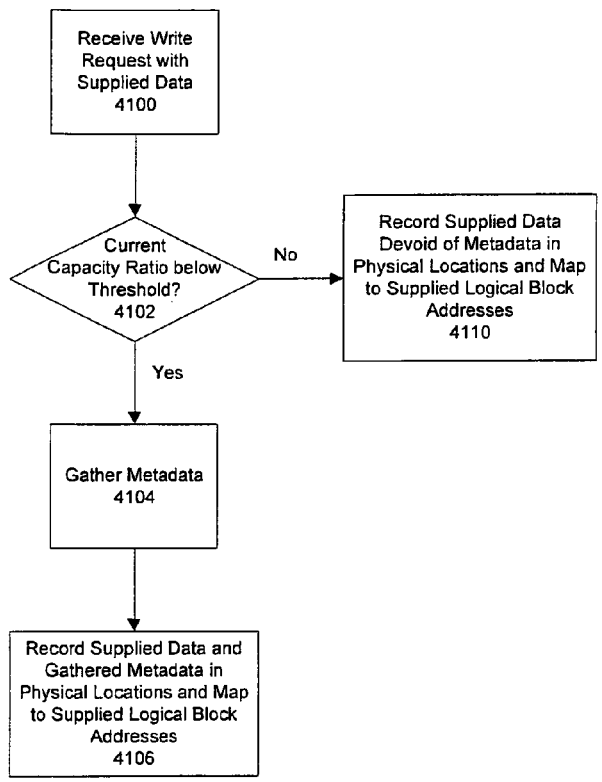
FIG. 41 is a flowchart describing an exemplary method in accordance with features and aspects hereof to process a write request received from an attached host system.

FIG. 41 is a flowchart describing an exemplary method in accordance with features and aspects hereof to process a write request received from an attached host system. As noted above, as determined by the current capacity ratio, metadata may be gathered and appended to the host supplied data to be recorded on the storage media of the storage device. Element 4100 is therefore first operable to receive a write request from an attached host system with host supplied data. In response to receiving such a write request, element 4102 is next operable to determine whether the value of the current capacity ratio is above or below a predetermined threshold value. If element 4102 determines that the current capacity ratio is not below the predetermined threshold value (e.g., insufficient space may be available for further appending of metadata), element 4110 is operable to complete the write request by recording the host supplied data without any appended metadata in selected physical locations of the storage device. In addition, and in accordance with standard write request processing for the dynamically mapped storage device, the recorded data is mapped through the mapping table structures described above so that the logical block address provided by the host system is mapped to the next available selected physical locations in which the host supplied data is written.

If element 4102 determines that the current capacity ratio is below the predetermined threshold value, element 4104 is next operable to gather metadata to be appended to the host supplied data for recording on the storage device recordable media. As noted above, the metadata may include, for example, current flying height of the read/write head assembly, current on/off track location information from the track following servo mechanism, time of day information, etc. Element 4106 is then operable to record the host supplied data along with the gathered metadata in the next available selected physical locations and to map the supplied logical block addresses to the selected physical locations in which the host supplied data and the metadata is recorded. As noted above, element 4104 is operable to gather the desired metadata in advance of recording the supplied data with the appended metadata or the gathering of metadata and recording of host supplied data may be substantially overlapped such that the metadata is gathered substantially concurrently with the time of recording some portion of the host supplied data. Thus, those of ordinary skill in the art will readily recognize that elements 4104 and 4106, in particular, may be merged logically into a single operation whereby as host supplied data is recorded the associated metadata is gathered and written at the end of recordation of the host supplied data. Such design choices will be readily apparent to those of ordinary skill in the art.

Figure 42:
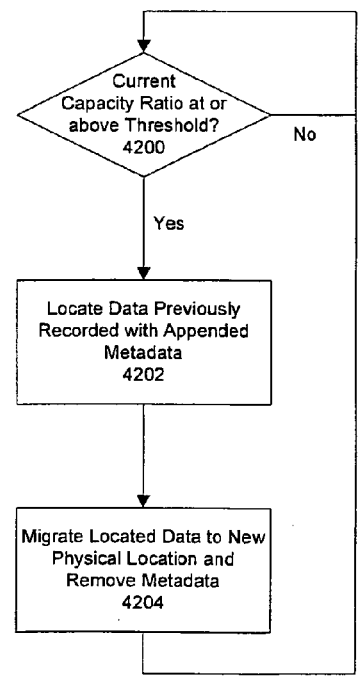
FIG. 42 is a flowchart describing an exemplary method operable within the dynamically mapped storage device to monitor the current capacity threshold value and, when appropriate, to migrate previously recorded data with appended metadata to new locations, re-recording the host supplied data devoid of appended metadata.

FIG. 42 is a flowchart describing an exemplary method operable within the dynamically mapped storage device to monitor the current capacity threshold value and, when appropriate, to migrate previously recorded data with appended metadata to new locations re-recording the host supplied data devoid of appended metadata. Thus the method of FIG. 42 is generally operable as a background task within the storage device controller to reduce the current capacity ratio as the volume of stored, host supplied data increases. Thus, elements 4200 through 4204 are generally continuously operable as background processing within the storage device controller of the dynamically mapped storage device.

Element 4200 is operable to loop until the current capacity ratio reaches the predetermined threshold value. When the current capacity ratio is detected as having exceeded met or exceeded the predetermined threshold value, element 4202 is next operable to locate previously recorded data having appended metadata associated therewith. Element 4204 is then operable to migrate the data located by operation of element 4202 into new physical locations such that the host supplied data is re-recorded devoid of the previously appended metadata. The previously recorded copy of the re-recorded data with its appended metadata may then be freed for subsequent use in processing additional write requests. Dynamically mapping structures discussed above are appropriately adjusted to map the host supplied logical block address of the earlier previously recorded data to the newly selected physical location.

Those of ordinary skill in the art will readily recognized that processing of element 4202 may be in accordance with any desired selection criteria as a matter of design choice. For example, frequency of access to the data, criticality of the data, and other selection criteria algorithms may be processed by element 4202 to determine which previously recorded data should be migrated in such a manner as to relinquish physical storage capacity previously used for storing metadata. For example, as noted above, particularly critical, frequently accessed data may most beneficially utilize the recorded metadata. Or, for example, previously recorded data with appended metadata may be selected for migration such that remaining appended metadata (if any) provides a desirable statistical sampling of portions of the recordable media of the storage device and/or a statistical sampling of metadata gathered at a variety of times during operation of the storage device. Thus, appended metadata analysis may most beneficially apply statistical sampling techniques for analyzing current operation of the storage device.

Figure 43:
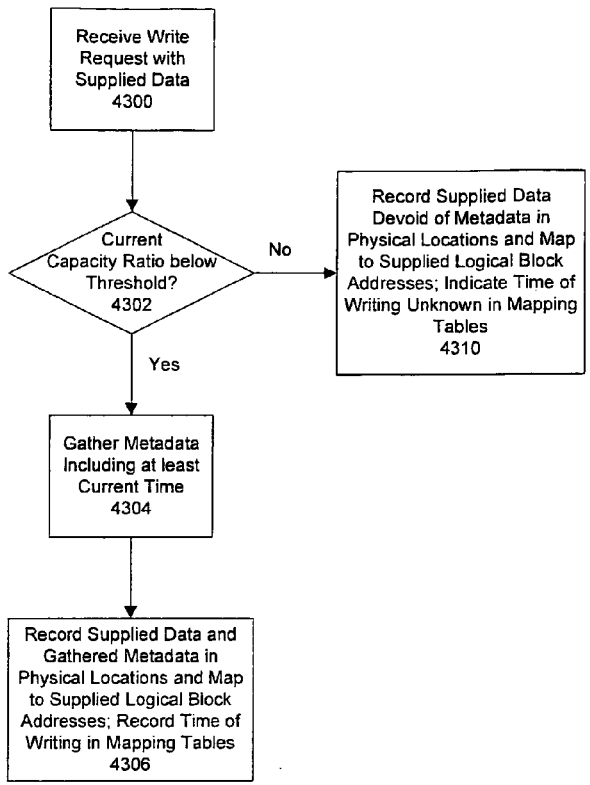
FIG. 43 is a flowchart describing another exemplary method similar to that of FIG. 41 discussed above for processing of received write requests with host supplied data.

FIG. 43 is a flowchart describing another exemplary method similar to that of FIG. 41 discussed above for processing of received write requests with host supplied data. In particular, the method of FIG. 43 specifically calls for recordation of at least the time of day as metadata appended to recorded host supplied data. Time of day information coupled with the multiple logically mapped indirections of host supplied data and the various mapping tables may be used to "unwind" the data stored on the map storage device to an earlier date and time. As discussed above, a logical block address mapped by the mapping tables may provide for multiple mappings. For example, multiple copies may be recorded to improve reliability through redundancy. Or, for example, in accordance with the ability to unwind the content of the storage device, earlier host supplied data recorded at a physical location and mapped to a logical block address may be retained when new data is supplied by the host at the same logical block address. Through use of the mapping tables, the more recently written version may be mapped to the supplied logical address but the earlier recorded information may also be mapped through the mapping table structures. In addition, as discussed above, multiple earlier versions of the mapping table structures may be saved in reserved physical locations of the storage device. In other words, by local processing within the dynamically mapped storage device utilizing appended metadata including time of day and other data duplication/mapping techniques discussed above, a disk drive storage device, per se, may permit unwind restoration of its contents to an earlier time of day for backup or archival recovery purposes.

The method of FIG. 43 suggests the particular utilization of time of day information both incorporated and appended as metadata and, as required, recorded within the mapping table structures to enable tracking of the time of overwriting of logical block addresses within the dynamically mapped storage device. Element 4300 is first operable to receive a write request from an attached host system providing host supplied data and logical block addresses for recording the supplied data. Element 4302 then determines whether the current capacity ratio is above or below a predetermined threshold value. If the current capacity ratio is at or above the predetermined threshold value, element 4310 is operable to record the host supplied data devoid of appended metadata in the next available selected physical locations. Mapping table structures discussed above are also updated to map the host supplied logical block addresses to the selected, next available physical locations.

As the physical storage capacity is used up in the storage device, metadata including time of day may not be recorded, hence the recorded host supplied data may fail to provide accurate time of day information. However, mapping table structures mapping the newly recorded data to the host supplied logical block addresses may include desired timing information to note the time of recordation. Thus, time of day information may be recorded in the mapping table structures when the current capacity ratio indicates the need to reduce the volume of appended metadata.

If element 4302 determines that the current capacity ratio is still below the predetermined threshold value, element 4304 is operable to gather current metadata information including at least the current time of day information. Element 4306 is then operable to record the host supplied data and gathered metadata (including at least time of day information) in selected, next available, physical locations of the storage device. Further, mapping table structures associated herewith are updated by processing of element 4306 to reflect the new physical location of the hosts supplied logical block addresses. The metadata gathered by element 4304 is appended to the recorded host supplied data. As above with respect to FIG. 41, elements 4304 and 4306 may be operable substantially concurrently such that the acquisition and gathering of metadata including at least current time of day overlaps with recordation of a portion of the host supplied data. Also as above with respect to FIG. 41, mapping tables associated with the logical mapping structures discussed above may also include time of day information as a technique for identifying the current time of recordation of associated host supplied data.

Older data previously recorded at the same logical block address may be removed if the current capacity ratio suggests the need to recover physical storage space. Alternatively, older data previously recorded may remain stored and mapped to the same logical block address in the mapping tables. The methods used to locate a host specified logical block address for reading may then locate the most recent copy of recorded data as indicated by the recorded time of day metadata (or as indicated by the time of day recorded in the mapping table structures). By so retaining older, previously recorded copies of physical data blocks corresponding to a host supplied logical block address, the earlier recorded content of the storage device may be controllably restored by operation of the storage device.

Figure 44:
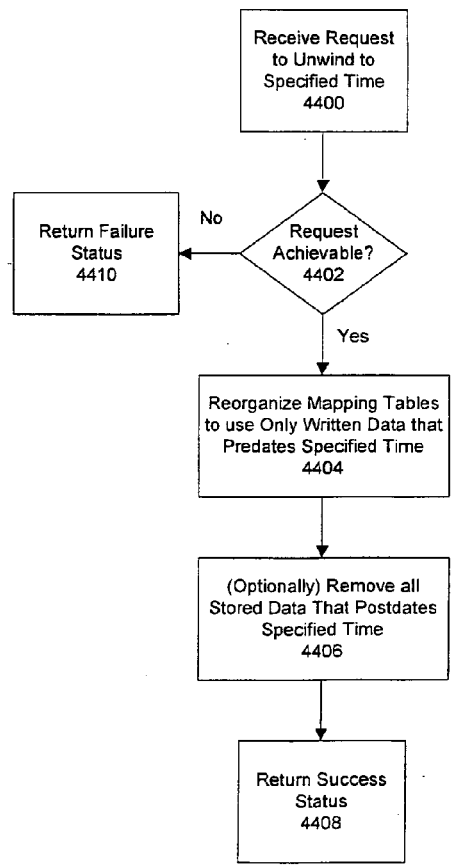
FIG. 44 is a flowchart describing an exemplary method operable in the storage device controller of a logically mapped storage device—to perform and "unwind" operation in response to an appropriate request.

FIG. 44 is a flowchart describing an exemplary method operable in the storage device controller of a logically map storage device—to perform and "unwind" operation in response to an appropriate request. Such a request may be provided by a diagnostic tool through a diagnostic interface of the storage device and/or may be provided by a special command received from an attached host system. As a matter of design choice, those of ordinary skill in the art will readily recognize a variety of security and authorization features to help assure that only appropriately authorized users and/or applications may invoke such a request.

Element 4400 therefore represents processing to receive an appropriately authorized request to unwind the contents of the dynamically mapped storage device to a previous, specified time of day. Element 4402 is then operable to analyze the recorded information on the storage device to determine whether the requested unwinding to the specified time of day is achievable. As noted above, responsive to changes in the current capacity ratio, data may be recorded with or without appended metadata inclusive of time of day information. Still further, as noted above, logical mapping table structures may optionally include time of day information useful wherein the appended metadata is not available for particular recorded data. Therefore processing of element 4402 determines whether all requisite mapping tables and/or metadata information is available to identify all changes to the content of the dynamically mapped storage device that followed the specified time of day. If all required information is not available to accomplish the requested unwind procedure, element 4410 is operable to return an appropriate failure status code to the requesting user or program.

If all required information is available to unwind the content of the dynamically mapped storage device to the specified earlier time, element 4404 is next operable to appropriately re-organize the mapping tables such that only data written to the storage device that predates the specified time may be accessed by subsequent read host requests. Element 4406 may optionally remove all the stored data that post-dates the specified earlier time so as to recover additional physical space useful for storing other host supplied information and appended metadata. Element 4406 is optional in that later, post-dated information may be retained and the mapping tables may simply be reorganized to use the earlier stored version of all stored data. Elements of 4404 and 4406 therefore perform the desired unwind operation back to a specified time by restoring mapping tables to the earlier specified time and by remapping logical block addresses to corresponding physical blocks previously recorded. Lastly, element 4408 returns a successful status indication to the requesting program or user indicating that the unwind operation was successfully completed and that the logical content of the dynamically mapped storage device has thus been restored to the specified earlier date and time.

Those of ordinary skill in the art will readily recognize that the methods of FIGS. 41 through 44 are intended merely as exemplary of possible embodiments of methods in accordance with features and aspects hereof to provide appended metadata in a dynamically mapped storage. Numerous equivalent methods and techniques will be readily apparent to those of ordinary skill in the art to implement such features as a matter of design choice.

Write Fault Recovery

As a disk drive writes data to a track of the recordable media, write fault errors may occur in instances where data is not correctly written to disk, such as when the write head deviates too far from the track center. If the data is written too far from the center of the track, it may be unreadable during subsequent read processes. In some cases where the write head deviates too far from the track center data on adjacent tracks written earlier in time may be overwritten and destroyed. As presently practiced, such errors may not be recoverable, and the data overwritten may be destroyed. Additionally, recovery from these errors imposes large penalties on the disk drive.

In accordance with features and aspects hereof, all user data written to the dynamically mapped storage device is dynamically mapped from the user supplied logical address space (logical block addresses or LBAs) to the physical disk block address space (disk block addresses or DBAs—blocks of variable, independent size relative to the LBA size). Thus features and aspects hereof permit recovery from write fault errors, such as off-track position errors, without significant performance losses while allowing for the recovery of overwritten data. An off-track position error occurs when the write head deviates too far from the center of the track, in which the written data may be unreadable. Further, an off-track position error may encroach previously written adjacent tracks, destroying data contained in the adjacent tracks.

Figure 45:
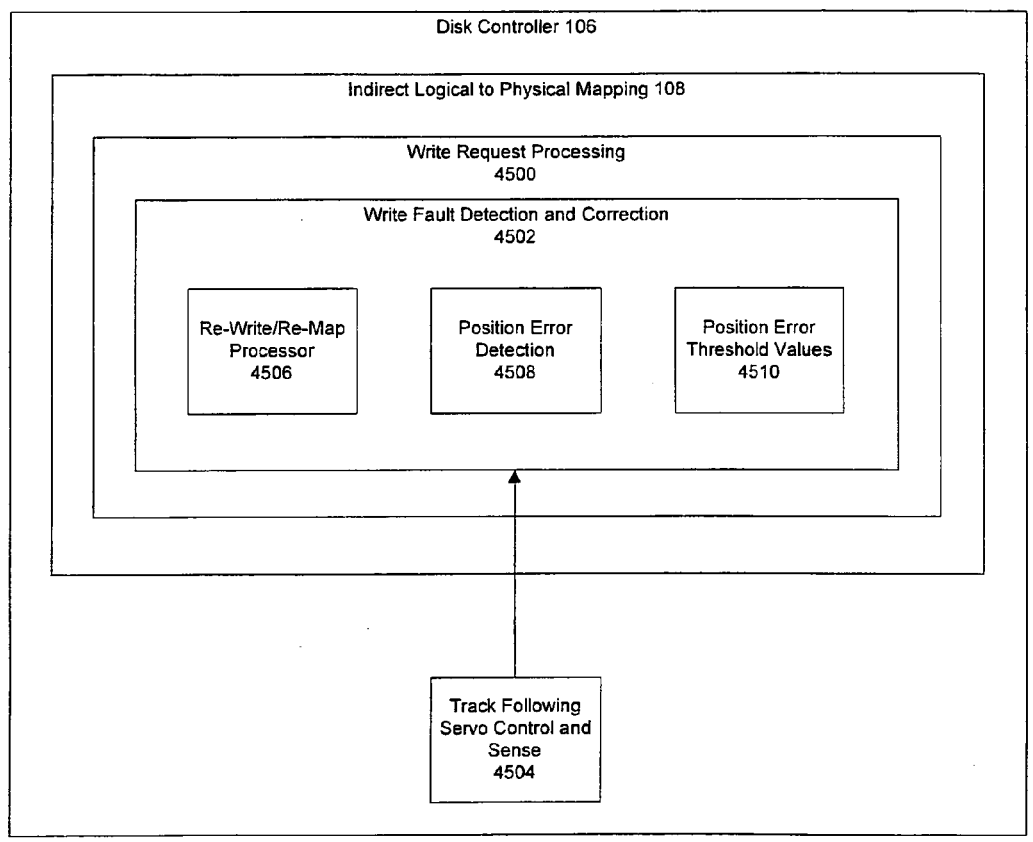
FIG. 45 is a block diagram providing additional exemplary details of a disk controller as in FIG. 1 enhanced to provide handling of an off-track position error encountered while writing user supplied data to a recordable media.

FIG. 45 is a block diagram providing additional exemplary details of a disk controller as in FIG. 1 enhanced to provide handling of an off-track position error encountered while writing user supplied data to a recordable media. As noted above, disk controller 106 may include indirect logical to physical mapping element 108 generally responsible for dynamic mapping features of the storage device. An aspect of the logical to physical mapping element 108 as noted above may include write request processing element 4500 operable to process requests to write data to the recordable media. Write request processing element 4500 may include write fault detection and correction element 4502 operable to detect and correct write fault errors occurring during the writing process. Disk controller 106 may include track following servo control and sense element 4504 operable to detect and control the position of the write head. Servo controls for track following may provide the ability to read the current track position to determine how far off center track the write head assembly is as it flies over a radial track position. Position error detection element 4508 is operable generally to detect position errors of the write head, for example in response to a position error signal (PES) from track following servo control and sense element 4504.

Write fault detection and correction element 4502 may include position error threshold values 4510, representing threshold values for detecting an off-track position error. There may be multiple position error threshold values 4510. For instance, a first threshold value may indicate an off-track position error in a direction in which no encroachment of an adjacent track may occur. A second threshold value may indicate an off-track position error in a direction in which encroachment of data in an adjacent track may occur. A third threshold value for instance may indicate that encroachment of data in an adjacent track has occurred. Thus, write fault detection and correction element 4502 may determine whether to re-write the incorrectly written logical block as well as a logical block that may have been encroached upon during the off-track position error. Write fault detection and correction element 4502 may include re-write/re-map processor 4506 operable to re-write and re-map data that was incorrectly written to the recordable media, as well as data overwritten by an off-track position error.

Those of ordinary skill in the art will readily recognize that the various functional elements 4500 through 4510 shown as operable within the indirect logical to physical mapping element 108 of disk controller 106 may be combined into fewer discrete elements or may be broken up into a larger number of discrete functional elements as a matter of design choice. Thus, the particular functional decomposition suggested by FIG. 45 is intended merely as exemplary of one possible functional decomposition of elements within disk controller 106.

Figure 48:
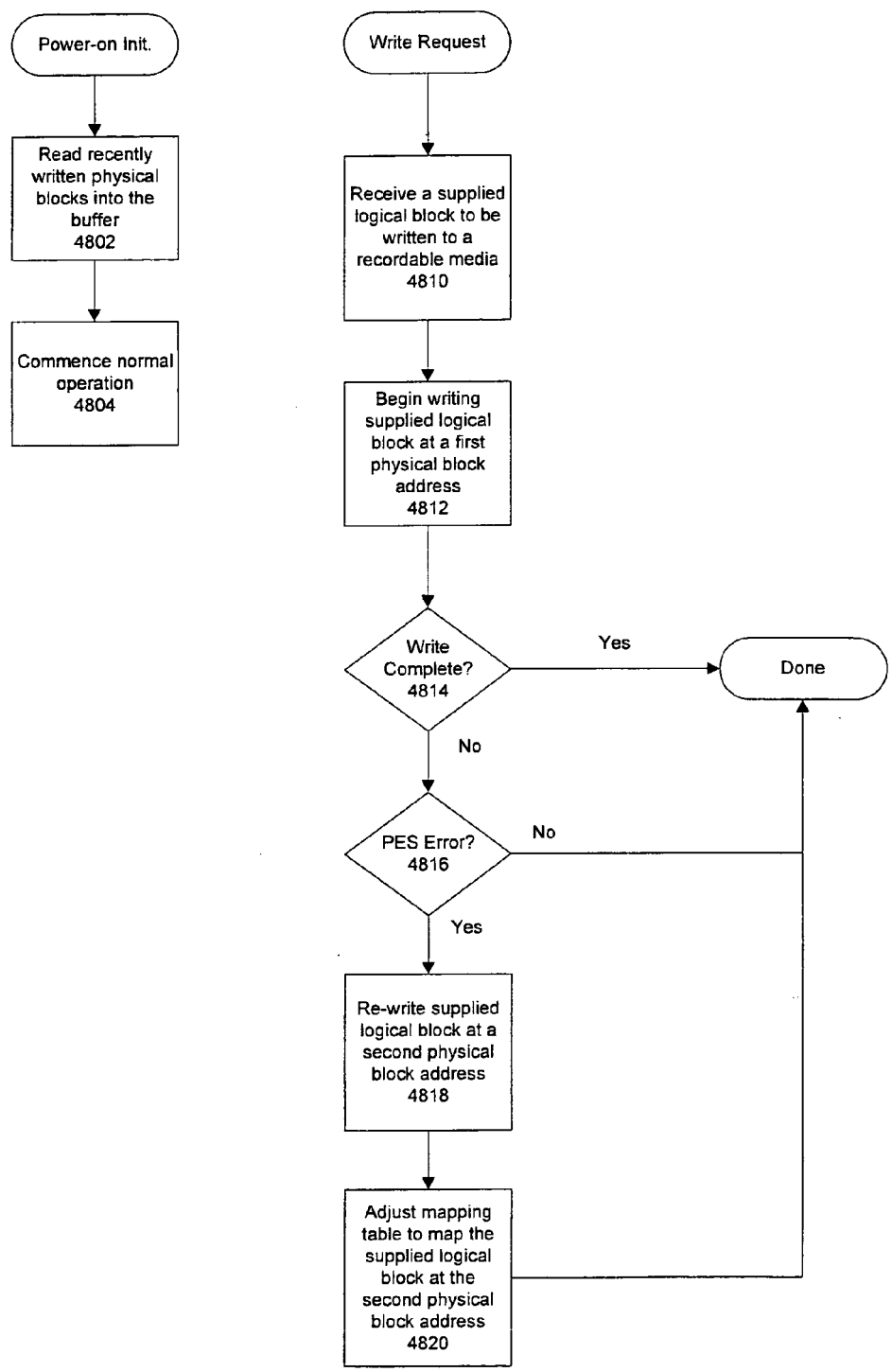
FIG. 48 is a flowchart representing an exemplary method operable within a storage device controller (e.g., disk controller) in conjunction with the mapping features and aspects discussed herein above for handling off-track position errors.

FIG. 48 is a flowchart representing an exemplary method operable within a storage device controller (e.g., disk controller 106 of FIG. 45) in conjunction with the mapping features and aspects discussed herein above for handling off-track position errors. In particular, FIG. 48 broadly represents a method operable within disk controller 106 in accordance with features and aspects hereof to provide recovery from a write fault error. In steady state operation of a dynamically mapped storage device, a buffer stores the most recently written blocks of information (written to sequential physical locations regardless of host supplied logical address). The buffer is managed in a circular fashion discussed above such that new data to be written is added to the buffer in space vacated by older written, information.

When the disk drive is first powered on or reset, a buffer is filled with recently written physical blocks (e.g., the most recently written tracks). The recently written physical blocks are used to recover from an off-track position error or any other type of write error. Element 4802 represents disk controller 106 reading the recently written physical blocks into the buffer. Element 4804 represents disk controller 106 commencing normal operation. The disk drive may continue to store in a buffer the recently written physical blocks. As the disk drive continues normal operations and writes logical blocks supplied by an attached host, the contents of the buffer may change to reflect the recently written physical blocks written to the recordable media after execution of element 4802. Thus, subsequently written physical blocks may be added to the buffer, and the oldest previously written physical blocks in the buffer may be dropped or replaced from the buffer as new data is added. For instance, the buffer may be a circular buffer, and newly written physical blocks replace the most previously written physical blocks. Those of ordinary skill in the art will recognize that the size of the buffer may be selected depending on various design criteria. For instance, the buffer may store several tracks of recently written data to recover from an off-track position error that encroaches data on another track several tracks away.

Once normal operations of the disk drive commence, the disk drive may receive a write request from an attached host. Element 4810 represents disk controller 106 receiving a supplied logical block to be written to a recordable media. The supplied logical block may be provided by an attached host, or may be provided by disk controller 106 for internal use by the disk drive. Element 4812 represents disk controller 106 beginning to write the supplied logical block at a first physical block address of the recordable media.

In 4814, disk controller 106 determines whether the write is complete (e.g., whether all blocks buffered to be written have been successfully written). If the writing process is complete, then the write request is finished. If the write is not complete, then disk controller 106 determines whether an off-track position error has occurred in element 4816. The off-track position error for example may be signaled by a position error signal (PES). If no position error has occurred, then the write request is completed.

If an off-track position error has occurred while writing a block, then the incorrectly written logical block may be rewritten later at a second physical block address of the recordable media. Element 4818 represents disk controller 106 re-writing the supplied logical block at the second physical block address. Element 4820 represents disk controller 106 adjusting a mapping table to map the supplied logical block at the second physical block address. After the mapping table is adjusted, the write request is finished.

Figure 49:
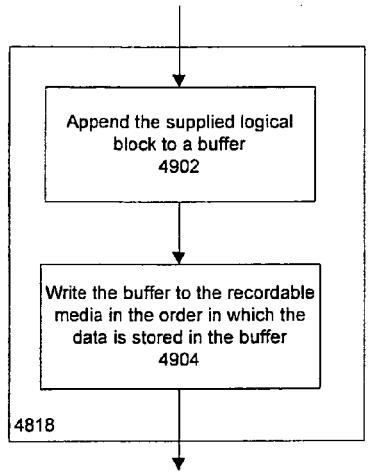
FIG. 49 is a flowchart providing exemplary additional details of the processing of FIG. 48.

FIG. 49 is a flowchart providing exemplary additional details of the processing of element 4818 of FIG. 48. As noted above, element 4818 is generally operable to re-write supplied logical blocks at a second physical block address of the recordable media. Element 4902 represents disk controller 106 appending the supplied logical block to a buffer to be written to the recordable media. Element 4904 represents disk controller 106 writing the buffer to the recordable media in the order in which the data is stored in the buffer. Thus, the supplied logical block is re-written at the second physical block address responsive to reaching a position in the buffer of the supplied logical block. The buffer will be described in additional detail below.

Figure 50:
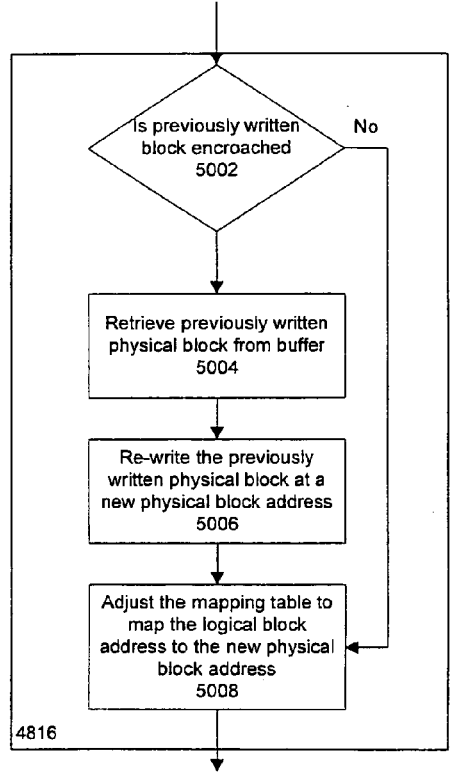
FIG. 50 is a flowchart providing exemplary additional details of another embodiment of the processing of FIG. 48.

FIG. 50 is a flowchart providing exemplary additional details of the processing of element 4816 of FIG. 48. As noted above, element 4816 is generally operable to re-write a supplied logical block at a second physical block address of the recordable media. In particular, FIG. 50 broadly represents a method operable within the storage controller in accordance with features and aspects hereof to provide recovery of a previously written physical block encroached during a write fault error. As described with respect to FIG. 48, an off-track position error may encroach a previously written physical block. In addition to re-writing the incorrectly written physical block, disk controller 106 may need to re-write the encroached previously written physical block. Element 5002 represents disk controller 106 determining whether a previously written physical block has been encroached during the off-track position error. If no encroachment has occurred, then processing may continue at element 4818.

If the previously written physical block has been encroached during the off-track position error, then disk controller 106 retrieves the previously written physical block from the buffer in element 5004. As discussed above, disk controller 106 stores tracks of previously written physical blocks in a buffer to allow recovery from an off-track position error.

Element 5006 represents disk controller 106 re-writing the previously written physical block at a new physical block address of the recordable media. The previously written physical block is associated with a logical block address in the mapping table. Element 5006 represents disk controller 106 adjusting the mapping table to map the logical block address to the new physical block address. Thus, rather than stopping the writing process to re-write the encroached previously written physical block, disk controller 106 may re-write the encroached logical block in the sequence of supplied logical blocks currently being written to the recordable media.

Figure 46:
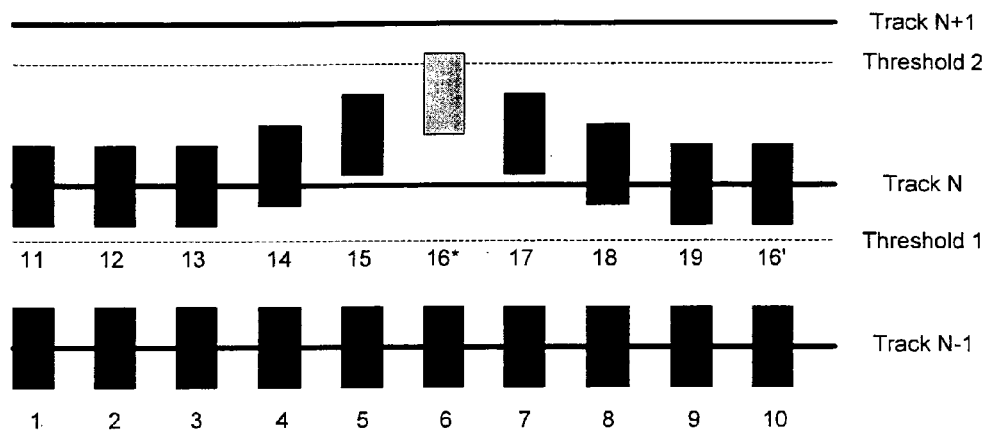
FIG. 46 illustrates an off-track position error in a direction in which no encroachment of an adjacent track may occur.

An off-track position error may occur in two directions, in one direction no data may be encroached, and in another direction data may be encroached. FIG. 46 illustrates an off-track position error in a direction in which no encroachment of an adjacent track may occur. A sequence of logical blocks numbered 1-10 are previously written on track N−1. Further, logical blocks 11-17 are buffered to be written on track N. As the blocks are written, an off track (PES) error may occur. The write head is shown presently writing data to track N. Threshold 1 represents a position of the write head in a direction in which encroachment of an adjacent track (Track N−1) may occur. Threshold 2 represents a position of the write head in a direction in which no encroachment of an adjacent track may occur (Track N+1). As the disk drive writes Track N, the write head deviates from the track center of Track N in the direction of Track N+1, a presently unwritten track. Once a supplied logical block is written by the write head past threshold 2 (e.g., supplied logical block 16*), an off-track position error occurs, and the supplied logical block may need to be re-written. Supplied logical block 16 may be re-written at a second physical block address (e.g., supplied logical block 16'). For example, the write head continues writing a sequence of supplied logical blocks, and re-writes the incorrectly written supplied logical block at the end of sequence. Thus, the writing process is not aborted, and writing continues without a performance loss of one or more revolutions of the disk drive. Alternatively, the write head may re-write the incorrectly written logical block prior to continuing writing the sequence of supplied logical blocks to maintain a logical order of the blocks.

Figure 47:
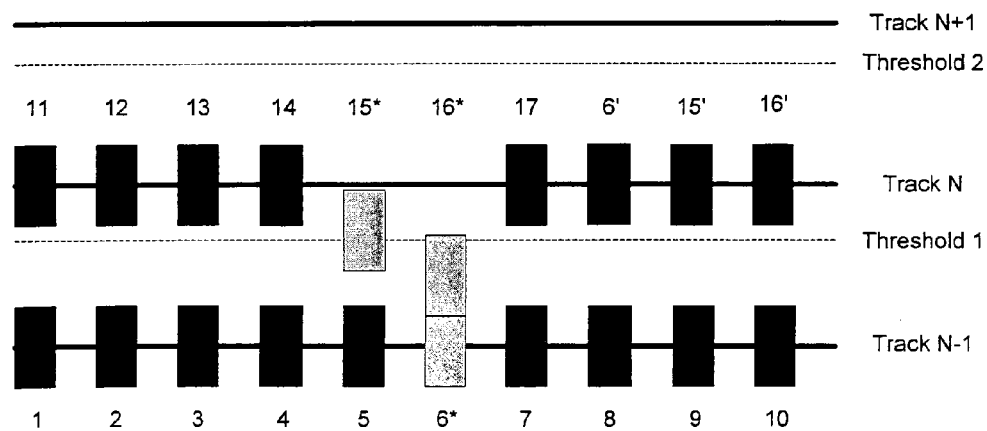
FIG. 47 illustrates an off-track position error in a direction in which encroachment of an adjacent track may occur.

FIG. 47 is similar to FIG. 46 showing writing of logical blocks 1-10 on track N−1 and blocks 11-17 on track N. The off track position error is in a direction in which encroachment of an adjacent track occurs. As the disk drive writes Track N, the write head is shown deviating from the track center of Track N in the direction of Track N−1, a previously written track. An off-track position error occurs, and supplied logical blocks 15 and 16 are incorrectly written past Threshold 1, encroaching Track N−1. Further, supplied logical block 16 encroaches onto supplied logical block 6. Thus, logical blocks 6, 15 and 16 may be rewritten following the completion of writing the sequence of supplied logical blocks to the recordable media. Since the disk drive stores recently written physical blocks in a buffer, logical block 6 may be recovered from the buffer, and be re-written in Track N (e.g., logical block 6'). Logical blocks 15 and 16 may be re-written as illustrated by logical blocks 15' and 16'. Thus, the disk drive recovers from the write fault without aborting the writing process, and the encroached physical block is recovered and rewritten at a second physical block address. Performance losses associated with moving the write head back to the location of the encroached physical block are eliminated.

Figure 56:
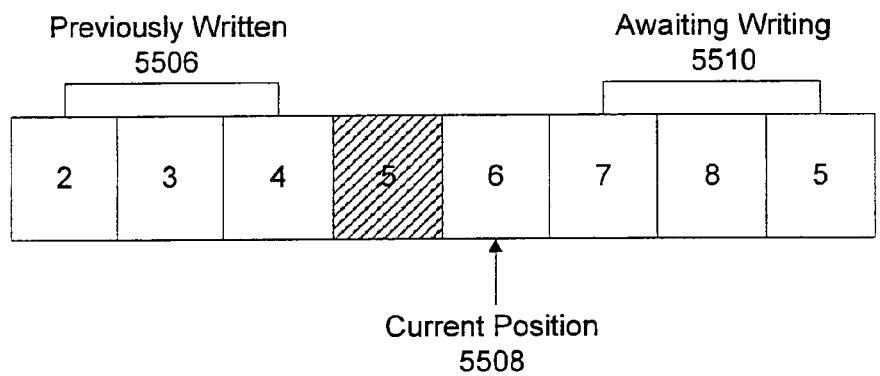
Figure 57:
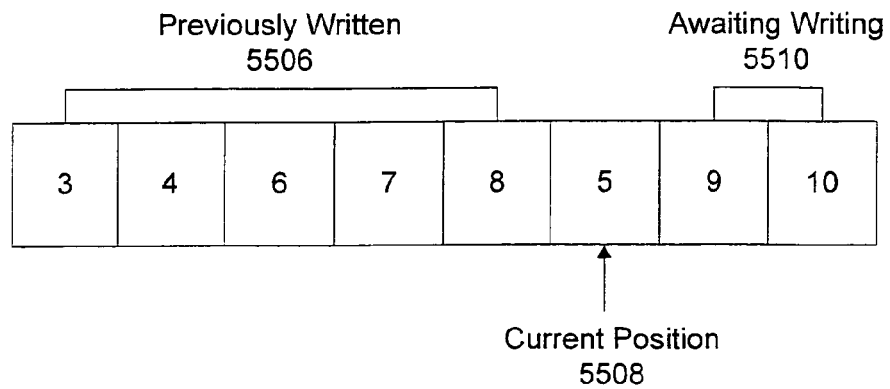
Figure 58:
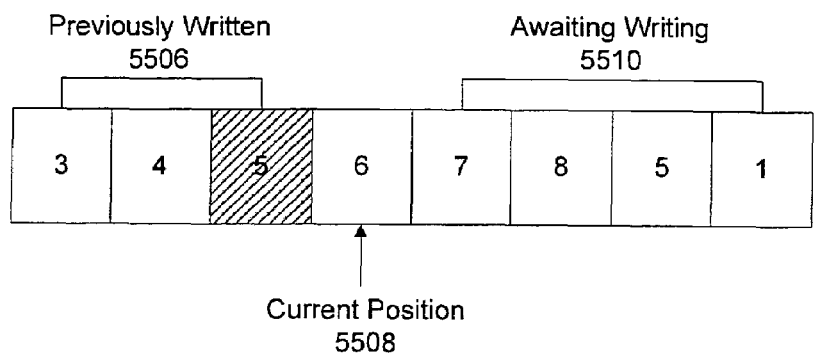

As can be seen in FIGS. 46-47, recovery from such off-track write errors uses previously written information from an adjacent encroached track. Such previously written data and new data to be written may be stored in a buffer (referred to above in FIG. 9 as a "write band"). FIGS. 55-58 are block diagrams depicting an exemplary buffer used by a disk drive. Buffer 5500 as illustrated is a circular buffer storing recent previously written physical blocks 5506, as well as physical blocks awaiting writing 5510. Those of ordinary skill in the art will recognize that buffer 5500 may be of any type of equivalent data structure capable of storing recent previously written physical blocks 5506 as well as physical blocks awaiting writing 5510. As is generally known if the art, data for a write request may simply be queued for later posting with the requested write data stored in the cache memory (e.g., buffer 5500) or otherwise managed within disk controller 106. Such techniques are often referred to as write-back caching in that the request is completed with respect to the host as soon as the disk controller has the request stored in its local cache memory. The data is then later posted or flushed to the persistent recordable media under control of the disk controller. FIGS. 56-58 illustrate the contents of buffer 5500 as operations modify buffer 5500.

When moving through buffer 5500 during the writing process, disk controller 106 moves forward one step each time data is written, and when disk controller 106 passes the end of buffer 5500, then disk controller 106 starts again at the beginning. The size of circular buffer 5500 may be selected to store several tracks of previously written data, as well as to provide adequate capacity to accommodate pending write requests received from an attached host. As discussed above, the size of a write band 900 is a function for example of the write cache size (e.g., buffer 5500) of disk controller 106. The current write band represents available physical locations for writing of host supplied data in response to received write requests. Thus, the size of buffer 5500 may be selected to correspond to write band 900 used by the dynamically mapped storage device, or may be a smaller portion of the "write band" size such as a few tracks of stored data.

As discussed above, the previously written physical blocks stored in buffer 5500 are used to recover from an off-track position error encroaching on previously written data. When the disk drive first powers on, several tracks of previously written physical blocks may be read and stored in buffer 5500. Current position 5508 represents a supplied logical block presently being written or next to be written to the recordable media by the write head. Those of ordinary skill in the art will recognize that a typical buffer used in a disk drive would be larger than illustrated in FIG. 5500, and buffer 5500 is shown with eight positions for simplicity of this discussion.

Figure 55:
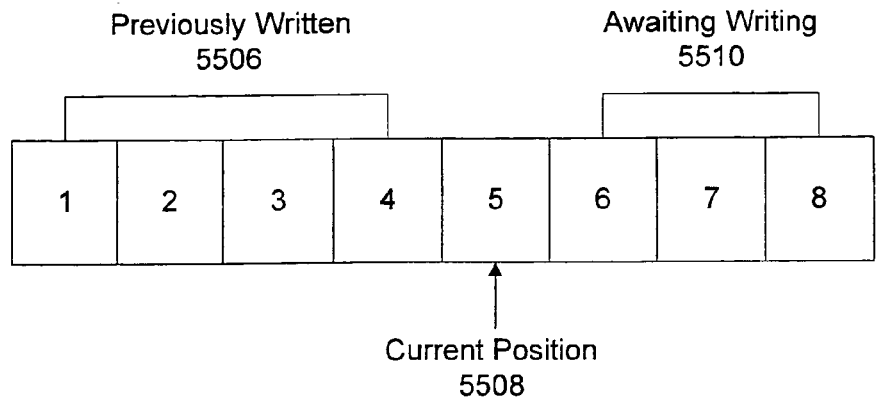
FIGS. 55-58 are block diagrams depicting an exemplary buffer used by a disk controller.

In FIG. 55, the current position 5508 of the buffer 5500 is at logical block 5, indicating that the write head is currently writing logical block 5 to the recordable media. Logical blocks 1-4 are previously written 5506, (i.e. earlier on the current track and on one or more earlier adjacent tracks) and logical blocks 6-8 are awaiting writing 5510. Assume that an off-track position error occurs while writing logical block 5. Logical block 5 may be appended to buffer 5500 by element 4902 to be later rewritten at a new physical location.

FIG. 56 illustrates the contents of buffer 5500 after logical block 5 is appended to buffer 5500. The position of logical block 5 in buffer 5500 is no longer between the position of logical blocks 4 and 6. Rather, the position of logical block 5 has changed to the end of buffer 5500. The current position 5608 of buffer 5500 is now logical block 6, and logical blocks 7-8 and 5 are awaiting writing 5610.

FIG. 57 illustrates the contents of buffer 5500 once the current position 5708 again reaches logical block 5 after logical blocks 6-8 are written to the recordable media. Thus, logical blocks 3-4 and 6-8 are shown as previously written 5706, and two more logical blocks 9 and 10 have been added (appended) to the buffer 5500 following the new position of logical block 5, and are awaiting writing 5710. Thus, logical block 5 will follow logical block 8 on the recordable media.

Referring back to FIG. 55, assume that the current position 5508 is logical block 5, and further assume for example that while writing logical block 5 in element 4812 that logical block 1 is encroached during the off-track position error and needs to be rewritten. FIG. 58 illustrates the contents of buffer 5500 after disk controller 106 appends logical blocks 1 and 5 to buffer 5500. Logical block 2 is not shown because it is deemed far enough away to not be encroached. Written blocks that fall out of a buffer do so because they are sufficiently far away as to not be encroached by subsequent writes with off-track position errors. Logical blocks 3 and 4 are previously written 5806, and logical blocks 7-8, 1 and 5 are awaiting writing 5810. The current position 5800 of buffer 5500 is presently logical block 6. Thus, logical blocks 1 and 5 may be re-written on the recordable media following logical block 8. Those of ordinary skill in art will recognize that logical blocks 1 and 5 may be re-written in any order. Thus, logical block 1 may be re-written before logical block 5, or logical block 5 may be re-written before logical block 1.

Those of ordinary skill in the art will recognize that an off-track position error would normally encroach a logical block at least one track length of data away from the current position 5508. Thus, the writing of logical block 5 would not normally encroach a logical or physical block four positions away. The length of distance between current position 5508 and logical block 1 is shown for the sake of simplicity of the discussion.

Figure 51:
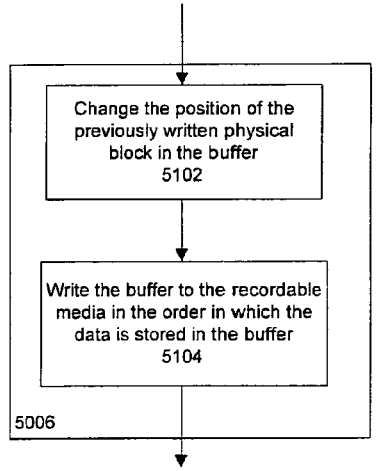
FIG. 51 is a flowchart providing exemplary additional details of the processing of FIG. 50.

FIG. 51 is a flowchart providing exemplary additional details of the processing of element 5006 of FIG. 50. As noted above, element 5006 is generally operable to re-write the previously written physical block at a new physical block address of the recordable media. Since the previously written physical block is stored in a buffer including previously written logical blocks as well as logical blocks to be written, disk controller 106 may change the position of the previously written physical block in the buffer to follow logical blocks to be written to the recordable media.

Element 5102 represents disk controller 106 changing the position of the previously written physical block in buffer 5500. Element 5104 represents disk controller 106 writing buffer 5500 to the recordable media in the order in which the data is stored in buffer 5500. Thus, the previously written physical block is re-written at the new physical block address responsive to reaching a position in buffer 5500 of the previously written physical block. For instance, assume that logical block 1 in FIG. 55 is encroached during the off-track position error and needs to be re-written. Prior to the encroachment, logical block 1 is previously written 5506. The position of logical block 1 may be changed in buffer 5500, as illustrated in FIG. 58, so that logical block 1 is now awaiting writing 5810.

Figure 52:
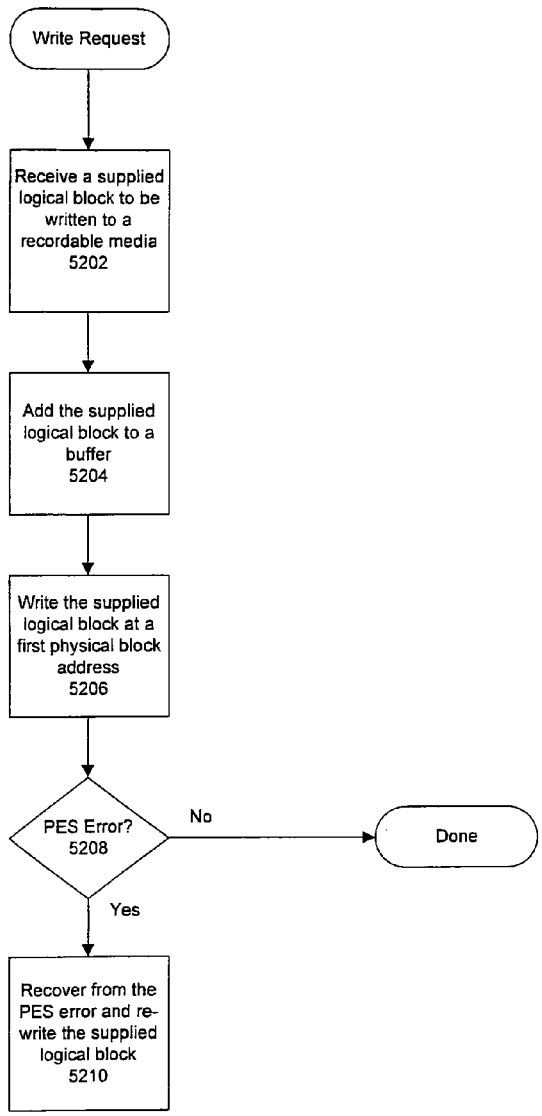
FIG. 52 is a flowchart representing another exemplary method operable within a storage device controller (e.g., disk controller) in conjunction with the mapping features and aspects discussed herein above for handling off-track position errors.

FIG. 52 is a flowchart representing another exemplary method operable within a storage device controller (e.g., disk controller) in conjunction with the mapping features and aspects discussed herein above for handling off-track position errors. In particular, FIG. 52 broadly represents a method operable within the storage controller in accordance with features and aspects hereof to provide recovery from a write fault error.

Element 5202 represents write request processing element 4500 receiving a supplied logical block to be written to a recordable media. The supplied logical block may be provided by an attached host, or may be provided by disk controller 106 for internal use by the disk drive.

Element 5204 represents write request processing element 4500 adding the supplied logical block to a buffer. For instance, the supplied logical block may be appended to buffer 5500 as illustrated by logical block 9 awaiting writing 5710 in FIG. 57.

Element 5206 represents write request processing 4500 writing the supplied logical block at a first physical block address of the recordable media. In 5208, position error detection element 4508 determines whether an off-track position error has occurred. If no position error has occurred, then the write request is completed.

If a position error has occurred, then write disk controller 106 recovers from the off-track position error and re-writes the supplied logical block at a second physical block address.

Figure 53:
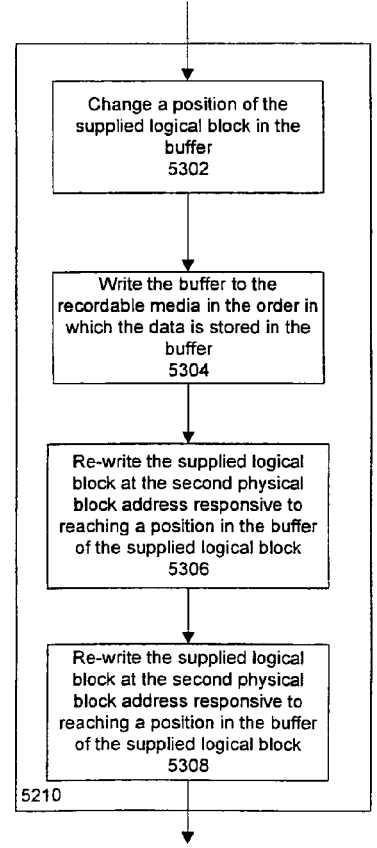
FIG. 53 is a flowchart providing exemplary additional details of the processing of FIG. 52.

FIG. 53 is a flowchart providing exemplary additional details of the processing of element 5210 of FIG. 52. As noted above, element 5210 is generally operable to recover from the off-track position error. Element 5302 represents disk controller 106 changing a position of the supplied logical block in the buffer. Element 5102 represents disk controller 106 changing the position of the previously written physical block in the buffer. Element 5104 represents disk controller 106 writing the buffer to the recordable media in the order in which the data is stored in the buffer. Thus, the previously written physical block is re-written at the new physical block address responsive to reaching a position in the buffer of the previously written physical block. For instance, assume that logical block 1 in FIG. 55 is encroached and needs to be re-written. Prior to the encroachment, logical block 1 is previously written 5506. The position of logical block 1 may be changed, as illustrated in FIG. 58, so that logical block 1 is now awaiting writing 5810.

Figure 54:
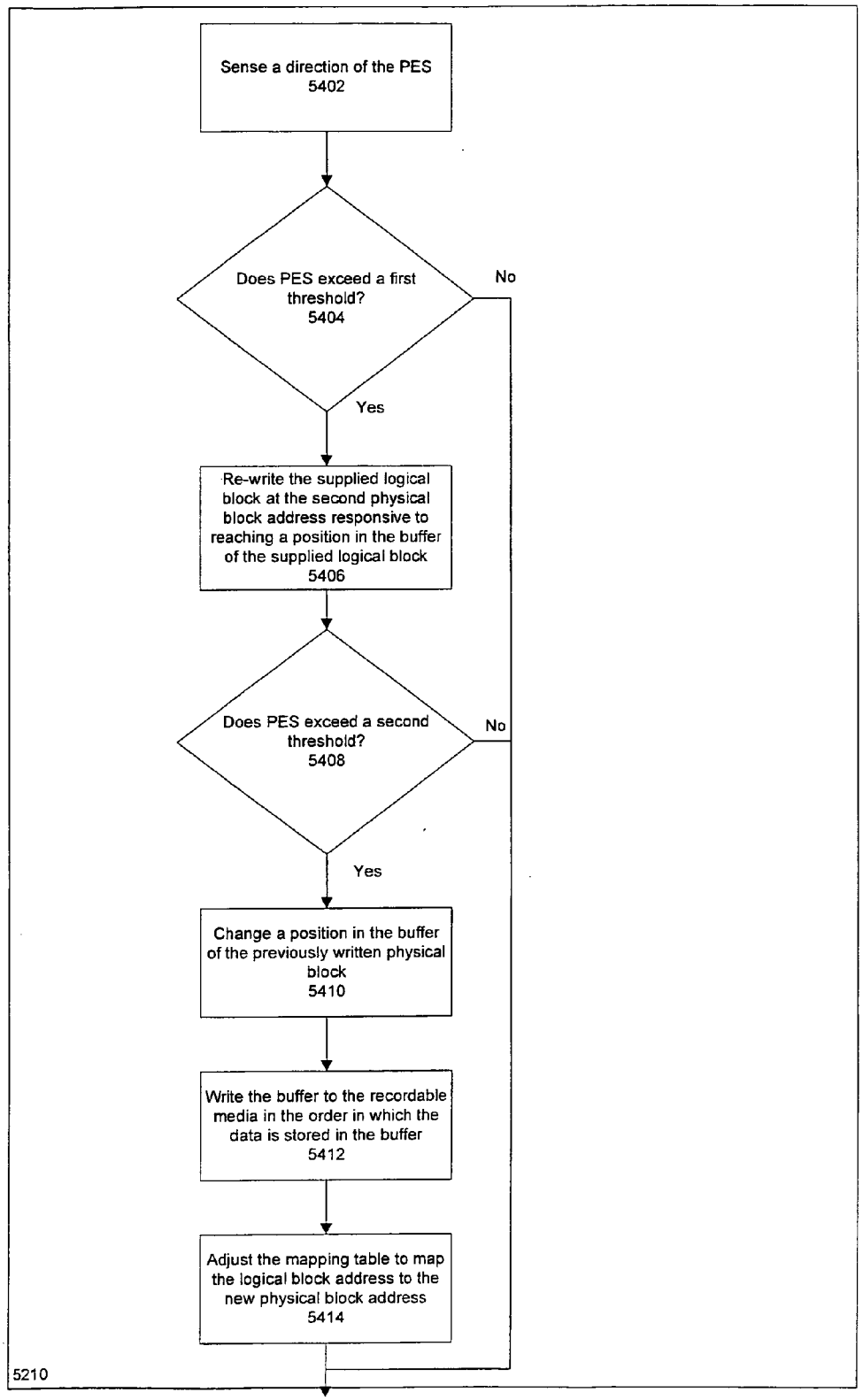
FIG. 54 is a flowchart providing exemplary additional details of the processing of FIG. 52.

FIG. 54 is a flowchart providing exemplary additional details of another embodiment of the processing of element 5210 of FIG. 52. As noted above, element 5210 is generally operable to re-recover from the off-track position error. Element 5402 represents disk controller 106 sensing a direction of the off-track position error. Element 5404 represents disk controller 106 determining whether the off-track position error exceeds a first threshold. For instance, exceeding the first threshold may indicate that data stored in the first physical block address (e.g., the supplied logical block) is unreliable, and that the supplied logical block needs to be re-written. If the first threshold is not exceeded, then the write request is complete.

If the first threshold is exceeded, then in element 5406 disk controller 106 re-writes the supplied logical block at the second physical block address responsive to reaching a position in the buffer of the supplied logical block.

Element 5406 represents disk controller 106 determining whether the off-track position error exceeds a second threshold. For instance, exceeding the second threshold may indicate that data stored in the previously written physical block is unreliable, and that the previously written physical block needs to be re-written. If the second threshold is not exceeded, then the write request is complete.

If the first threshold is exceeded, then in element 5410 disk controller 106 changes a position in the buffer of the previously written physical block. Element 5412 represents disk controller 106 writing the buffer to the recordable media in the order in which the data is stored in the buffer. Thus, the previously written physical block is re-written at the new physical block address responsive to reaching a position in the buffer of the previously written physical block. Element 5412 represents disk controller 106 adjusting the mapping table to map the previously written physical block to the new physical block address.

Those of ordinary skill in the art will readily recognize that the methods of FIGS. 48 through 54 are intended merely as exemplary of possible embodiments of methods in accordance with features and aspects hereof to handling of write fault errors encountered in a dynamically mapped storage device. Numerous equivalent methods and techniques will be readily apparent to those of ordinary skill in the art to implement such features as a matter of design choice.

On-the-Fly Head Depopulation

If a subsection of a storage device (e.g., a head or surface) fails, the data stored in the subsection is typically lost. Typically as presently practiced when a head is predicted by a disk drive to be failing, the failing condition can be signaled to the user, but no other action is performed to protect the user's data on that subsection. Thus, if the user does not take corrective action, for example by copying the data to another disk drive, then the data may be lost if the subsection eventually fails. Because the LBA directly maps to the particular cylinder, head and sector where data should be located, data may not be migrated onto another surface by present day disk drives.

In accordance with features and aspects hereof, all user data written to the dynamically mapped storage device is dynamically mapped from the user supplied logical address space (logical block addresses or LBAs) to the physical disk block address space (disk block addresses or DBAs—blocks of variable, independent size relative to the LBA size). Thus, features and aspects hereof permit on-the-fly head depopulation to protect customer data in the event of a possible head or surface failure. If the disk drive detects a defective or failing head or surface, data on the surface may be migrated to other physical locations (e.g., a different surface) on the disk drive. The disk drive further changes the mapping table to reflect that the data has been migrated from one surface to another surface. Thus, if the head fails, the data on the surface is protected through migration to a non-failing surface. From the perspective of the attached host, the data is still available in the same manner as before the head failure. While the disk drive may operate with a diminished capacity due to the unavailability of a surface, a loss of the data has been avoided.

Figure 59:
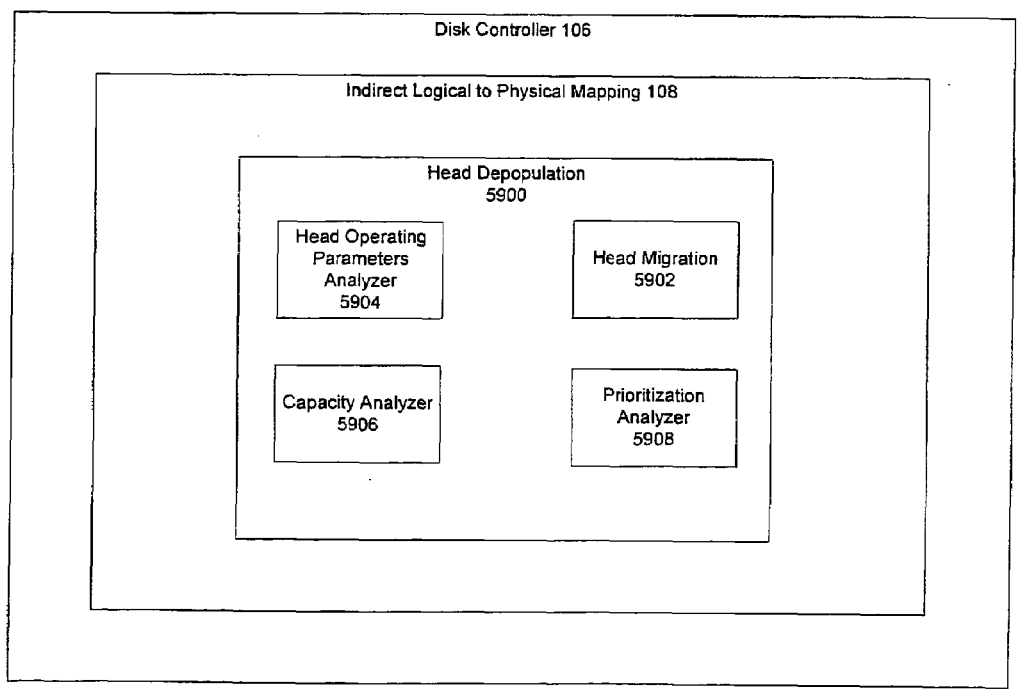
FIG. 59 is a block diagram providing additional exemplary details of a disk controller as in FIG. 1 enhanced to perform on-the-fly head depopulation.

FIG. 59 is a block diagram providing additional exemplary details of a disk controller as in FIG. 1 enhanced to perform on-the-fly head depopulation. As noted above, disk controller 106 may include indirect logical to physical mapping element 108 generally responsible for dynamic mapping features of the storage device. An aspect of the logical to physical mapping element 108 may include head depopulation element 5900 operable to perform on-the-fly head depopulation. Head depopulation element 5900 may include various elements to aid in the protection of data on a failing surface detected by head operating parameters analyzer element 5904. Head operating parameters analyzer element 5904 may monitor the operating parameters of a head or read/write channel to detect potential reliability issues in the operation of the head, as well as determining whether the head and/or read/write channel are failing. For example, head operating temperature, bit error rates from reading of data, shock and vibration event statistics, etc. may all be used by head operating parameters analyzer element 5904 to detect a possibly failing head. The parameters may also be indicative of a failure of the recording surface associated with the head. In further sensing a falling surface, head or read/write channel, features and aspects hereof may act to migrate information to another head (surface/channel). Head migration element 5902 processes the migration of data from a failing head, channel or surface to another surface in the event of a possible head failure. Migration may include re-writing or re-mapping logical blocks from the failing surface to another surface. As used herein, failure of a head, channel or surface are considered synonymous with respect to head depopulation actions.

In some instances, it may not be possible to migrate all of the data from a failing surface to another surface. For instance, the other surface may not have sufficient capacity to hold the data stored on the failing surface. Head depopulation element 5900 may include capacity analyzer element 5906 for analyzing the current capacity of the disk drive and the individual recordable surfaces of the disk drive. Thus, capacity analyzer element 5906 may determine that sufficient capacity does not exist on another surface to migrate all of the data stored on the failing surface. Prioritization analyzer element 5908 may prioritize the migration of data from the failing surface onto another surface to ensure that critical data, such as system files, are migrated before other data. For example, prioritization analyzer element 5908 may select blocks deemed to be critical such as file directory and FAT table structures stored as user data on the dynamically mapped storage device. Or, for example, data that is observed to be frequently accessed may be selected for prioritization as critical data based on its frequency of access. Other less critical data may have a lower prioritization and be migrated after critical data. Numerous other heuristic rules will be readily apparent to those of ordinary skill in the art to identify critical data that may be prioritized by prioritization analyzer element 5908 in accordance with features and aspects hereof.

Those of ordinary skill in the art will readily recognize that the various functional elements 5900 through 5908 shown as operable within the indirect logical to physical mapping element 108 of disk controller 106 may be combined into fewer discrete elements or may be broken up into a larger number of discrete functional elements as a matter of design choice. Thus, the particular functional decomposition suggested by FIG. 59 is intended merely as exemplary of one possible functional decomposition of elements within disk controller 106.

Figure 61:
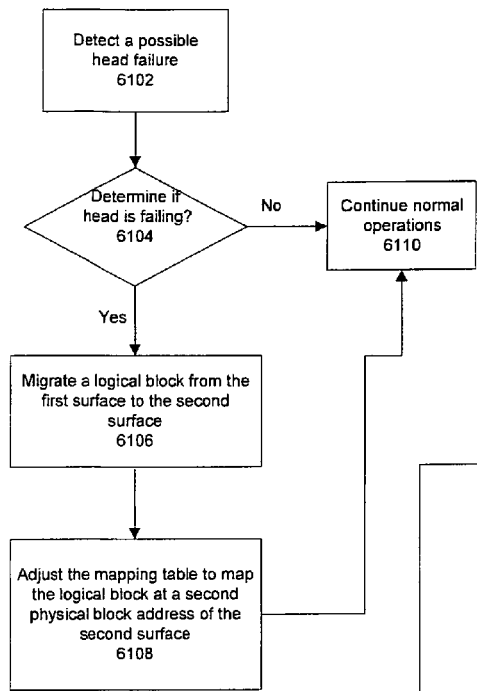
FIG. 61 is a flowchart representing an exemplary method operable within a storage device controller (e.g., disk controller) in conjunction with the mapping features and aspects discussed herein above for performing on-the-fly head depopulation.

FIG. 61 is a flowchart representing an exemplary method operable within a storage device controller (e.g., disk controller) in conjunction with the mapping features and aspects discussed herein above for performing on-the-fly head depopulation. In particular, FIG. 61 broadly represents a method operable within the storage controller in accordance with features and aspects hereof to migrate a logical block from a failing head surface to another surface. Element 6102 represents disk controller 106 detecting a possible head failure. For instance, disk controller 106 may detect that the read head continually returns read errors while processing read requests. Those of ordinary skill in the art will recognize a variety of factors that may be used to detect a possible head failure.

Element 6104 represents the disk controller 106 determining whether the read head is failing. A variety of causes may trigger errors on the read head, and the disk controller 106 may determine whether the read head is actually failing. If the head is not failing, then normal operations of the disk drive may be continued in element 6110.

If disk controller 106 determines that the surface is failing, then the disk controller migrates a logical block from the first surface (e.g., failing surface) to a second surface (e.g., non-failing surface) in element 6106. For instance, a logical block may be migrated from a first physical block address on the first surface to a second physical block address on a second surface. FIG. 60 is a schematic diagram of an exemplary disk drive including multiple recording surfaces. First surface 6000 (e.g., the failing surface) comprises a logical block stored in a first physical block address 6004. Element 6106 migrates the logical block to a second surface 6002, and stores the logical block at a second physical block address 6006 of the second surface. Those of ordinary skill in the art will recognize that read/write head assemblies are often shared between two adjacent surfaces. Thus, a failing head may require migration of data from both surfaces sharing the read/write head assembly.

All of the data on the first surface may be migrated to the second surface at once, or the disk controller 106 may migrate the data during spare or idle processing cycles of the disk drive. "Idle" periods or cycles of the disk controller may be defined as periods in which no read or write request is being processed or is pending, or more broadly, periods during which no host requested operations are currently in process or pending. Thus, the attached host may not notice a significant performance drop of the disk drive during the migration process.

Element 6108 represents disk controller 106 adjusting the mapping table of the disk drive to map the logical block at the second physical block address of the second surface. Thereafter, if the attached host requests the logical block using the LBA, then the disk drive will access the logical block from the second physical block address. The method illustrated in FIG. 61 may be repeated to migrate a selected portion or all of the logical blocks stored on the failing head or surface.

Figure 63:
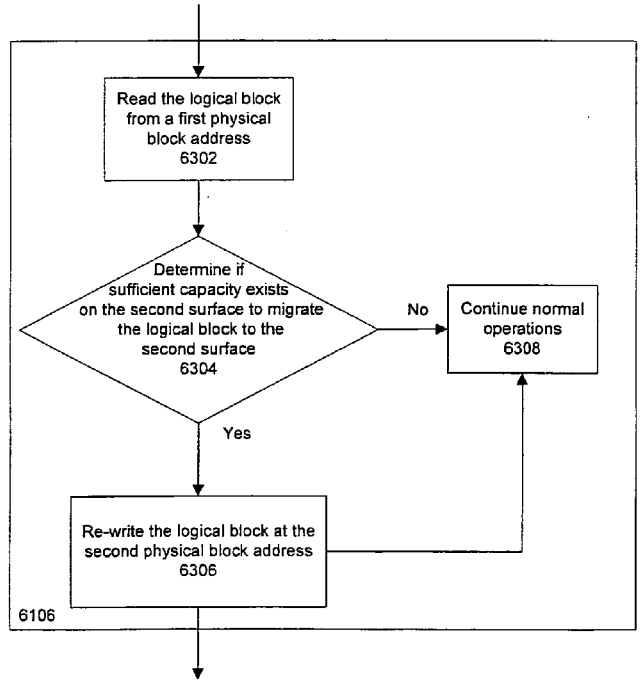
FIG. 63 is a flowchart providing exemplary additional details of another embodiment of the processing of FIG. 61.

FIG. 63 is a flowchart providing exemplary additional details of the processing of one embodiment of element 6106 of FIG. 61. As noted above, element 6106 is generally operable to migrate the logical block to a second physical block address on a second surface of the recordable media. Element 6302 represents reading the logical block from the first physical block address. Element 6304 represents disk controller 106 determining whether sufficient capacity exists on the second surface to migrate the logical block to the second surface. If sufficient capacity does not exist on the second surface to migrate the logical block, then normal operations of the disk drive continue at element 6308. If sufficient capacity exists on the second surface to migrate the logical block, then the logical block is re-written at the second physical block address in element 6306.

Figure 62:
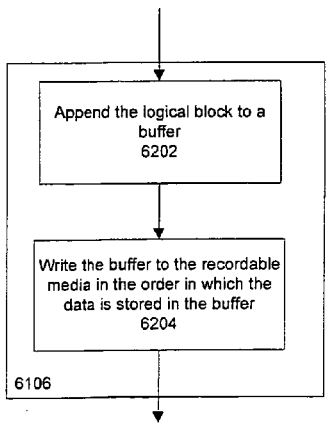
FIG. 62 is a flowchart providing exemplary additional details of the processing of FIG. 61.

FIG. 62 is a flowchart providing exemplary additional details of the processing of another embodiment of element 6106 of FIG. 61. As noted above, element 6106 is generally operable to migrate the supplied logical block to a second physical block address. Element 6202 represents appending the logical block to a buffer to be written to the recordable media. As discussed previously with respect to FIGS. 55-58, the dynamically mapped storage device may store pending write requests that may be written to sequential physical blocks in the order in which data is stored in the buffer. Additional details regarding the operation of the buffer are provided above in the discussion of FIGS. 55-58. Element 6204 represents writing the buffer to the recordable media in the order in which the data in stored in the buffer. Thus, the supplied logical block is re-written at the second physical block address responsive to reaching a position in the buffer of the supplied logical block.

Figure 64:
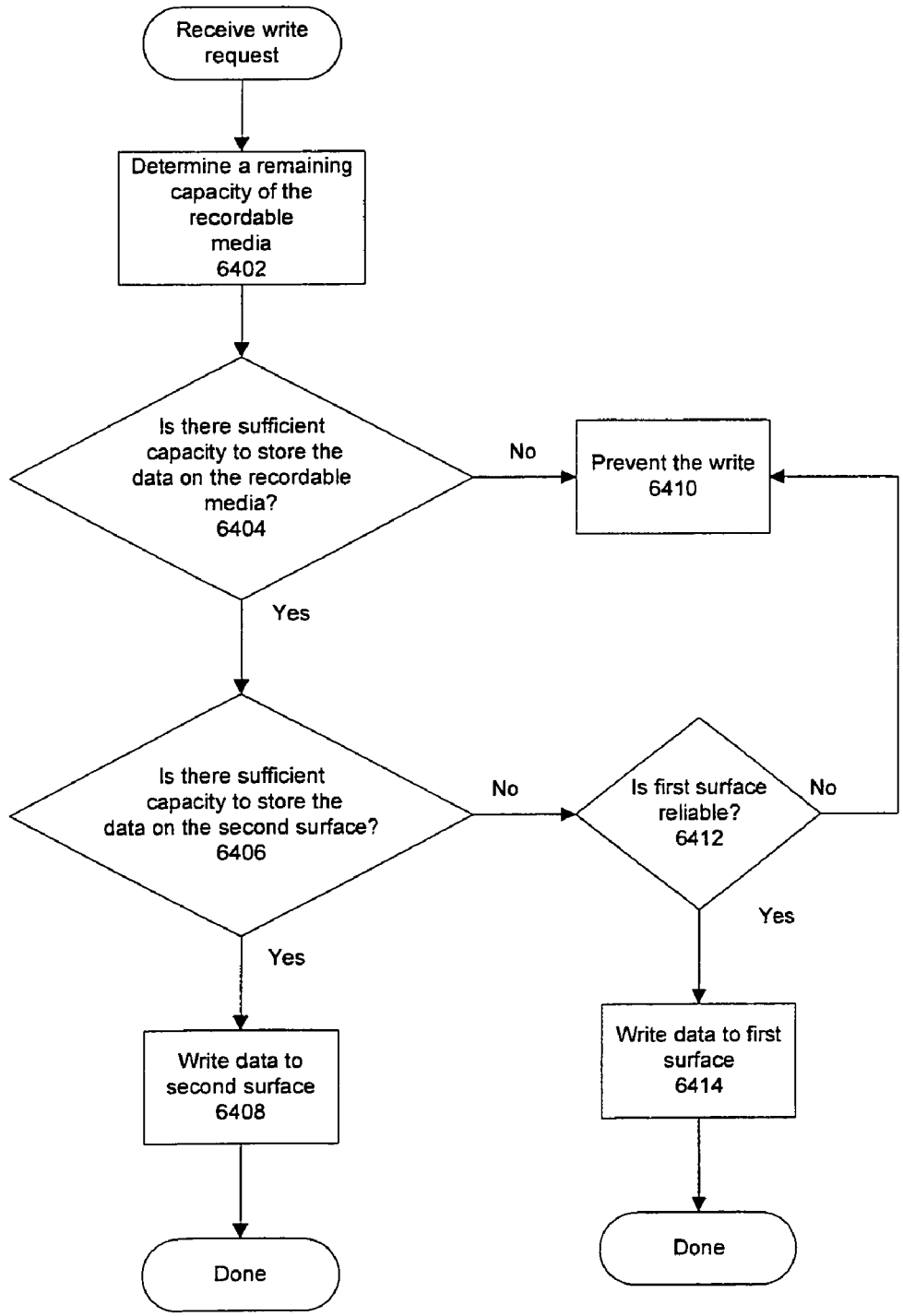
FIG. 64 is a flowchart representing an exemplary method operable within a storage device controller (e.g., disk controller) in conjunction with the mapping features and aspects discussed herein above for performing on-the-fly head depopulation.

FIG. 64 is a flowchart representing an exemplary method operable within a storage device controller (e.g., disk controller) in conjunction with the mapping features and aspects discussed herein above for performing on-the-fly head depopulation. In particular, FIG. 64 broadly represents a method operable within the storage controller in accordance with features and aspects hereof to provide processing of a subsequent write request received after the detection of a possible head failure. After data is migrated from the possible failing surface, it may be beneficial to prevent writing data to the possible failing surface. The disk drive may continue accepting data storage commands from the attached host as long as there is storage capacity remaining in good subsections.

Element 6402 represents disk controller 106 determining a remaining capacity of the recordable media. The remaining capacity may exclude a capacity of the first surface, as any data placed on the first surface may be at risk. This may depend on a probability that the first surface head may fail.

Element 6404 represents disk controller 106 determining whether there is sufficient capacity to store the data on the recordable media. If there is not sufficient capacity to store the data on the recordable media, then the write is prevented in element 6410. If sufficient capacity exists on the second surface, then the data is written to the second surface in element 6408, and the write request is complete.

If sufficient capacity does not exist on the second surface to store the data, then disk controller 106 may determine whether the first surface is reliable enough to store the data in element 6412. If the disk drive is near capacity, it may become necessary to store data on the possibly failing surface. When disk controller 106 is faced with an alternative of placing the data on a possibly failing surface or rejecting the storage of the data, it may be more beneficial to store the data at risk rather than rejecting the write request.

If disk controller 106 determines that the first surface is reliable enough to store the data on the first surface, then the data may be written to the first surface in element 6414, and the write request is complete. Otherwise, the write may be prevented in element 6410. For example, if the head on the first surface has failed, and the only remaining capacity is on the first surface, then the write may be prevented.

The method illustrated in FIG. 64 may be used to preferentially keep data off the weakest subsections identified at the time of manufacture. Thus, the weakest subsections may not be used until needed for providing full capacity of the dynamically mapped storage device. If a weak subsection is identified with a possible failing head, then a logical block may be written to other surfaces until the capacity of the weak subsection is needed. If a logical block is written on the weak subsection, and capacity subsequently becomes available on another surface, then a logical block may be migrated from the weak subsection to another surface.

Figure 65:
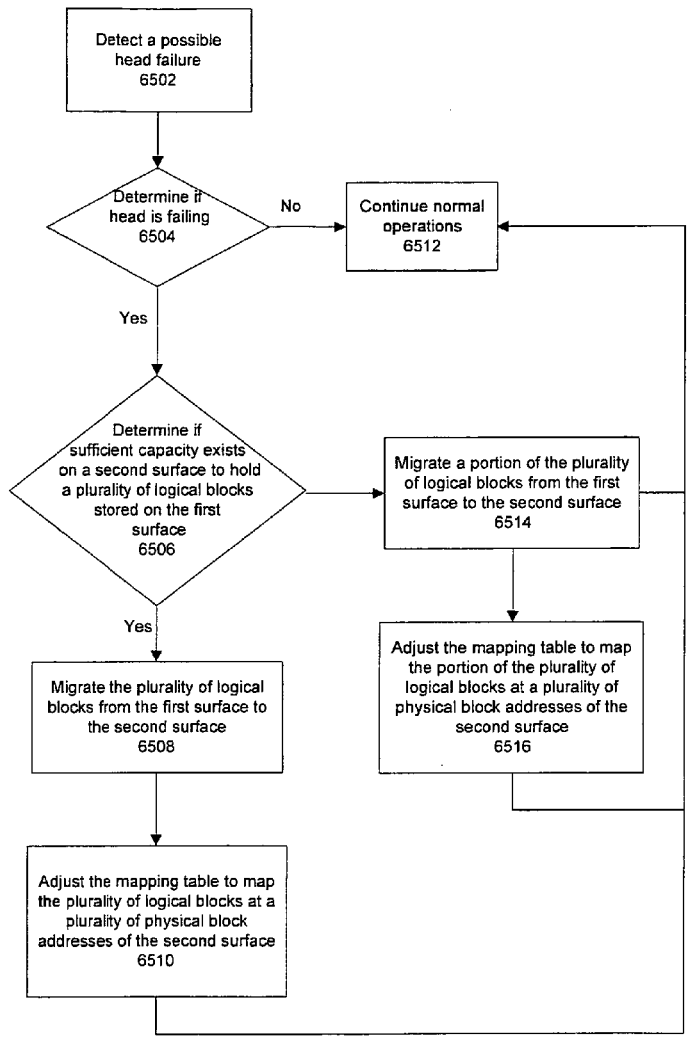
FIG. 65 is a flowchart representing another exemplary method operable within a storage device controller (e.g., disk controller) in conjunction with the mapping features and aspects discussed herein above for performing on-the-fly head depopulation.

FIG. 65 is a flowchart representing another exemplary method operable within a storage device controller (e.g., disk controller) in conjunction with the mapping features and aspects discussed herein above for performing on-the-fly head depopulation. In particular, FIG. 65 broadly represents a method operable within the storage controller in accordance with features and aspects hereof to provide prioritizing the migration of a plurality of logical blocks from a first surface to a second surface in the event that the second surface does not contain sufficient capacity to store the plurality of logical blocks. Element 6502 represents disk controller 106 determining whether the head is failing. A variety of causes may trigger errors of the read head, and disk controller 106 may determine whether the head is failing. If the head is not failing, then normal operations of the disk drive continue in element 6512.

If disk controller 106 determines that the head is failing, then disk controller 106 further determines whether sufficient capacity exists on a second surface to hold a plurality of logical blocks stored on the first surface in element 6506. If sufficient capacity does not exist to hold the plurality of logical blocks stored on the first surface, then disk controller 106 may migrate a portion of the plurality of logical blocks from the first surface to the second surface in element 6514. Element 6516 represents disk controller 106 adjusting the mapping table to map the migrated logical blocks to LBAs of the second surface. Normal operations of the disk drive then continue in element 6512.

If sufficient capacity exists on the second surface to hold the plurality of logical blocks stored on the first surface, then disk controller 106 may migrate the plurality of logical blocks from the first surface to the second surface in element 6508. Element 6510 represents disk controller 106 adjusting the mapping table to map the migrated logical blocks to a plurality of physical block addresses of the second surface. Normal operations of the disk drive are then continued in element 6512.

Figure 66:
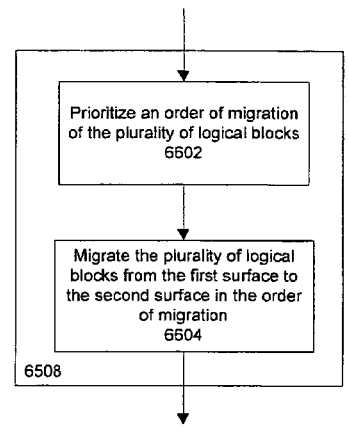
FIG. 66 is a flowchart providing exemplary additional details of the processing of FIG. 65.

FIG. 66 is a flowchart providing exemplary additional details of the processing of element 6508 of FIG. 65. As noted above, element 6508 is generally operable to migrate the supplied logical block to a second physical block address. Element 6602 disk controller 106 prioritizing an order of migration of the plurality of logical blocks. For instance, the order of migration may be based on a frequency of access of the plurality of logical blocks, where the most frequently accessed logical blocks are migrated first. Alternatively, the order of migration may be based on logical blocks storing selected system files. The selected system files may be for example critical system files. Element 6604 represents disk controller 106 migrating the plurality of logical blocks from the first surface to the second surface in the order of migration. The disk drive may migrate the most valuable data first, so that if the head fails during the migration process, then the most valuable data may be preserved.

Those of ordinary skill in the art will readily recognize that the methods of FIGS. 61 through 66 are intended merely as exemplary of possible embodiments of methods in accordance with features and aspects hereof to provide on-the-fly head depopulation in a dynamically mapped storage device. Numerous equivalent methods and techniques will be readily apparent to those of ordinary skill in the art to implement such features as a matter of design choice.

Thermal Lead-in Writes

Typically in disk drives, the write head needs to warm up and become stable in flying height prior to writing valid data. If the write head is not stable in flying height prior to writing valid data, then thermal flux may cause data to be unreliable. The write head may warm-up as data is written, but the data initially written to the recordable media as the write head warms-up may not be reliable. Pre-heaters are now used to assure stability of the head prior to a write operation to avoid thermal instability of initially written data (e.g., the first block written). However, these pre-heaters add cost and complexity to the disk drive.

In accordance with features and aspects hereof, all user data written to the dynamically mapped storage device is dynamically mapped from the user supplied logical address space (logical block addresses or LBAs) to the physical disk block address space (disk block addresses or DBAs—blocks of variable, independent size relative to the LBA size). Thus, features and aspects hereof permit the writing of any size thermal lead-in sequence of data to allow the write head to stabilize prior to writing user supplied data. Thus, the write head may begin writing the thermal lead-in sequence of data while warming up. As the write head proceeds to write the thermal lead-in sequence of data, the temperature, flying height, etc. of the write head may stabilize. Once the desired stability is reached, the write head may begin writing user supplied data. The dynamically mapped structure allows the write head to begin writing the thermal lead-in sequence at an available physical block on the recordable media without overwriting valuable user supplied data. The thermal lead-in sequence may typically comprise data that may be of no use to the storage device or attached host beyond allowing the write head to warm-up. Thus, the thermal lead-in sequence data may be removed from the recordable media during defragmentation.

Figure 67:
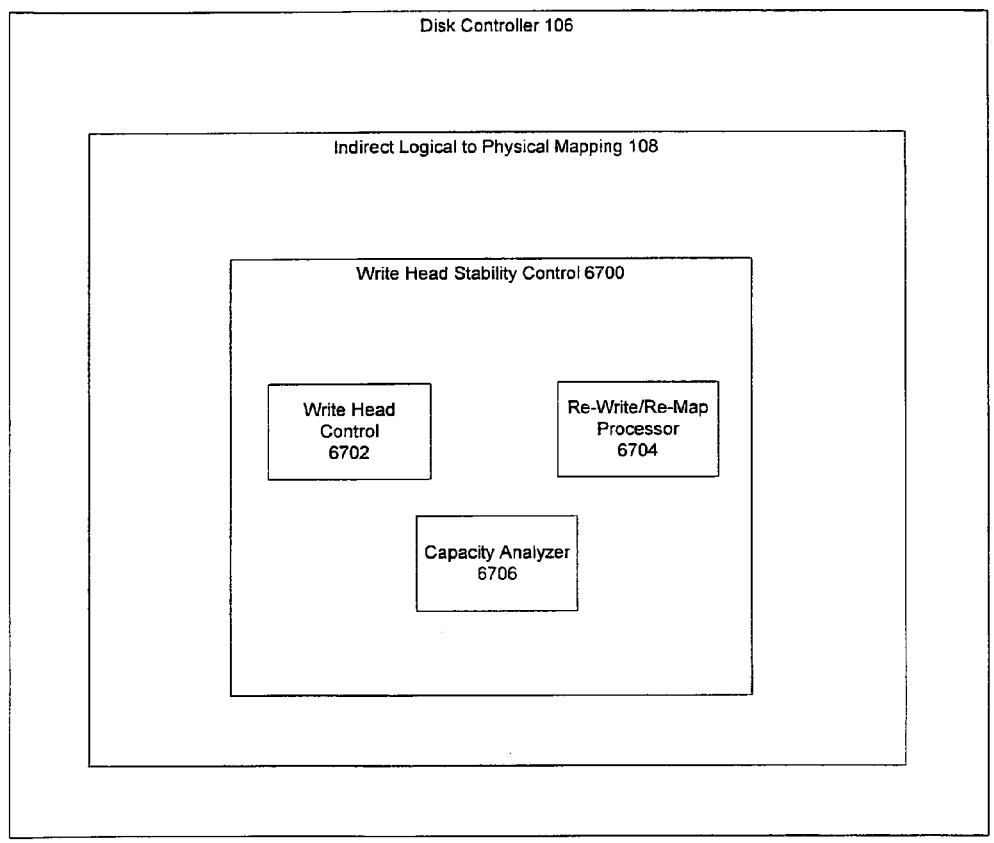
FIG. 67 is a block diagram providing additional exemplary details of a disk controller as in FIG. 1 enhanced to provide writing of thermal lead-in sequences to allow a write head to stabilize prior to writing user supplied data to a recordable media.

FIG. 67 is a block diagram providing additional exemplary details of a disk controller as in FIG. 1 enhanced to provide writing thermal lead-in sequences to allow a write head to stabilize prior to writing user supplied data to a recordable media. As noted above, disk controller 106 may include indirect logical to physical mapping element 108 generally responsible for dynamic mapping features of the storage device. An aspect of the logical to physical mapping element 108 may include write head stability control element 6700 operable to write thermal lead-in sequences to allow a write head to stabilize (e.g., reach thermal stability and an associated stabilized flying height) prior to writing user supplied data to a recordable media. Write head stability control element 6700 may include various elements to aid the processing of write requests by write head control element 6702. Write head control element 6702 may process write requests to store data on the recordable media. Write head control element 6702 may further determine whether the write head is stable prior to beginning the writing process. If the write head is not stable (e.g., not at thermal stability), then write head control element 6702 may operate to write a thermal lead-in sequence to allow the write head to stabilize before writing the user supplied data (e.g., supplied logical block) to the recordable media.

The thermal lead-in sequences may consume valuable space on the recordable media. As the capacity of the recordable media decreases, it may become necessary to eliminate the thermal lead-in sequences. Write head stability control element 6700 may include capacity analyzer element 6706 for analyzing the current capacity ratio as defined above. As the current capacity ratio increases, less space may be available for storing or preserving the thermal lead-in sequences. Thus, capacity analyzer element 6706 may continually monitor the current capacity ratio to determine when the use of thermal lead-in sequences prior to writing user supplied data may be eliminated, as well as defragmenting the disk drive to eliminate previously written thermal lead-in sequences. Re-write/re-map processor element 6704 may re-map and re-write (e.g., migrate) user supplied data to defragment the disk drive and eliminate the thermal lead-in sequences to provide free space on the recordable media for subsequent write requests. The indirect mapping and variable size data block features and aspects hereof enable such defragmentation and compaction while the indirect mapping allows relocation of physical storage space to be performed transparently with respect to host systems and devices.

Those of ordinary skill in the art will readily recognize that the various functional elements 6700 through 6706 shown as operable within the indirect logical to physical mapping element 108 of disk controller 106 may be combined into fewer discrete elements or may be broken up into a larger number of discrete functional elements as a matter of design choice. Thus, the particular functional decomposition suggested by FIG. 67 is intended merely as exemplary of one possible functional decomposition of elements within disk controller 106.

FIG. 68 is a flowchart representing an exemplary method operable within a storage device controller (e.g., disk controller 106 of FIG. 1) in conjunction with the mapping features and aspects discussed herein above for writing thermal lead-in sequences for allowing the write head to stabilize. In particular, FIG. 68 broadly represents a method operable within disk controller 106 in accordance with features and aspects hereof to provide writing thermal lead-in sequences to allow a write head to stabilize prior to writing user supplied data to recordable media. Element 6802 represents the disk controller receiving a request to write a supplied logical block. For instance, the supplied logical block may be provided by an attached host.

Element 6804 represents disk controller 106 positioning the write head on the recordable media in response to receiving the write request. If the write head is not stable, then a thermal lead-in sequence may be written to allow the write head to reach a desired stability point.

Element 6806 represents the write head writing a thermal lead-in sequence to the recordable media at a first physical block address to allow the write head to stabilize. The stabilization of the write head may include reaching a thermal stability or stabilized flying height. The length of the thermal lead-in sequence may be selected to adequately allow the write head to warm up and stabilize. For instance, the length of the thermal lead-in sequence may vary and be selected based on amount of idle time of the write head. Alternatively, the length of the thermal lead-in sequence may be fixed as the maximum time needed to ensure that the write head has warmed up. Those of ordinary skill in the art will recognize a variety of factors that may be used to select the length of the thermal lead-in sequence to allow the write head to adequately stabilize prior to writing user supplied data.

Element 6808 represents the write head writing the supplied logical block to the recordable media following the thermal lead-in sequence.

Following the completion of element 6806, a mapping table of the dynamically mapped storage device may be adjusted to map the supplied logical block at the first physical block address. Those of ordinary skill in the art will recognize that a dynamically mapped disk drive may write more than one supplied logical block during the writing process. As discussed above, a plurality of write requests may be cached and written together in a write band (e.g., a buffer as discussed above). Thus for example, a thermal lead-in sequence may be written in conjunction with a first physical block address of the recordable media. A plurality of supplied logical blocks may then be written to the recordable media at a plurality of physical block addresses of the recordable media starting at a second physical block address of the recordable media following the first physical block address. A mapping table may then be adjusted to map the plurality of supplied logical blocks at the plurality of physical block addresses.

FIG. 72 represents an exemplary data block or sector recorded using a thermal lead-in sequence write. Thermal lead-in sequence 7200 is written to allow the write head to warm-up. After the write head is stabilized, a preamble sequence 7202 may be written. The preamble sequence represents the beginning of valid data in the data block. As discussed above in reference to FIGS. 15 and 16, a data block or sector may comprise a preamble sequence 7200 that provides a header portion for information regarding the particular disk block, such as a block number and other metadata information. The sync field 7204 provides a standard bit pattern to allow the read/write channel phase lock loop controls to synchronize on the upcoming supplied logical block 7206. Following the supplied logical block 7206 is an error correction code field 7208 to provide error correcting bits for detecting and correcting various bit errors encountered in reading the supplied logical block 7206 from the recordable media. Those of ordinary skill in art will readily recognize that the scale of elements in FIG. 72 is not intended to precisely reflect the relative sizes of the components of a data block written to the recordable media according to features and aspects hereof. Rather, FIG. 72 is intended merely to suggest the typical components of an exemplary data block written to the recordable using a thermal lead-in write sequence to allow the write head to stabilize according to features and aspects hereof.

As discussed above, thermal lead-in sequences may consume valuable space on the recordable media, and may further cause fragmentation of the recordable media. As discussed above, the dynamically mapped storage device may provide sequential writing of concentric cylinders as write requests are received from an attached host, and may then re-map and defragment the recordable media at a later time. Thus, supplied logical blocks may be re-mapped to eliminate the thermal lead-in sequences to provide space for subsequent write requests. FIGS. 69-71 are flowcharts representing exemplary methods operable within a storage device controller (e.g., disk controller) in conjunction with the mapping features and aspects discussed herein above to provide re-mapping of physical blocks to eliminate thermal lead-in sequences.

Element 6902 represents disk controller 106 determining a current capacity ratio value indicating a current physical capacity utilization of the dynamically mapped storage device. Element 6906 represents disk controller 106 determining whether the current capacity ratio value has reached a predefined limit. The predefined limit indicates to the dynamically mapped storage device that non-user supplied data, such as thermal lead-in sequences should be eliminated to free space on the recordable media for additional user supplied data. As discussed above, the predefined limit of the capacity ratio value for example may be 0.5, indicating that the disk drive is near physical capacity, while only 50% of the stored data represents user supplied data. Disk controller 106 may continually monitor the current capacity ratio to determine when the previously written thermal lead-in sequences may be eliminated. If the current capacity ratio value has not reached the predefined limit, then normal operations are continued in element 6910. Normal operations may include subsequent read and/or write requests from an attached host, etc.

If the current capacity ratio value has reached the predefined limit, then supplied logical blocks are migrated to a second physical block address of the recordable media in element 6906 to eliminate thermal lead-in sequences and de-fragment the recordable media. Element 6908 represents disk controller 106 adjusting the mapping table to map the supplied logical block at the second physical block address. Responsive to completing element 6908, the disk controller continues normal operations in element 6910.

FIG. 70 is a flowchart providing exemplary additional details of the processing of element 6906 of FIG. 69. As noted above, element 6906 is generally operable to migrate the supplied logical block to a second physical block address. Element 7002 represents reading the supplied logical block from the first physical block address. Element 7004 represents adding the supplied logical block to a buffer. As discussed previously with respect to FIGS. 55-58, the dynamically mapped storage device may store pending write requests in a buffer to be completed at a later time. Additional details regarding the operation of the buffer are provided above in the discussion of FIGS. 55-58. The buffer may store a plurality of write requests that may be written to a sequential sequence of physical blocks in the order in which the data is stored in the buffer. Element 7006 represents writing the buffer to the recordable media in the order in which the data is stored in the buffer. Thus, the supplied logical block is re-written at the second physical block addresses responsive to reaching a position in the buffer of the supplied logical block.

FIG. 71 is a flowchart providing exemplary additional details of the processing of element 6906 of FIG. 69. As noted above, element 6906 is generally operable to migrate the supplied logical block to a second physical block address. Element 7102 represents writing the supplied logical block at a second physical address of the recordable media. Element 7104 represents adjusting a mapping table to map the supplied logical block at the second physical block address. Thus, the mapping table will reflect that the supplied logical block is presently located at the second physical block address.

Those of ordinary skill in the art will readily recognize that the methods of FIGS. 68 through 71 are intended merely as exemplary of possible embodiments of methods in accordance with features and aspects hereof to provide writing of thermal lead-in sequences in a dynamically mapped storage device to allow the write head to stabilize prior to writing valid data. Numerous equivalent methods and techniques will be readily apparent to those of ordinary skill in the art to implement such features as a matter of design choice.

Handling of Grown Defects

A grown defect occurs on a disk drive when a portion of the recordable media does not function properly. Grown defects occur during the use of the disk drive, as opposed to other types of disk defects which are the result of defects detected in the manufacturing process at time of manufacture. Any number of factors may cause a grown defect, such as scratches on the recordable media, problems with magnetizing the recordable media, etc.

In accordance with features and aspects hereof, all user data written to the dynamically mapped storage device is dynamically mapped from the user supplied logical address space (logical block addresses or LBAs) to the physical disk block address space (disk block addresses or DBAs—blocks of variable, independent size relative to the LBA size). Thus, features and aspects hereof permit handling of grown defects in a dynamically mapped storage device without performance losses of one or more revolutions of the dynamically mapped storage device. If the disk drive detects a read error during the reading of a logical block, then the disk drive does not stop the reading process to handle the read error as presently practiced. Rather, in accordance with features and aspects hereof, the logical block may be moved to any free location on the recordable media and remapped accordingly to reflect the new position. The re-vectored logical block may be buffered for later writing to the recordable media.

Figure 73:
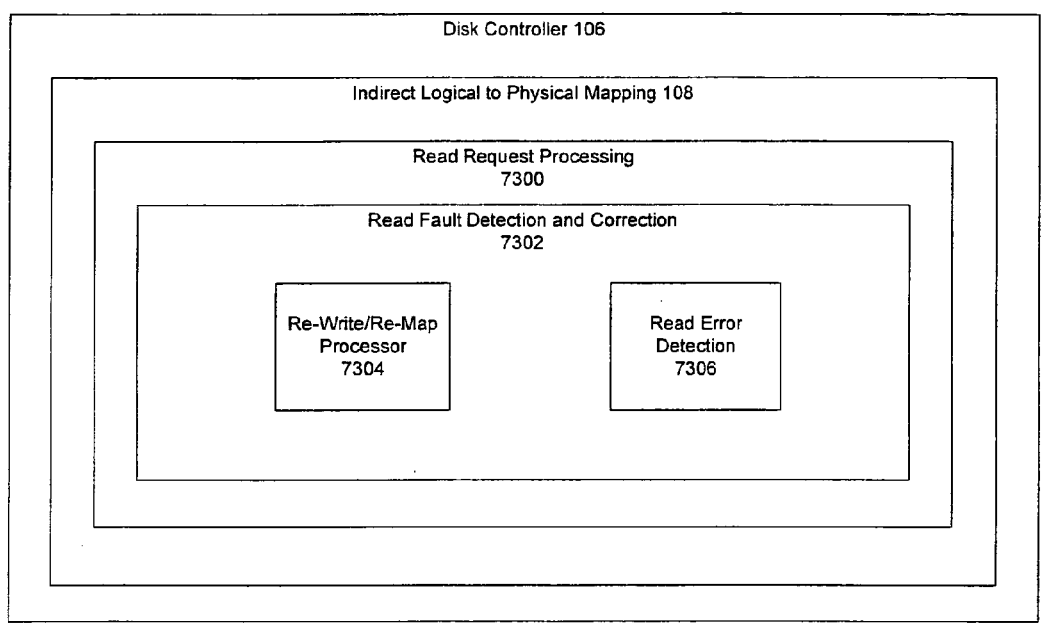
FIG. 73 is a block diagram providing additional exemplary details of a disk controller as in FIG. 1 enhanced to handle a grown defect encountered during a read operation.

FIG. 73 is a block diagram providing additional exemplary details of a disk controller as in FIG. 1 enhanced to handle a grown defect encountered during a read operation. The read operation may occur responsive to a request for access to a logical block by an attached host, may occur in response to a verification reading of a written block, or may occur during other processes executed by the disk controller. As noted above, disk controller 106 may include indirect logical to physical mapping element 108 generally responsible for dynamic mapping features of the storage device. An aspect of the logical to physical mapping element 108 as noted above may include read fault detection and correction element 7302 operable to handle read errors and grown defects on the recordable media. Read fault detection and correction element 7302 may include various elements to aid in the correction of read errors detected by read error detection 7306. Read error detection element 7306 may monitor the read operations of a read/write head to determine whether a read error has occurred. If a read error is detected, re-write/re-map processor element 7304 may re-map and re-write the logical block at a different location on the recordable media.

Those of ordinary skill in the art will readily recognize that the various functional elements 7300 through 7306 shown as operable within the indirect logical to physical mapping element 108 of disk controller 106 may be combined into fewer discrete elements or may be broken up into a larger number of discrete functional elements as a matter of design choice. Thus, the particular functional decomposition suggested by FIG. 73 is intended merely as exemplary of one possible functional decomposition of elements within disk controller 106.

Figure 74:
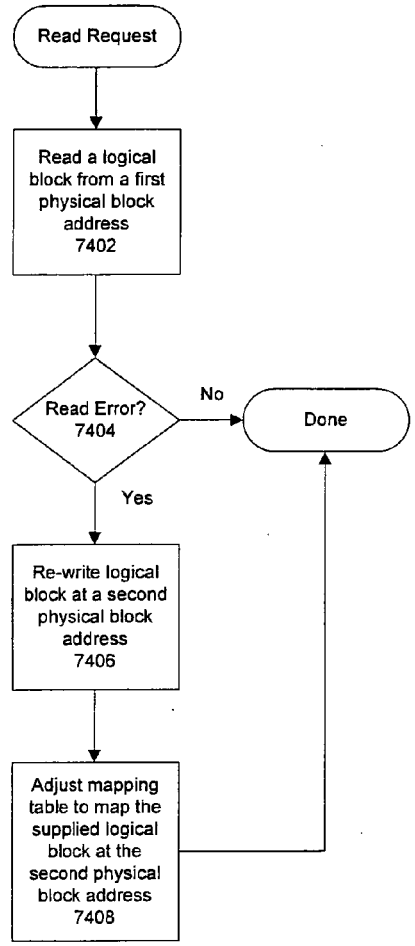
FIG. 74 is a flowchart representing an exemplary method operable within a storage device controller (e.g., disk controller) in conjunction with the mapping features and aspects discussed herein above for handling grown defects encountered in a dynamically mapped storage device.

FIG. 74 is a flowchart representing an exemplary method operable within a storage device controller (e.g., disk controller) in conjunction with the mapping features and aspects discussed herein above for handling grown defects encountered in the dynamically mapped storage device. In particular, FIG. 74 broadly represents a method operable within the disk controller 106 in accordance with features and aspects hereof to handle the correction of a grown defect encountered during a read error. Element 7402 represents the read head reading a logical block from a first physical block address of the recordable media.

Element 7404 represents disk controller 106 determining whether a read error occurred during the reading process as the result of a grown defect. If no read error occurred, then the read operation is complete.

If disk controller 106 determines that a read error occurred as a result of a grown defect, then the logical block is re-written at a second physical block address of the recordable media by disk controller 106 responsive to detecting the read error in element 7406. The second physical block address may comprise a free physical block anywhere on the recordable media.

Element 7408 represents disk controller 106 adjusting a mapping table to map the supplied logical block at the second physical block address. The logical block is mapped at the second physical block address like any other logical block on the recordable media. Thereafter, if the attached host requests the logical block, the disk drive may access the logical block from the second physical block address. The disk drive may further record that the first physical block address contains a grown defect, and may not be used in the future.

Figure 75:
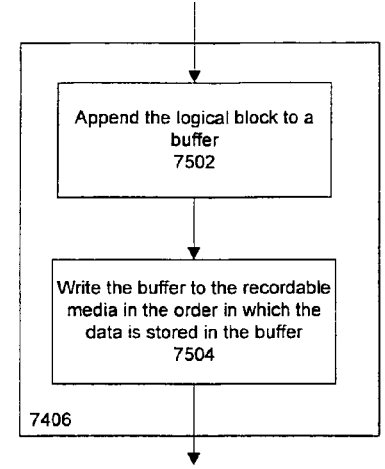
FIG. 75 is a flowchart providing exemplary additional details of the processing of FIG. 74.

FIG. 75 is a flowchart providing exemplary additional details of the processing of element 7406 of FIG. 74. As noted above, element 7406 is generally operable to re-write the logical block to a second physical block address of the recordable media. Element 7502 represents appending the logical block to a buffer to be written to the recordable media. As discussed previously with respect to FIGS. 55-58, the dynamically mapped storage device may store pending write requests in a buffer to be completed at a later time. Additional details regarding the operation of the buffer are provided above in the discussion of FIGS. 55-58. The buffer may store a plurality of write requests that may be written to a sequential sequence of physical blocks in the order in which the data is stored in the buffer. Element 7504 represents writing the buffer to the recordable media in the order in which the data is stored in the buffer. Thus, the logical block is re-written at the second physical block addresses responsive to reaching a position in the buffer of the supplied logical block.

Figure 76:
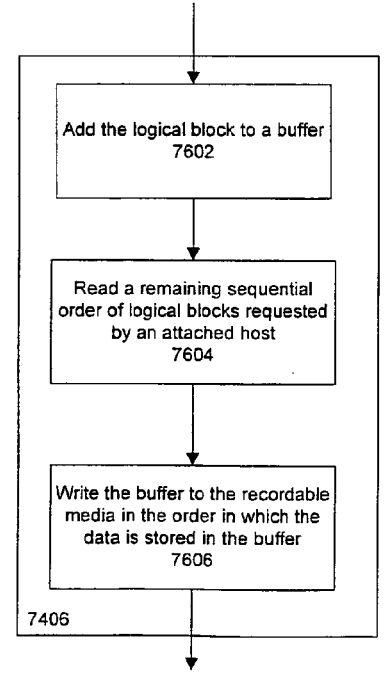
FIG. 76 is a flowchart providing exemplary additional details of another embodiment of the processing of FIG. 74.

FIG. 76 is a flowchart providing exemplary additional details of the processing of element 7406 of FIG. 74. As noted above, element 7406 is generally operable to re-write the logical block to a second physical block address of the recordable media. Element 7602 represents adding the logical block to a buffer to be written to the recordable media. Element 7604 represents the disk controller 106 reading a remaining sequential order of logical blocks requested by an attached host. Element 7406 represents disk controller 106 writing the buffer to the recordable media in the order in which the data is stored in the buffer. The logical block is re-written at the second physical block address responsive to reaching a position in the buffer of the supplied logical block. Thus, the re-write of the logical block at the second physical block address may occur subsequent to the completion of a read process currently executed by disk controller 106.

Figure 77:
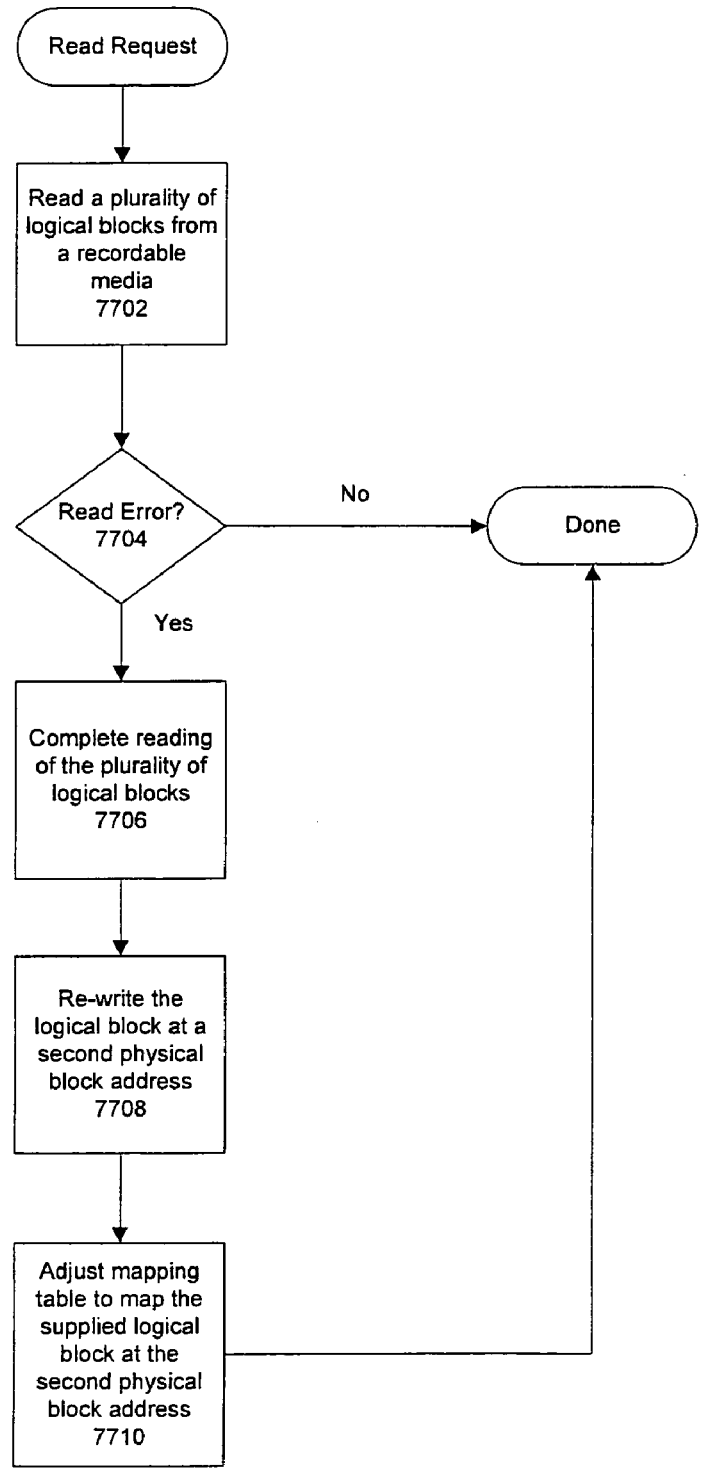
FIG. 77 is a flowchart representing an exemplary method operable within a storage device controller (e.g., disk controller) in conjunction with the mapping features and aspects discussed herein above for handling grown defects encountered in the dynamically mapped storage device.

FIG. 77 is a flowchart representing an exemplary method operable within a storage device controller (e.g., disk controller) in conjunction with the mapping features and aspects discussed herein above for handling grown defects encountered in the dynamically mapped storage device. In particular, FIG. 77 broadly represents a method operable within disk controller 106 in accordance with features and aspects hereof to handle the correction of a grown defect encountered during a read error. Element 7402 represents the disk controller reading a plurality of logical blocks from the recordable media.

Element 7704 represents disk controller 106 determining whether a read error occurred during the reading of a logical block from a first physical block address of the recordable media as the result of a grown defect. If no read error occurred during the reading process of the plurality of logical blocks, then the read request is complete.

If disk controller 106 determines that a read error occurred as a result of a grown defect, then the logical block may need to be re-vectored at a second physical block address of the recordable media. However, the re-vector of the logical block may be executed after the read request is completed. For instance, the logical block may be added to a buffer as described in FIG. 74 to be re-written to the recordable media responsive to completing the reading process. Element 7706 represents disk controller 106 completing reading of the plurality of logical blocks from the recordable media. Depending on the size of the grown defect, subsequent errors may be detected by element 7704 during the execution of element 7706.

Element 7708 represents disk controller 106 re-writing the logical block at a second physical block address of recordable media responsive to completing the reading of the plurality of logical blocks.

Element 7710 represents disk controller 106 adjusting a mapping table to map the supplied logical block at the second physical block address. If multiple errors are encountered while element 7702 operates to read the plurality of logical blocks, then multiple logical blocks may need to be re-vectored by disk controller 106. In this instance, the logical blocks contained in grown defect error areas may be buffered, and elements 7708 and 7710 may operate to re-vector each logical block once the read request is completed. Disk controller 106 for example may re-write each logical block that needs to be re-vectored in a sequential order on the disk drive in a contiguous sequence of free space.

Those of ordinary skill in the art will readily recognize that the methods of FIGS. 74 through 77 are intended merely as exemplary of possible embodiments of methods in accordance with features and aspects hereof to provide handling of grown defect errors in a dynamically mapped storage device. Numerous equivalent methods and techniques will be readily apparent to those of ordinary skill in the art to implement such features as a matter of design choice.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above described embodiments that fall within the scope of the invention. As a result, the invention is not limited to the specific examples and illustrations discussed above, but only by the following claims and their equivalents.

What is claimed is:

1. A method, comprising:
   performing a flawscan operable to certify locations of a storage device;
   receiving, prior to completion of the flawscan, a write request supplying data to be written to the storage device; and
   writing multiple copies of the supplied data to different locations of the storage device when the flawscan has not certified sufficient locations of the storage device to store the supplied data.

2. The method according to claim 1, wherein the flawscan is performed by the storage device during idle periods of the storage device.

3. The method according to claim 1, wherein performing the flawscan further comprises:
   randomly selecting locations on the storage device for flawscan testing; and
   determining a statistical probability that the storage device will provide specified physical capacity based on flawscan results of the randomly selected locations.

4. The method according to claim 1, wherein performing the flawscan further comprises:
   performing an initial flawscan on a portion of the storage device in association with manufacture of the storage device, and performing a final flawscan on the storage device after the device is installed for initial application use.

5. The method according to claim 4, wherein the final flawscan is performed concurrently with application use of the storage device.

6. The method according to claim 1, further comprising:
   subsequent to writing multiple copies, determining that sufficient capacity has been certified by concurrent performance of the flawscan; and
   migrating one of the multiple copies to locations certified by the flawscan.

7. A method, comprising:
   performing a flawscan operable to certify locations of a storage device as the flawscan proceeds;
   receiving, prior to completion of the flawscan, a write request supplying data to be written to the storage device;
   writing at least one copy of the supplied data to uncertified locations of the storage device when the flawscan has not certified sufficient locations of the storage device to store the supplied data; and
   migrating the supplied data from uncertified locations of the storage device to certified locations of the storage device when sufficient locations for the supplied data are certified.

8. The method according to claim 7, wherein the flawscan is performed during idle periods of the storage device.

9. The method according to claim 7, wherein the flawscan is performed between processing of write requests.

10. The method according to claim 7, further comprising:
    writing the supplied data to certified locations of the storage device when the flawscan has certified sufficient locations of the storage device to store the supplied data.

11. The method according to claim 7, wherein a portion of the locations of the storage device are certified by a manufacturer of the storage device.

12. An apparatus, comprising:
    a controller adapted to process a write requests to store supplied data in locations of a storage device, wherein the controller is adapted to process a write request prior to completion of a flawscan by writing multiple copies of the supplied data to different locations of the storage device when the flawscan has not certified sufficient locations of the storage device to store the supplied data.

13. The apparatus according to claim 12, wherein the controller is adapted to complete certification of the locations of the storage device by performing the flawscan substantially concurrently with processing of the write requests.

14. The apparatus according to claim 12, wherein a portion of locations of the storage device is certified for use in advance of initial application of the storage device.

15. The apparatus according to claim 12, wherein the controller is adapted to perform the flawscan during idle periods of the storage device.

16. The apparatus according to claim 12, wherein the controller is further adapted to determine that sufficient capacity has been certified by concurrent performance of the flawscan and is further adapted to migrate one of the multiple copies of the supplied data to certified locations of the storage device when the flawscan has certified sufficient locations of the storage device to store the supplied data.

* * * * *

UNITED STATES PATENT AND TRADEMARK OFFICE
CERTIFICATE OF CORRECTION

PATENT NO. : 7,653,847 B1  Page 1 of 1
APPLICATION NO. : 11/583767
DATED : January 26, 2010
INVENTOR(S) : Liikanen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 594 days.

Signed and Sealed this

Twenty-eighth Day of December, 2010

David J. Kappos
*Director of the United States Patent and Trademark Office*